(12) United States Patent
Tanaka

(10) Patent No.: US 6,664,032 B2
(45) Date of Patent: Dec. 16, 2003

(54) METHOD OF PRODUCING TWO-DIMENSIONAL PHASE TYPE OPTICAL ELEMENT

(75) Inventor: Ichiro Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/504,592

(22) Filed: Feb. 15, 2000

(65) Prior Publication Data

US 2002/0187431 A1 Dec. 12, 2002

(30) Foreign Application Priority Data

Feb. 16, 1999 (JP) ........................................ 1999-037705
Jan. 21, 2000 (JP) ........................................ 2000-012881

(51) Int. Cl.[7] ................................................ G03C 5/00
(52) U.S. Cl. ........................ 430/394; 430/321; 216/12; 216/51; 216/24
(58) Field of Search ................................ 430/321, 394, 430/320, 5; 216/12, 51, 24; 359/567, 558, 575, 568, 563

(56) References Cited

U.S. PATENT DOCUMENTS

| 3,957,354 | A | * | 5/1976 | Knop | 359/162 R |
|---|---|---|---|---|---|
| 4,068,260 | A | * | 1/1978 | Ohneda et al. | 350/166 |
| 4,082,453 | A | * | 4/1978 | Knop | 430/320 |
| 4,155,627 | A | * | 5/1979 | Gale et al. | 350/162 R |
| 4,761,210 | A | * | 8/1988 | Ehrler et al. | 204/129.65 |
| 4,936,665 | A | | 6/1990 | Whitney | 350/451 |
| 5,978,344 | A | * | 11/1999 | Horinouchi et al. | 369/112 |
| 5,995,582 | A | | 11/1999 | Terashima et al. | 378/34 |
| 6,475,704 | B1 | | 11/2002 | Iwasaki et al. | 430/321 |
| 2002/0042024 | A1 | | 4/2002 | Tanaka et al. | 430/321 |

FOREIGN PATENT DOCUMENTS

| EP | 0424110 | * | 4/1991 | 430/321 |
|---|---|---|---|---|
| JP | 53-090603 | * | 5/1983 | |
| JP | 60-147129 | * | 8/1985 | |
| JP | 60-171729 | * | 9/1985 | |
| JP | 62-045026 | * | 2/1987 | 430/394 |
| JP | 01-107527 | * | 4/1989 | 430/394 |
| JP | 01-165125 | * | 6/1989 | |
| JP | 01-181532 | * | 7/1989 | |
| JP | 08-273998 | * | 10/1996 | |
| JP | 11-160510 | | 6/1999 | |
| JP | 2000-98116 | | 4/2000 | |

OTHER PUBLICATIONS

O Plus E, No. 204, pp. 95–100 (Nov. 1996).

* cited by examiner

*Primary Examiner*—Martin Angebranndt
(74) *Attorney, Agent, or Firm*—Fitzpatrick, Cella, Harper & Scinto

(57) ABSTRACT

Disclosed is a method of producing a two-dimensional phase type optical element, wherein a first mask and a second mask made of different materials and both having a stripe-like shape are superposedly formed on a substrate, along different directions, respectively, and wherein positions of all levels to be defined are determined on the basis of at least one of the first and second masks.

8 Claims, 78 Drawing Sheets

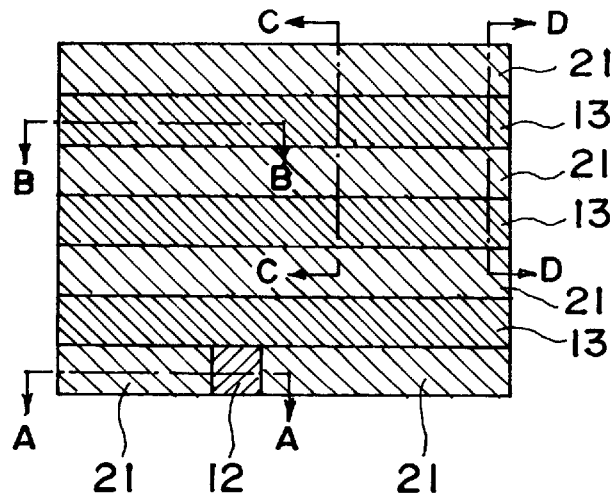
FIG. 29
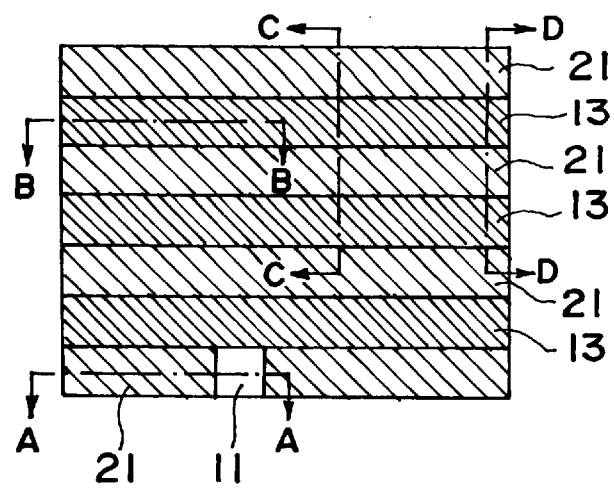
FIG. 30
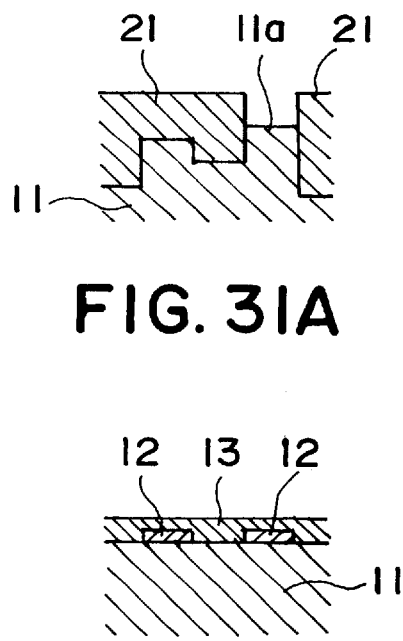
FIG. 31A
FIG. 31B
FIG. 31C
FIG. 31D

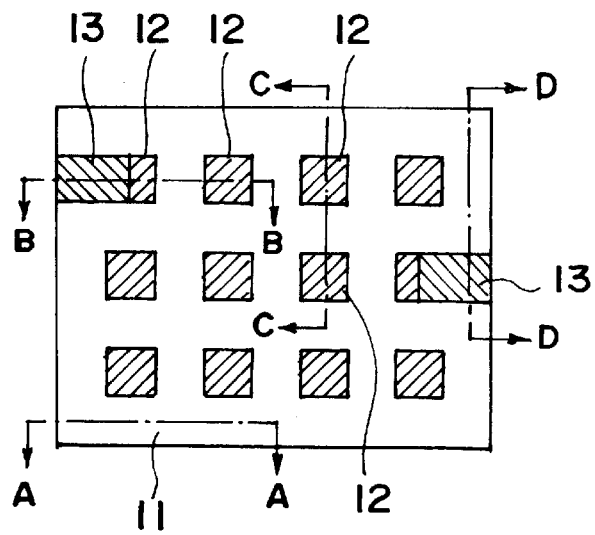
FIG. 48
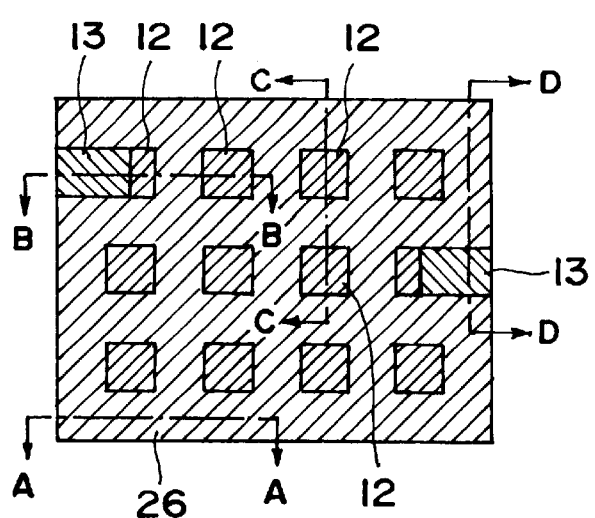
FIG. 49
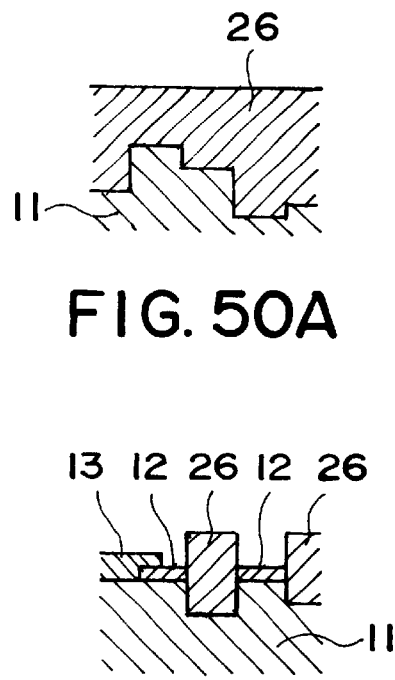
FIG. 50A
FIG. 50B
FIG. 50C
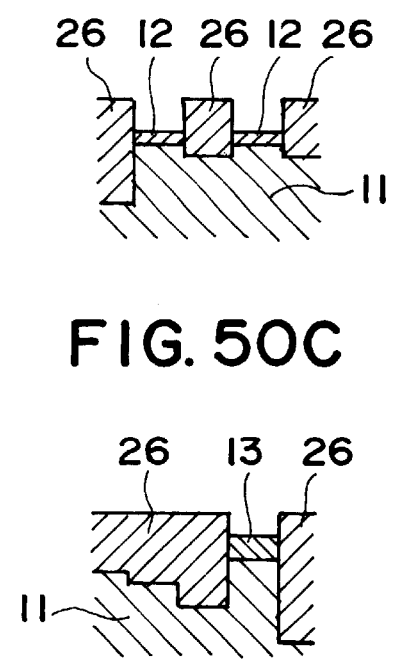
FIG. 50D

METHOD OF PRODUCING TWO-DIMENSIONAL PHASE TYPE OPTICAL ELEMENT

FIELD OF THE INVENTION AND RELATED ART

This invention relates to a method of producing a two-dimensional phase type optical element such as a phase type CGH, a two-dimensional binary structure or a phase modulation plate, for example, which can be used in an optical interconnection or a reduction projection exposure apparatus for manufacture of semiconductor devices, for example.

A method of producing an element having plural phase levels, called "multiple-level phase type optical element", is discussed in "O Plus E", No. 11, pp95, 100(1996), for example. The manufacture of this type of element involves repetition of sequential procedures including a step for processing a substrate by photolithography, a step for applying a resist, for example, to the substrate, a step for positioning the substrate with respect to a pattern of a reticle, a step for exposing the resist with the pattern of the reticle, a step for developing the resist to produce a mask on the basis of the resist (image), and a step for etching the substrate by using the mask, for example. Here, if the number of masks to be formed on a substrate by use of a resist is L, phase levels of a number $2^L$ can be defined on the substrate.

For example, in production of a two-dimensional phase type optical element, as shown in FIG. 152A, first, a resist is applied to the whole surface of a substrate 1a. Then, an exposure process and a development process are performed to the resist, on the basis of a reticle of an exposure apparatus, whereby a resist pattern 2a is produced. Subsequently, while using the resist pattern 2a as a mask, an etching process is performed, by which, as shown in FIG. 153A, a substrate 1b having a surface level 3a and a level 3b with a depth 61 nm, is produced.

Subsequently, similar operations are repeated to form a resist pattern 2b on the substrate 1b, as shown in FIG. 152B, and then, by etching the substrate 1b, a substrate 1c (FIG. 153B) having additional levels 3c and 3c with depths 122 nm and 183 nm is produced. Finally, as shown in FIG. 152C, a resist pattern 2c is produced on the substrate 1c and, by etching the substrate 1c, a substrate 1d (FIG. 153C) having further levels 3e–3h with depths 244 nm, 305 nm, 366 nm and 427 nm, is produced.

In this producing method, however, the resist patterns 2a, 2b and 2c are formed through lithographic processes, sequentially upon the substrates 1a, 1b and 1c. As a result, there is a large possibility of alignment error between the substrate 1a, 1b or 1c and the resist pattern 2a, 2b or 2c. If it occurs, an idealistic substrate 1d (FIG. 154A) having levels 3a, 3d, 3e and 3h is not obtained, but rather a substrate 1e (FIG. 154B) having deformed portions such as at 3i and 3k is produced. Thus, levels with accurate shapes are not obtainable.

Further, in this producing method, the segment of a reticle in the exposure apparatus has a rectangular shape. However, a resist pattern 2a to be produced with right-angle segment corners (FIG. 153A) may not be produced but, rather, a resist pattern 2d (FIG. 155) with rounded segment corners may be produced. Also in this respect, levels with accurate shapes are not obtainable.

SUMMARY OF THE INVENTION

It is accordingly an object of the present invention to provide a method of producing a two-dimensional phase type optical element by which levels can be formed very accurately.

In accordance with an aspect of the present invention, there is provided a method of producing a two-dimensional phase type optical element, characterized in that a first mask and a second mask made of different materials and both having a stripe-like shape are superposedly formed on a substrate, along different directions, respectively, and that positions of all levels to be defined are determined on the basis of at least one of the first and second masks.

In accordance with another aspect of the present invention, there is provided a method of producing a two-dimensional phase type optical element, characterized in that a first mask and a second mask made of different materials and both having a stripe-like shape are superposedly formed on a substrate, along different directions, respectively, and that the substrate is etched by use of at least one of the first and second masks.

In accordance with a further aspect of the present invention, there is provided a method of producing a two-dimensional phase type optical element, characterized in that a first mask and a second mask made of different materials and both having a stripe-like shape are superposedly formed on a substrate, along different directions, respectively, and that positions of all levels to be defined are determined on the basis of (i) at least one of the first and second masks and (ii) a third mask having been formed by transferring one of the first and second masks.

In accordance with a yet further aspect of the present invention, there is provided a method of producing a two-dimensional phase type optical element, characterized in that a first mask and a second mask made of different materials and both having a stripe-like shape are superposedly formed on a substrate, along different directions, respectively, and that the substrate is etched by use of (i) at least one of the first and second masks and (ii) a third mask having been formed by transferring one of the first and second masks.

In these aspects of the present invention, the substrate and the masks are made of different materials.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 29 is a plan view of a substrate in a second process.

FIG. 30 is a plan view of a substrate in a second process.

FIGS. 31A–31D are sectional views, respectively, of a substrate in a second process.

FIG. 48 is a plan view of a substrate in a third process.

FIG. 49 is a plan view of a substrate in a third process.

FIGS. 50A–50D are sectional views, respectively, of a substrate in a third process.

FIGS. 120A–120D are sectional views, respectively, of a substrate in a third process.

FIGS. 121A–121D are sectional views, respectively, of a substrate in a third process.

FIG. 122 is a plan view of a substrate in a third process.

FIGS. 123A–123D are sectional views, respectively, of a substrate in a third process.

FIGS. 124A–124D are sectional views, respectively, of a substrate in a third process.

FIG. 125 is a plan view of a substrate in a third process.

FIGS. 126A–126D are sectional views, respectively, of a substrate in a third process.

FIGS. 127A–127D are sectional views, respectively, of a substrate in a third process.

FIG. 128 is a plan view of a substrate in a fourth process.

FIGS. 129A–129D are sectional views, respectively, of a substrate in a fourth process.

FIG. 130 is a plan view of a substrate in a fourth process.

FIGS. 131A–131D are sectional views, respectively, of a substrate in a fourth process.

Figure 132:
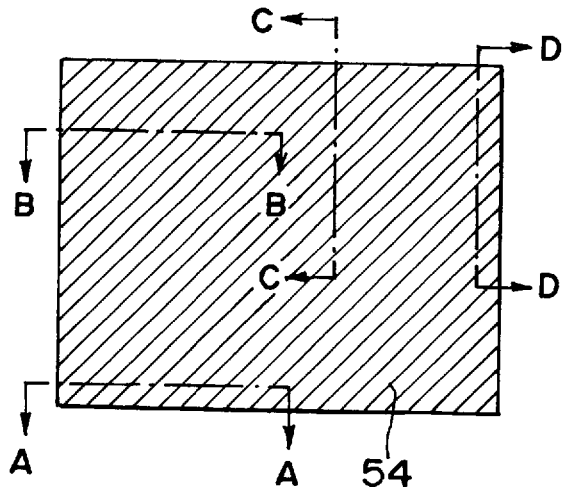
Figure 131C:
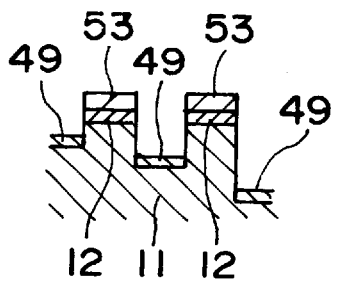
Figure 131D:
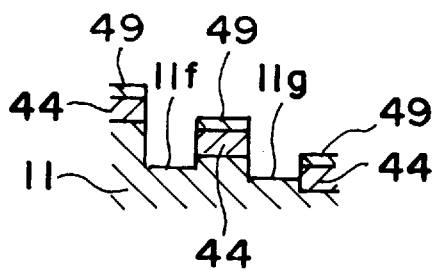
Figure 133A:
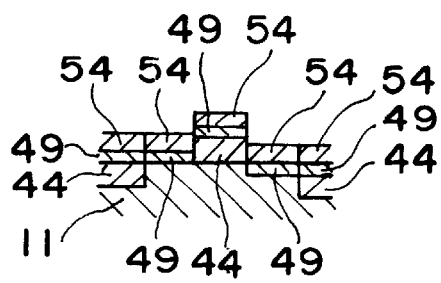
Figure 133B:
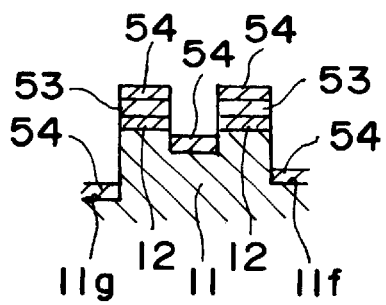
Figure 133C:
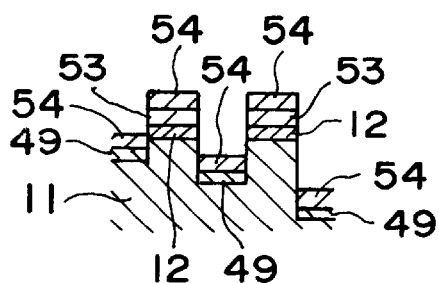
Figure 133D:
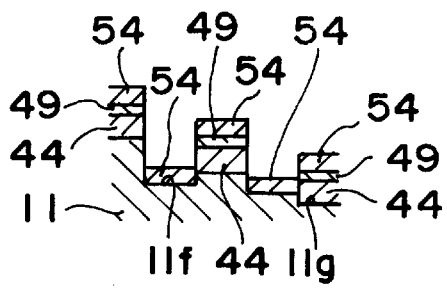

FIG. 132 is a plan view of a substrate in a fourth process.

FIGS. 133A–133D are sectional views, respectively, of a substrate in a fourth process.

Figure 134:
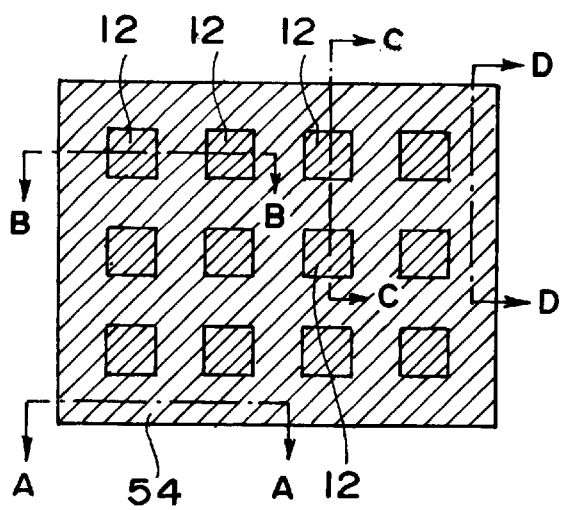
Figure 135A:
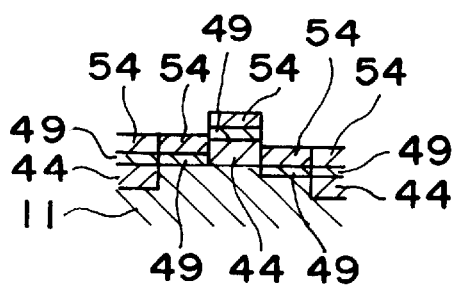
Figure 135B:
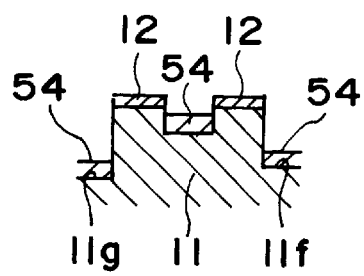
Figure 135C:
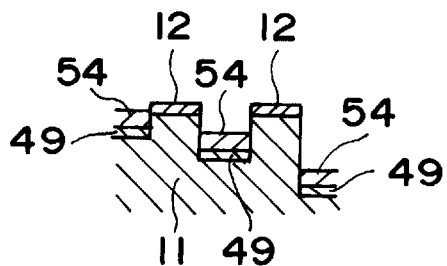
Figure 135D:
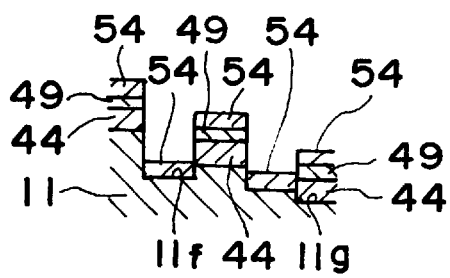

FIG. 134 is a plan view of a substrate in a fourth process.

FIGS. 135A–135D are sectional views, respectively, of a substrate in a fourth process.

Figure 136:
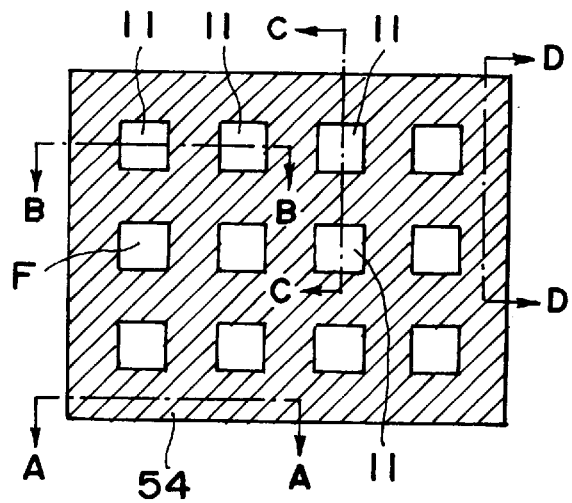
Figure 137A:
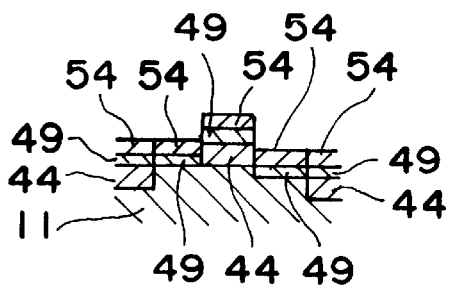
Figure 137B:
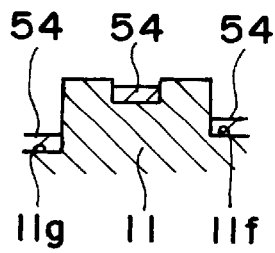
Figure 137C:
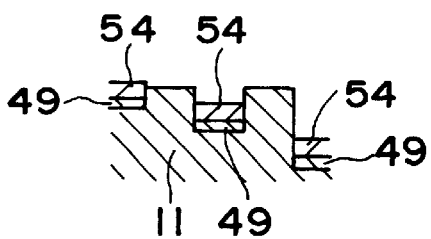

FIG. 136 is a plan view of a substrate in a fourth process.

FIGS. 137A–137D are sectional views, respectively, of a substrate in a fourth process.

Figure 138:
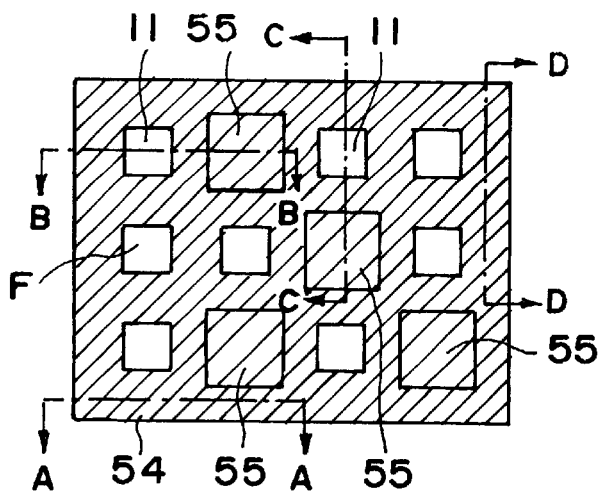
Figure 137D:
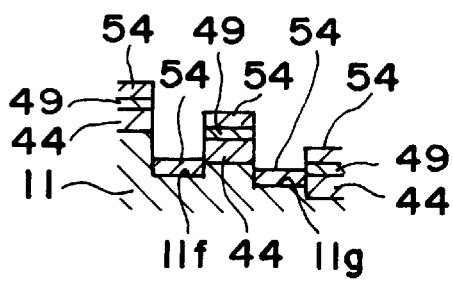
Figure 139A:
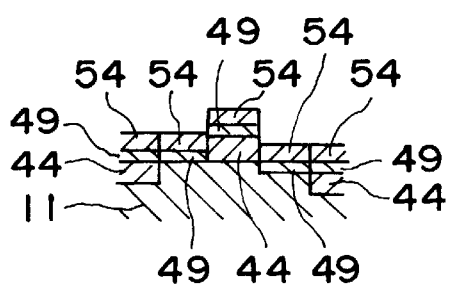
Figure 140A:
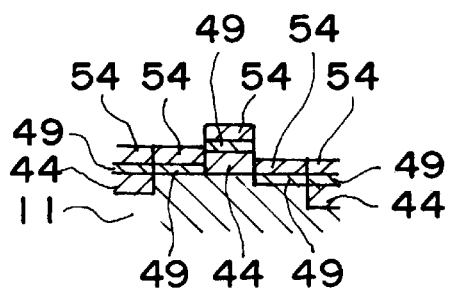
Figure 139B:
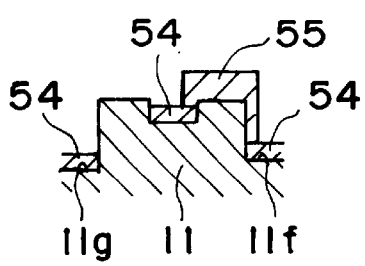
Figure 140B:
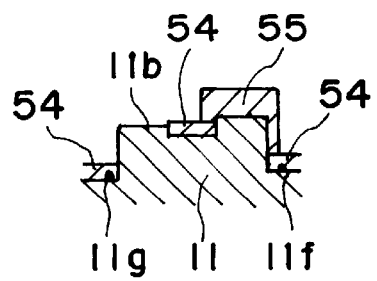
Figure 139C:
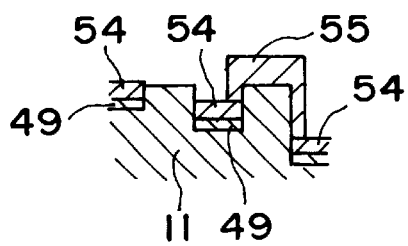
Figure 140C:
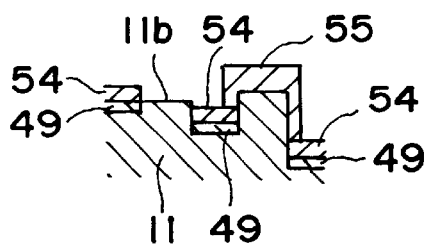
Figure 139D:
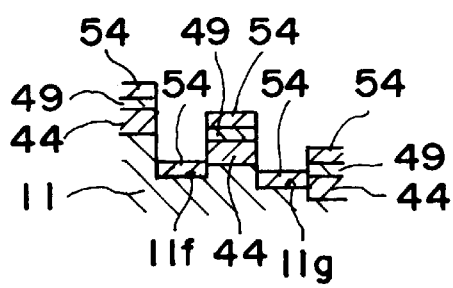
Figure 140D:
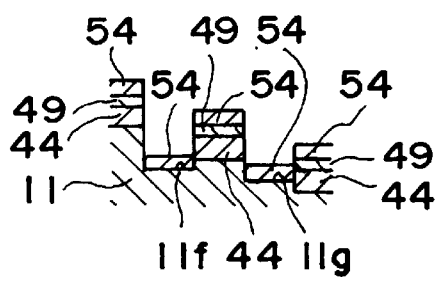
Figure 142A:
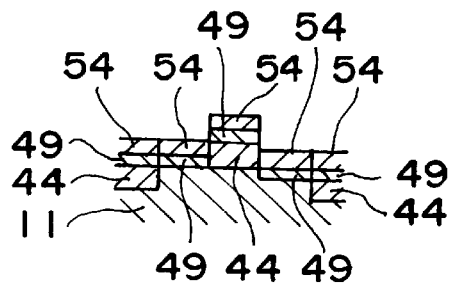

FIG. 138 is a plan view of a substrate in a fourth process.

FIGS. 139A–139D are sectional views, respectively, of a substrate in a fourth process.

FIGS. 140A–140D are sectional views, respectively, of a substrate in a fourth process.

Figure 141:
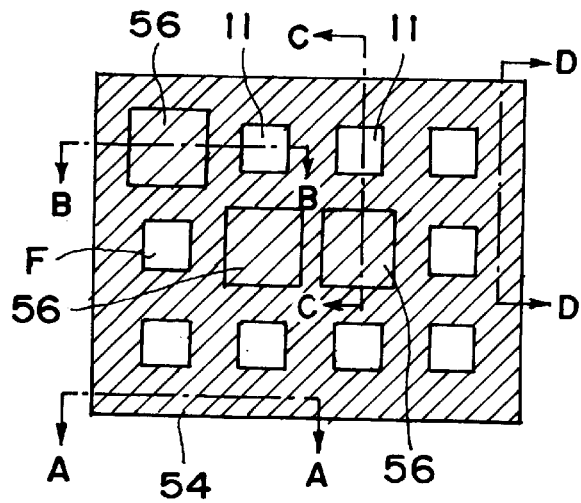
Figure 142B:
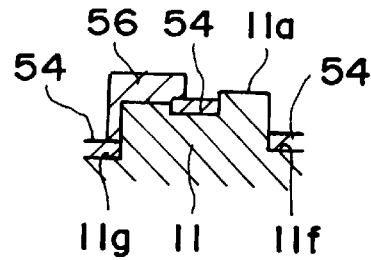
Figure 142C:
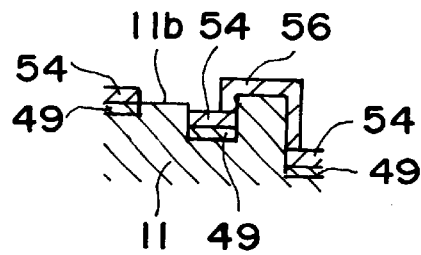
Figure 142D:
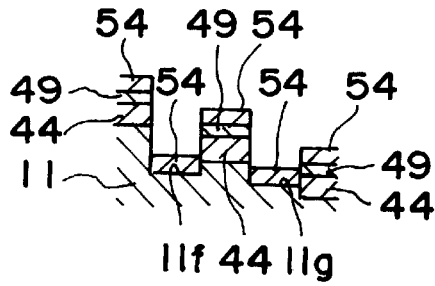
Figure 143A:
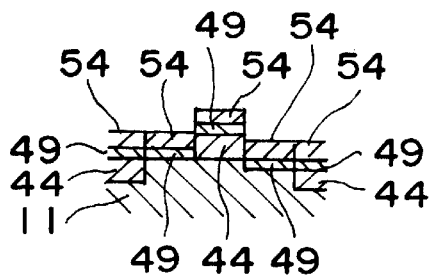
Figure 143B:
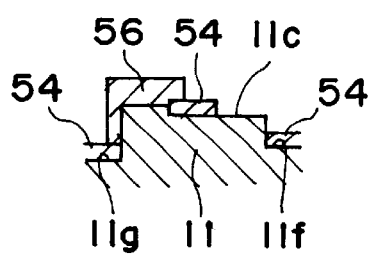
Figure 143C:
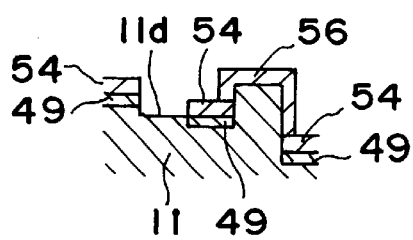
Figure 143D:
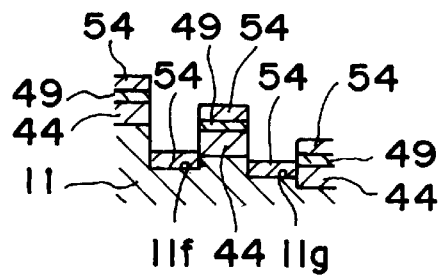

FIG. 141 is a plan view of a substrate in a fourth process.

FIGS. 142A–142D are sectional views, respectively, of a substrate in a fourth process.

FIGS. 143A–143D are sectional views, respectively, of a substrate in a fourth process.

Figure 144:
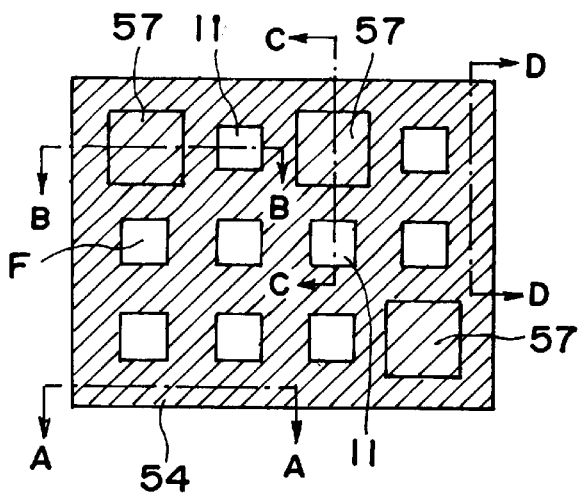
Figure 145A:
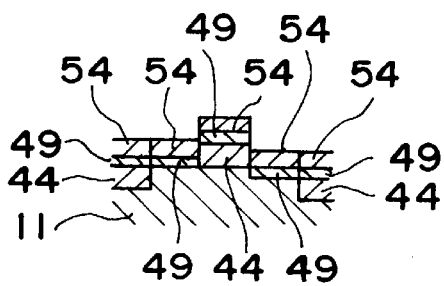
Figure 146A:
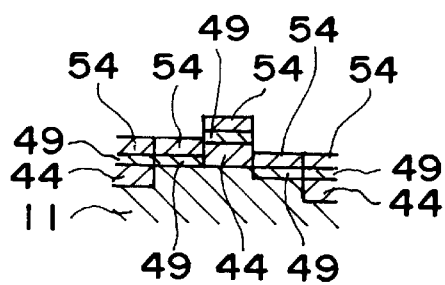
Figure 145B:
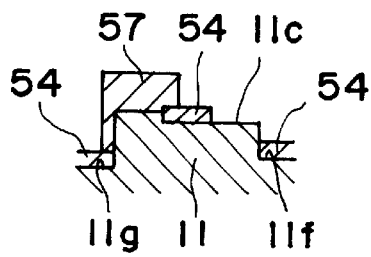
Figure 146B:
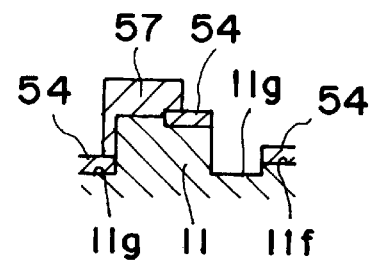
Figure 145C:
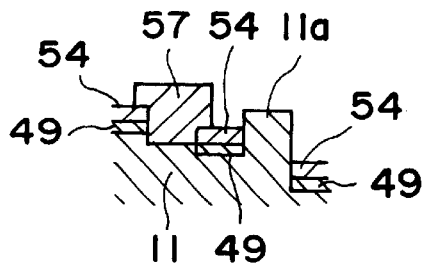
Figure 146C:
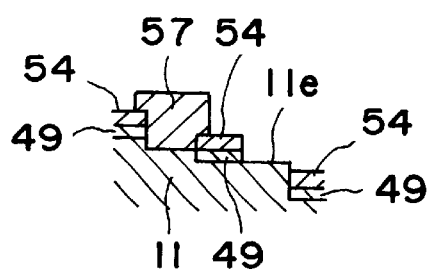
Figure 145D:
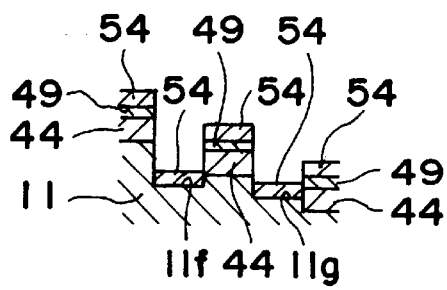
Figure 146D:
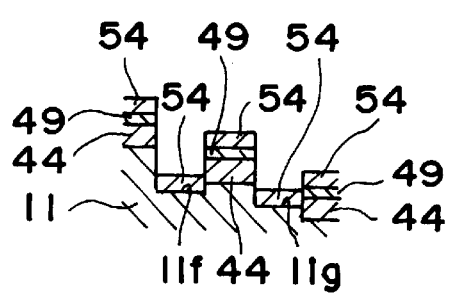
Figure 149A:
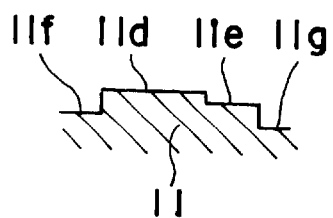

FIG. 144 is a plan view of a substrate in a fourth process.

FIGS. 145A–145D are sectional views, respectively, of a substrate in a fourth process.

FIGS. 146A–146D are sectional views, respectively, of a substrate in a fourth process.

Figure 147:
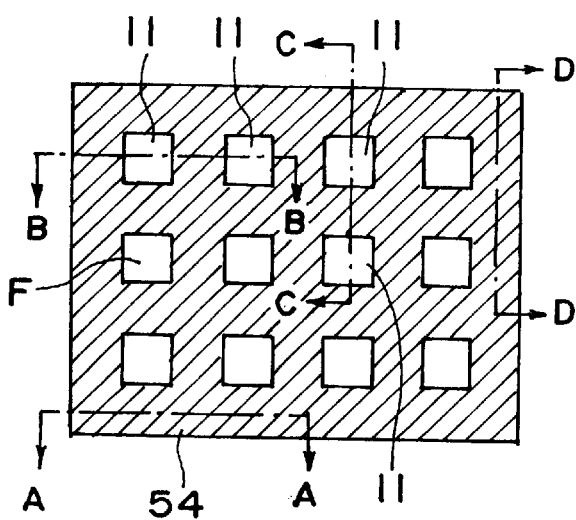
Figure 149B:
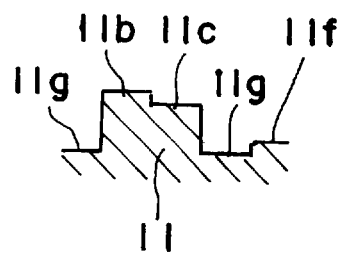
Figure 149C:
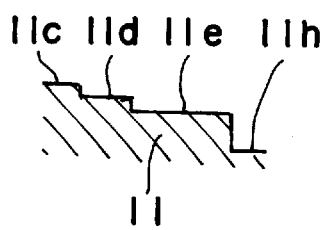

FIG. 147 is a plan view of a substrate in a fourth process.

Figure 148:
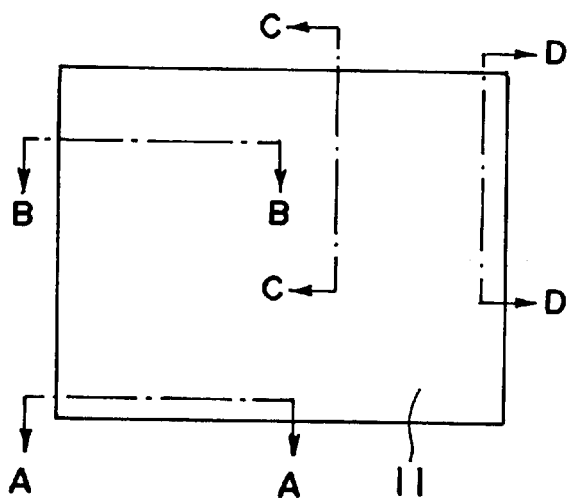
Figure 149D:
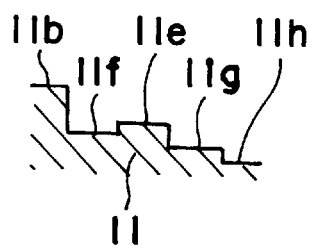

FIG. 148 is a plan view of a substrate in a fourth process.

FIGS. 149A–149D are sectional views, respectively, of a substrate in a fourth process.

FIGS. 150A–150D are sectional views, respectively, for explaining a molding method for a diffractive optical element.

Figure 151:
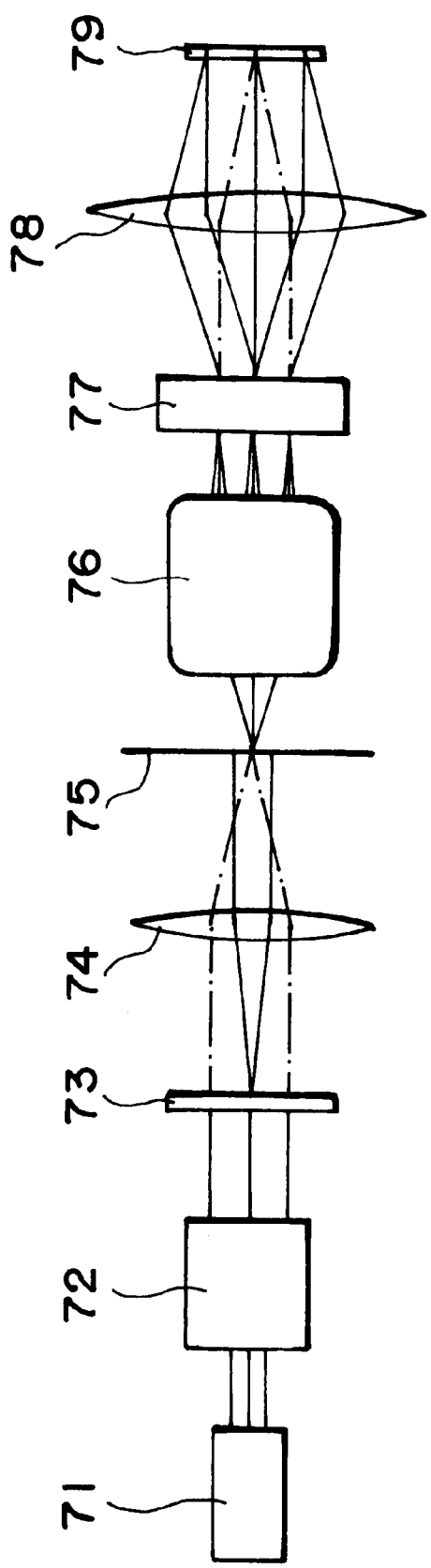

FIG. 151 is a schematic view of an illumination system having a phase type CGH.

Figure 152A:
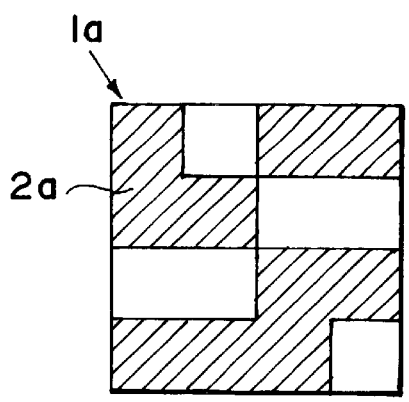
Figure 152B:
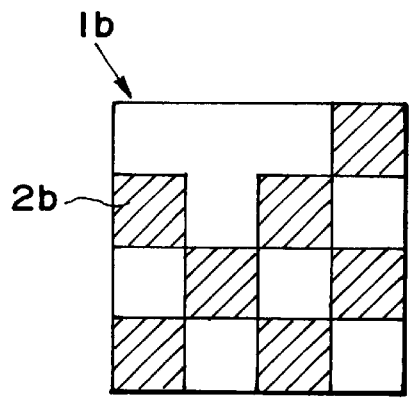
Figure 152C:
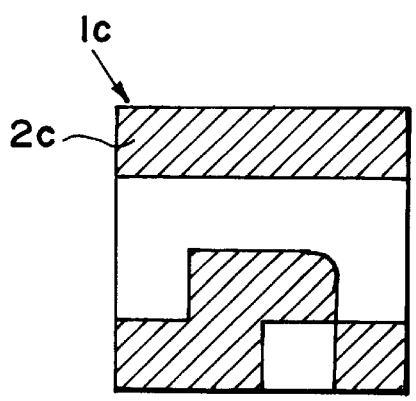

FIGS. 152A–152C are plan views, respectively, of a resist pattern of a conventional structure.

Figure 153A:
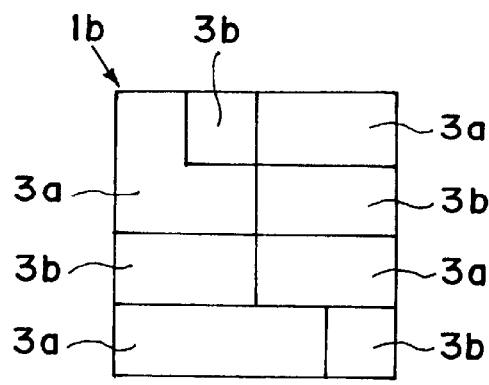
Figure 153B:
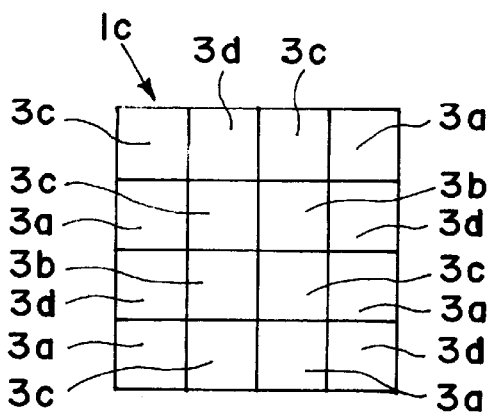
Figure 153C:
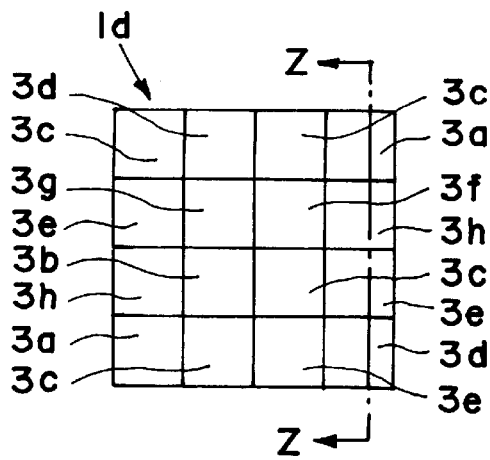

FIGS. 153A–153C are plan views, respectively, of a substrate of a conventional structure.

Figure 154A:
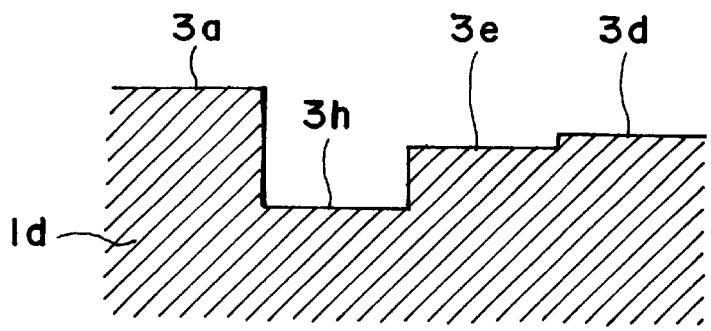
Figure 154B:
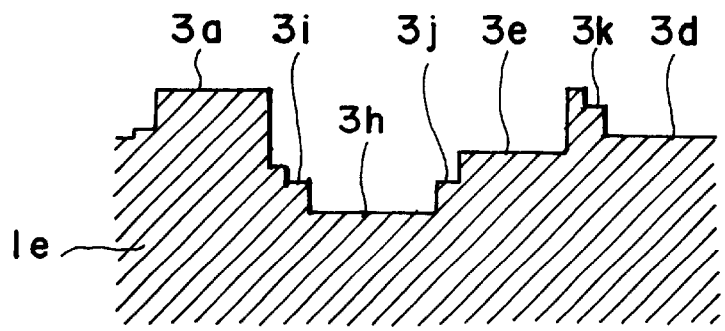

FIGS. 154A and 154B are sectional views, respectively, taken on a line Z—Z in FIG. 153C.

Figure 155:
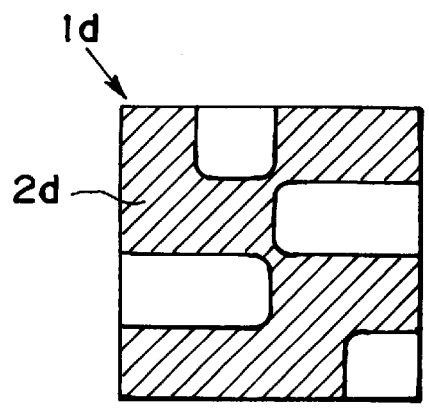

FIG. 155 is a plan view of a resist pattern of a conventional structure.

DESCRIPTION OF THE PREFERRED EMBODIMENTS

Preferred embodiments of the present invention will now be described with reference to FIGS. 1–151 of the accompanying drawings.

Figure 2A:
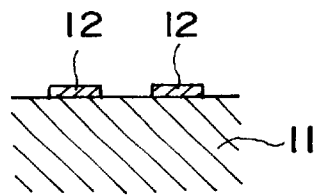
FIGS. 2A–2D are sectional views, respectively, of a substrate in a first process.
Figure 1:
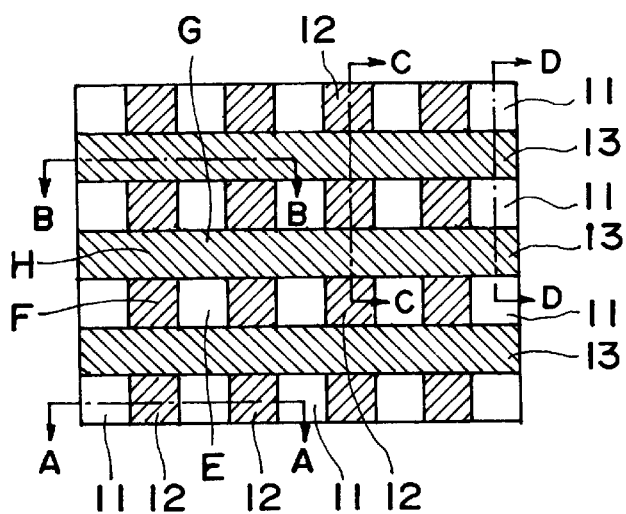
FIG. 1 is a plan view of a substrate in a first process, in a first embodiment of the present invention.
Figure 2B:
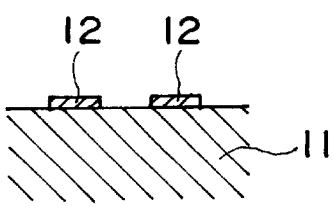
Figure 2C:
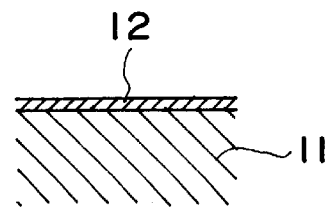
Figure 2D:
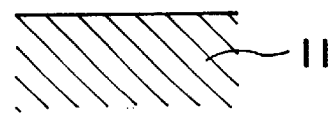
Figure 3A:
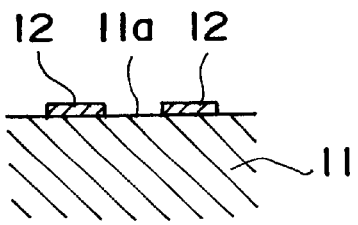
FIGS. 3A–3D are sectional views, respectively, of a substrate in a first process.
Figure 3B:
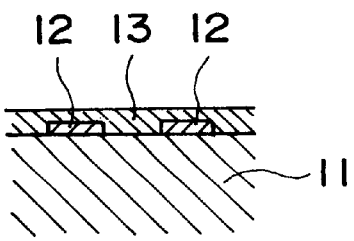
Figure 3C:
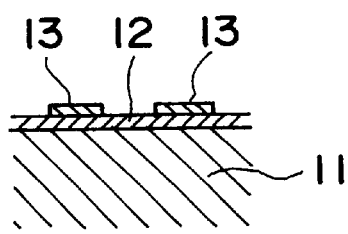
Figure 3D:
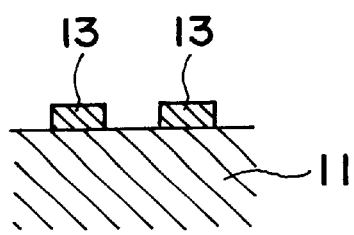
Figure 4:
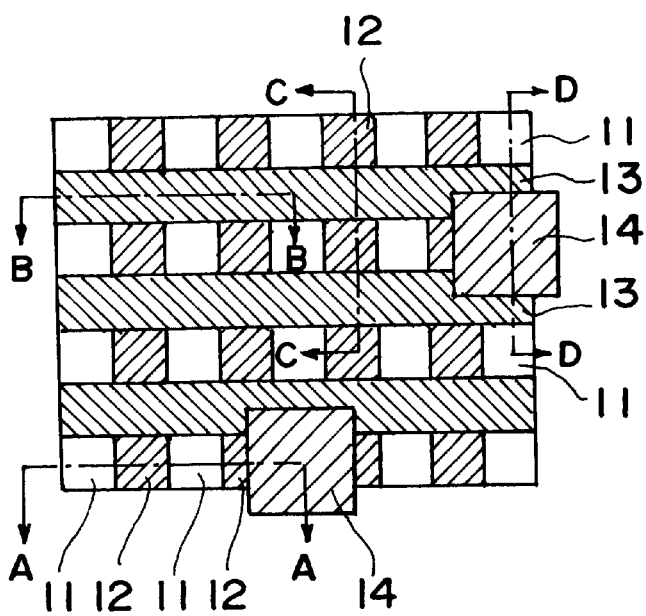
FIG. 4 is a plan view of a substrate in a first process.
Figure 5A:
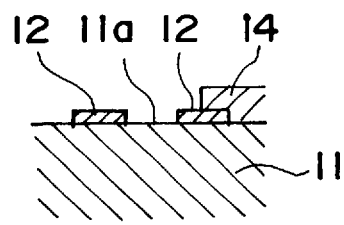
FIGS. 5A–5D are sectional views, respectively, of a substrate in a first process.
Figure 6A:
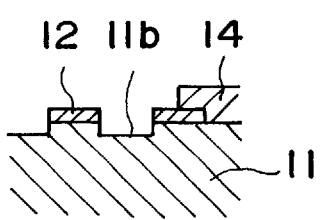
FIGS. 6A–6D are sectional views, respectively, of a substrate in a first process.
Figure 5B:
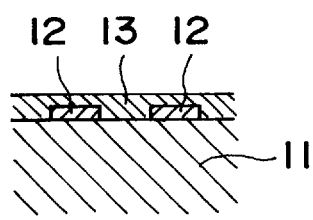
Figure 6B:
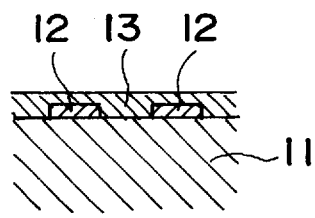
Figure 5C:
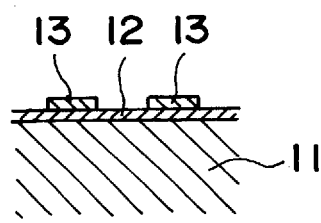
Figure 6C:
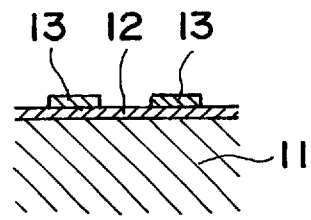
Figure 5D:
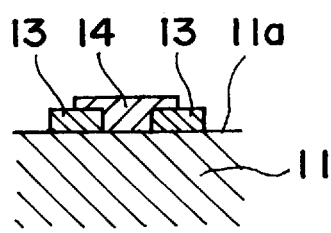
Figure 6D:
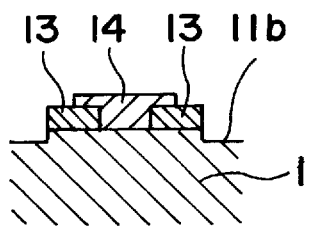
Figure 8A:
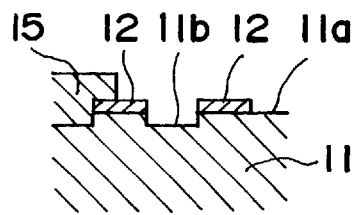
FIGS. 8A–8D are sectional views, respectively, of a substrate in a first process.
Figure 7:
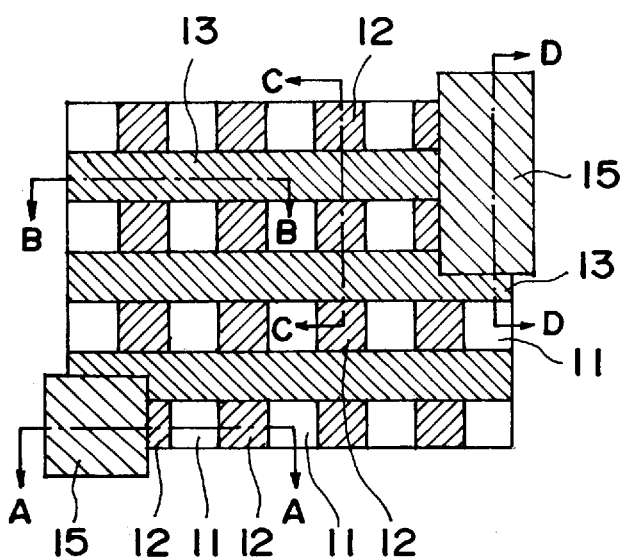
FIG. 7 is a plan view of a substrate in a first process.
Figure 8B:
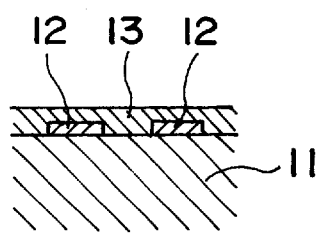
Figure 8C:
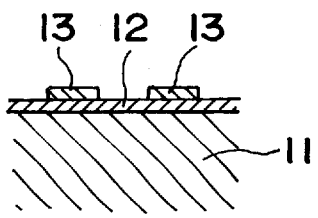
Figure 8D:
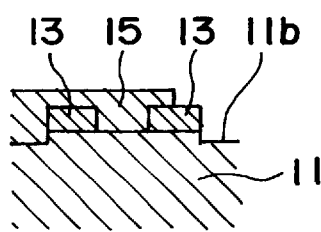
Figure 9A:
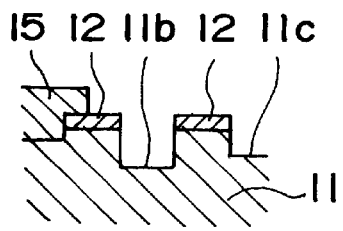
FIGS. 9A–9D are sectional views, respectively, of a substrate in a first process.
Figure 9B:
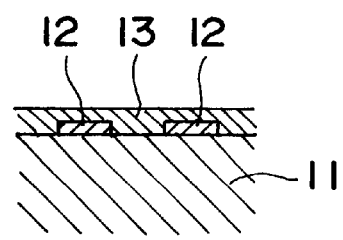
Figure 9C:
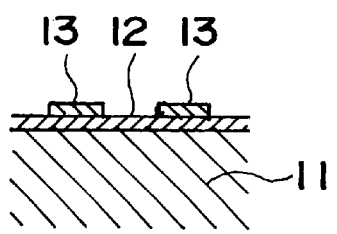
Figure 9D:
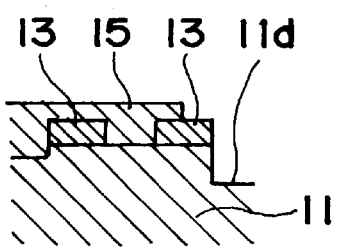
Figure 10:
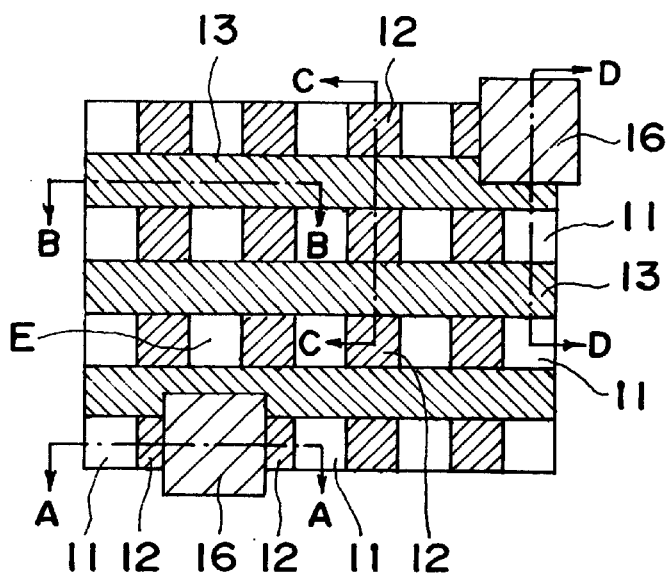
FIG. 10 is a plan view of a substrate in a first process.
Figure 11A:
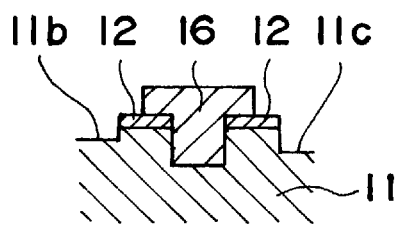
FIGS. 11A–11D are sectional views, respectively, of a substrate in a first process.
Figure 12A:
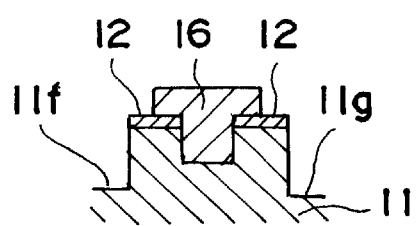
FIGS. 12A–12D are sectional views, respectively, of a substrate in a first process.
Figure 11B:
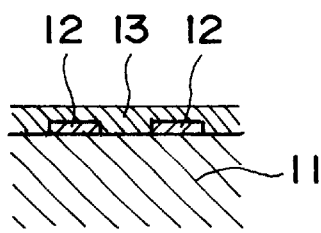
Figure 12B:
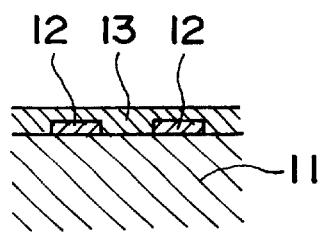
Figure 11C:
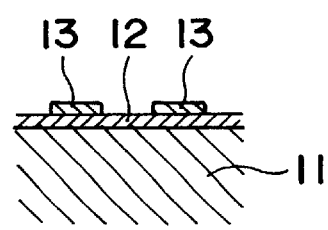
Figure 12C:
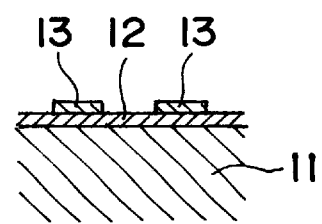
Figure 11D:
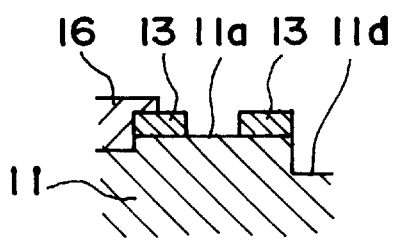
Figure 12D:
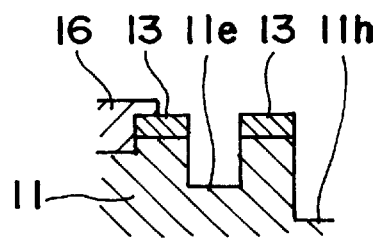
Figure 14A:
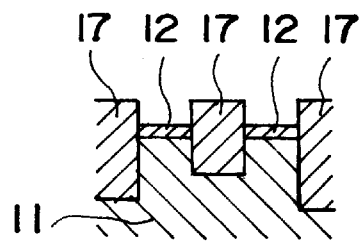
FIGS. 14A–14D are sectional views, respectively, of a substrate in a second process.
Figure 13:
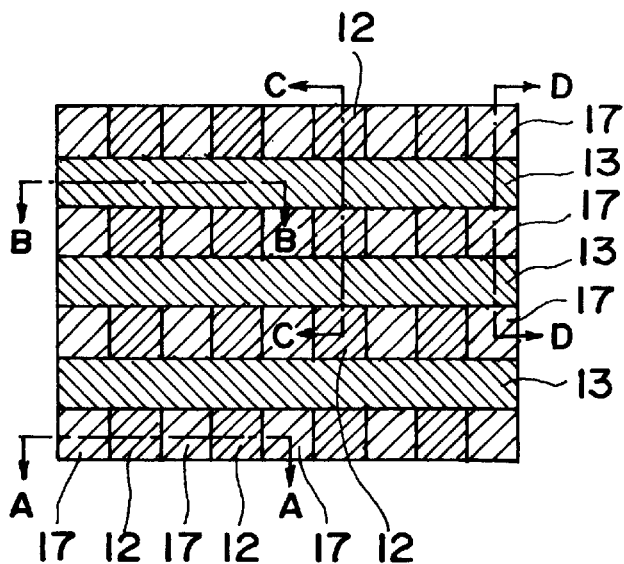
FIG. 13 is a plan view of a substrate in a second process.
Figure 14B:
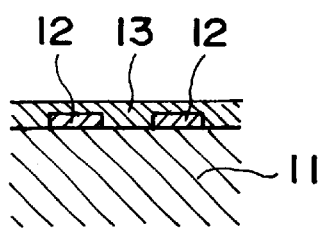
Figure 14C:
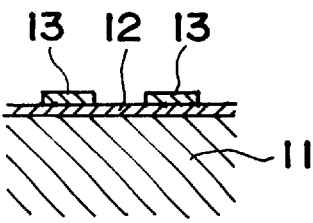
Figure 14D:
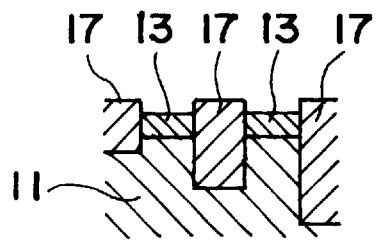
Figure 16A:
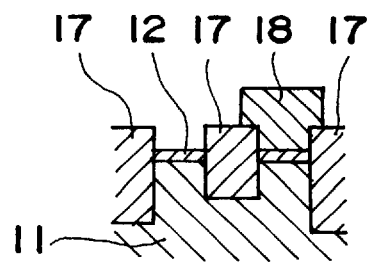
FIGS. 16A–16D are sectional views, respectively, of a substrate in a second process.
Figure 15:
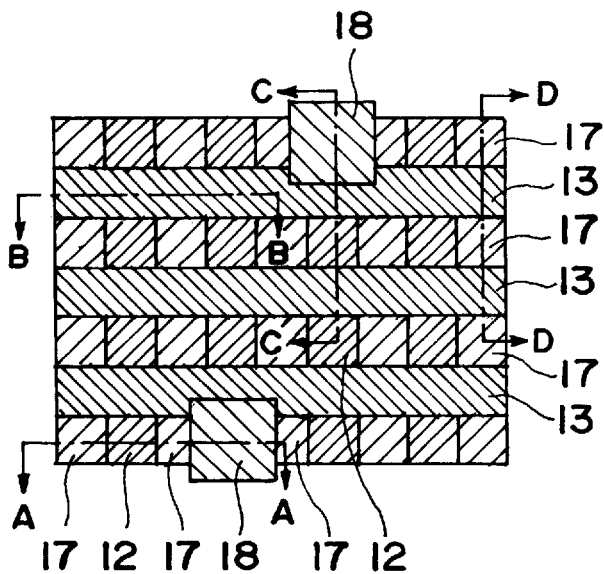
FIG. 15 is a plan view of a substrate in a second process.
Figure 16B:
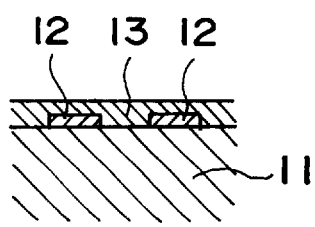
Figure 16C:
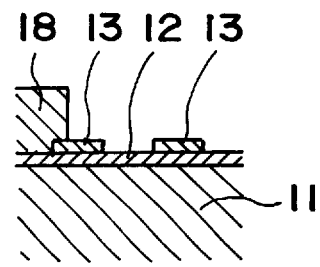
Figure 16D:
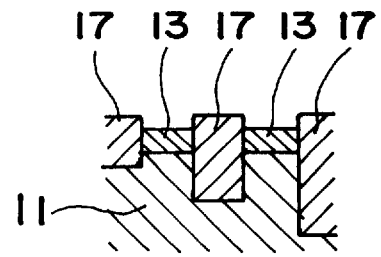
Figure 18A:
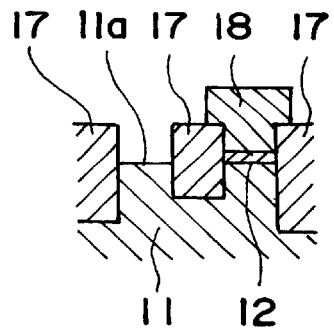
FIGS. 18A–18D are sectional views, respectively, of a substrate in a second process.
Figure 17:
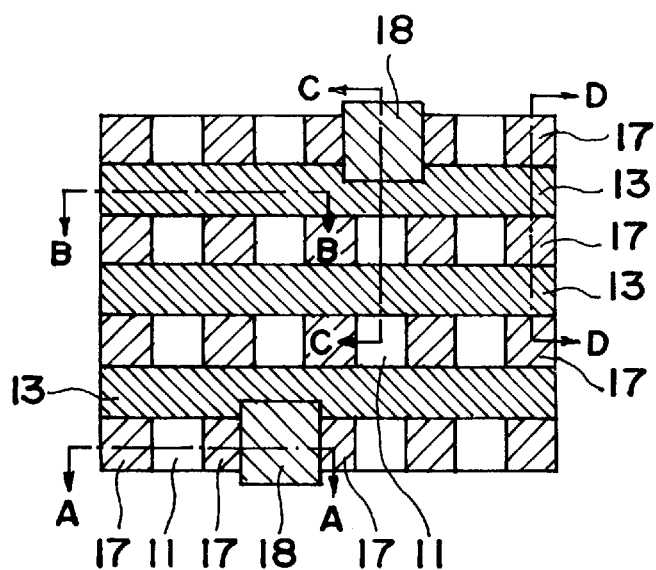
FIG. 17 is a plan view of a substrate in a second process.
Figure 18B:
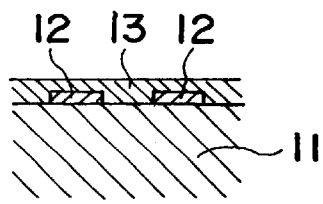
Figure 18C:
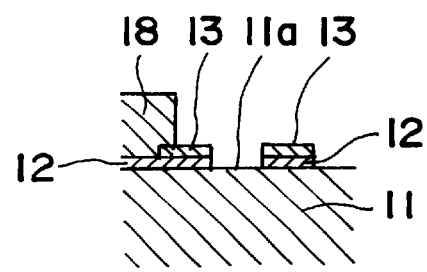
Figure 18D:
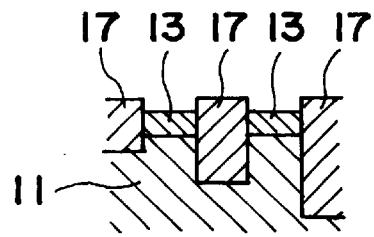
Figure 19A:
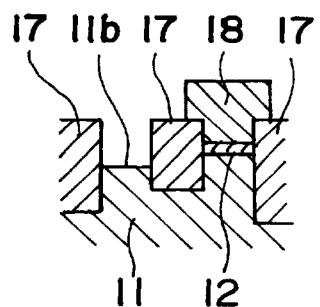
FIGS. 19A–19D are sectional views, respectively, of a substrate in a second process.
Figure 19B:
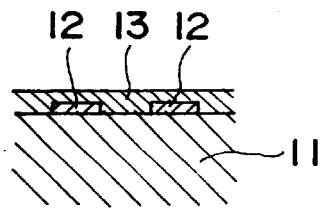
Figure 19C:
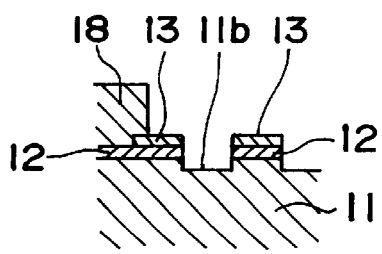
Figure 19D:
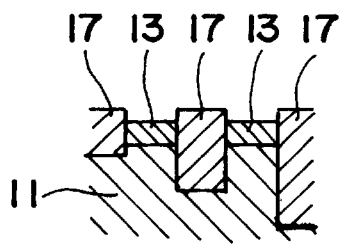
Figure 20:
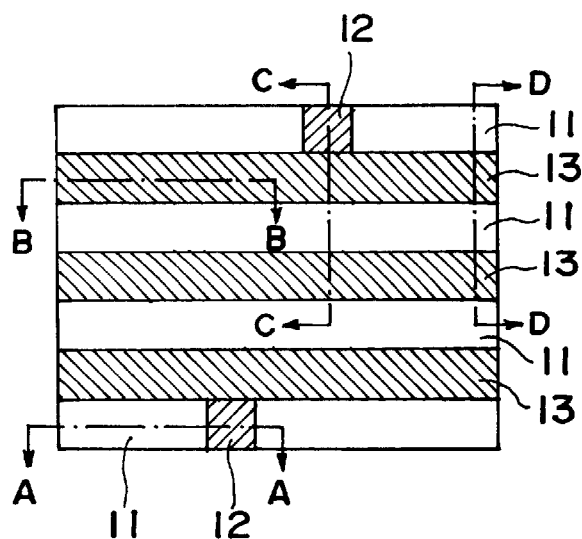
FIG. 20 is a plan view of a substrate in a second process.
Figure 21A:
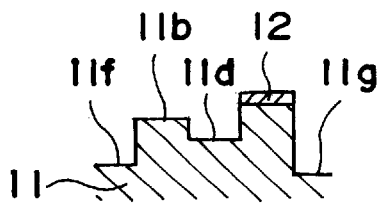
FIGS. 21A–21D are sectional views, respectively, of a substrate in a second process.
Figure 21B:
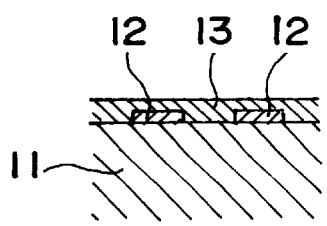
Figure 21C:
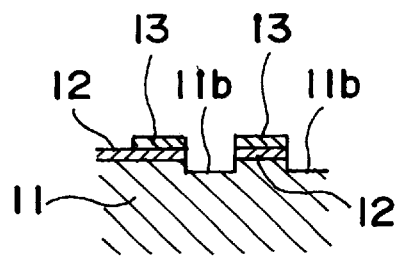
Figure 21D:
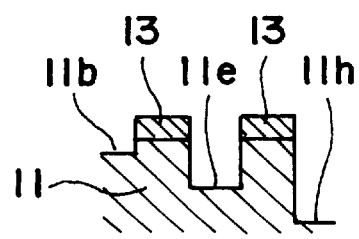
Figure 22:
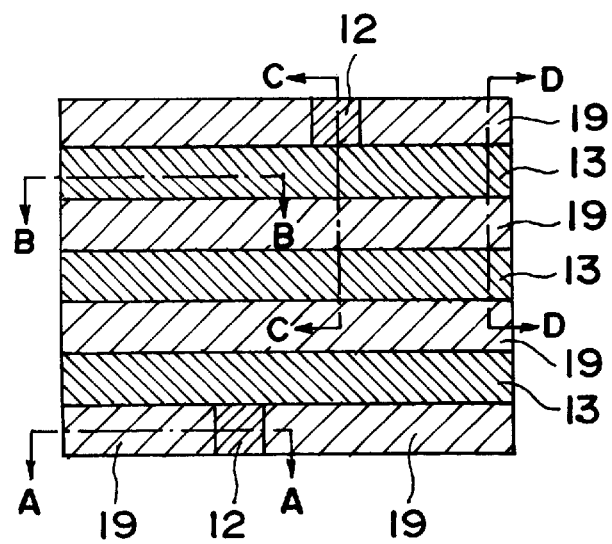
FIG. 22 is a plan view of a substrate in a second process.
Figure 23A:
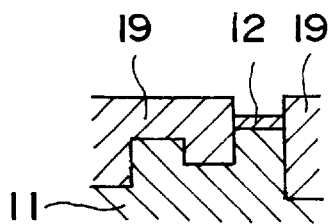
FIGS. 23A–23D are sectional views, respectively, of a substrate in a second process.
Figure 23B:
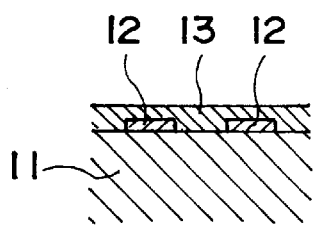
Figure 23C:
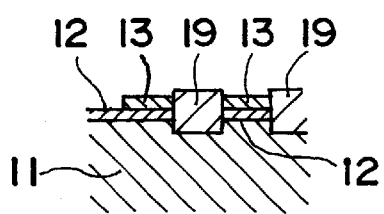
Figure 23D:
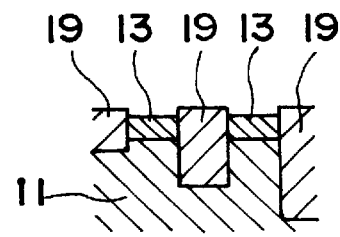
Figure 24:
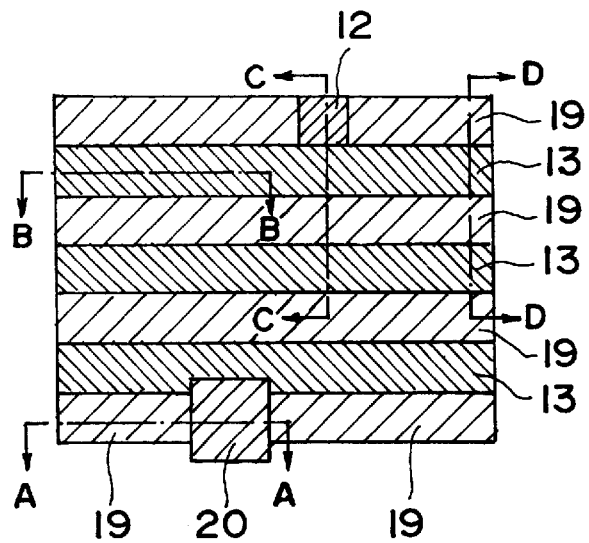
FIG. 24 is a plan view of a substrate in a second process.
Figure 25A:
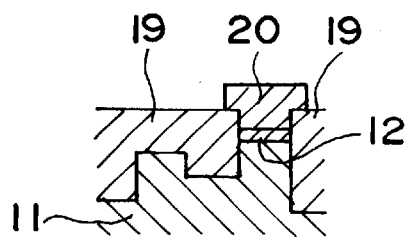
FIGS. 25A–25D are sectional views, respectively, of a substrate in a second process.
Figure 25B:
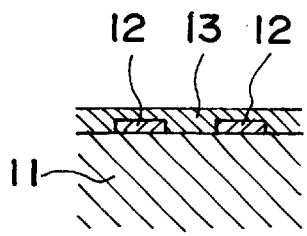
Figure 25C:
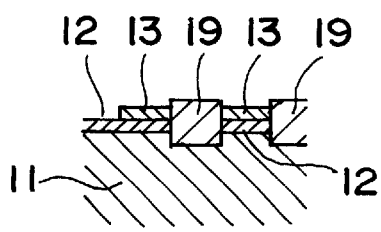
Figure 25D:
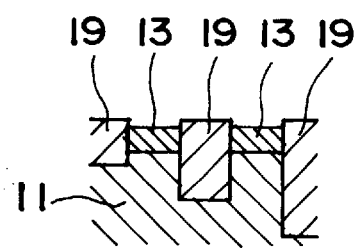
Figure 26:
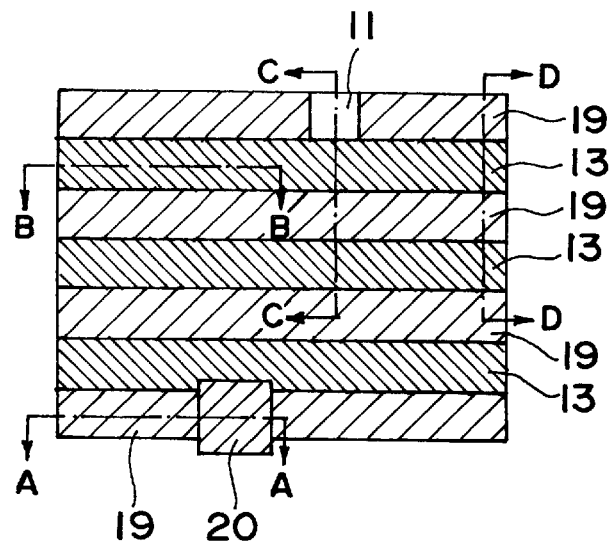
FIG. 26 is a plan view of a substrate in a second process.
Figure 27A:
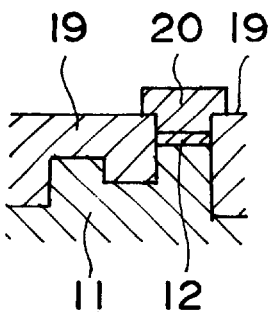
FIGS. 27A–27D are sectional views, respectively, of a substrate in a second process.
Figure 28A:
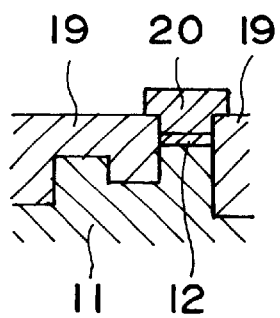
FIGS. 28A–28D are sectional views, respectively, of a substrate in a second process.
Figure 27B:
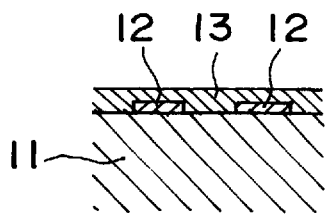
Figure 28B:
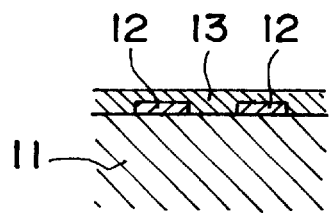
Figure 27C:
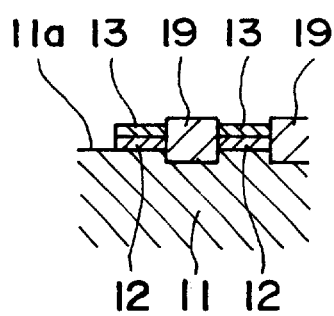
Figure 28C:
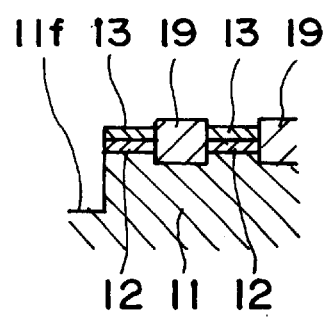
Figure 27D:
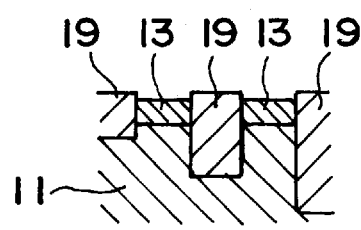
Figure 28D:
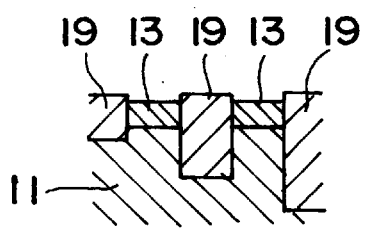
Figure 32A:
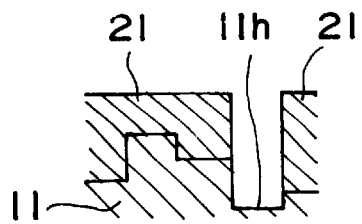
FIGS. 32A–32D are sectional views, respectively, of a substrate in a second process.
Figure 32B:
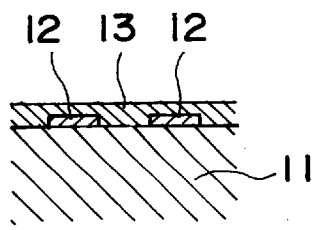
Figure 32C:
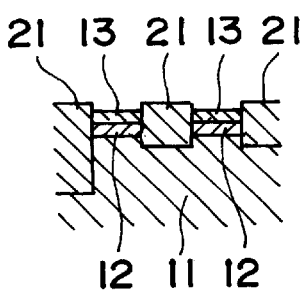
Figure 32D:
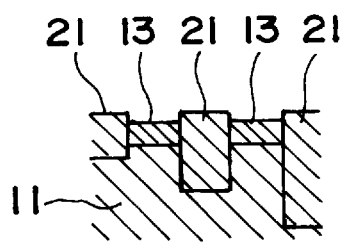
Figure 33:
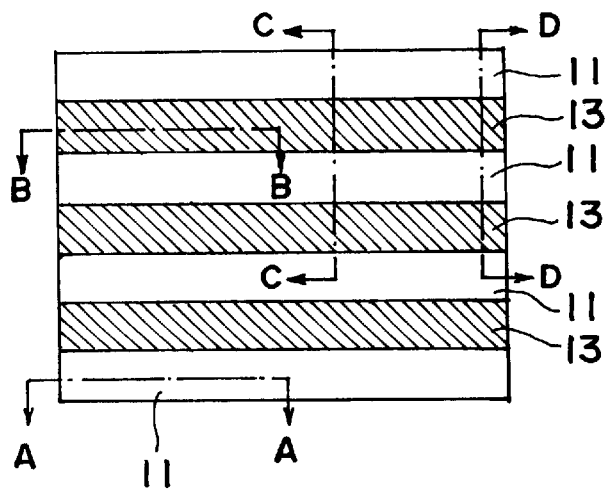
FIG. 33 is a plan view of a substrate in a third process.
Figure 34A:
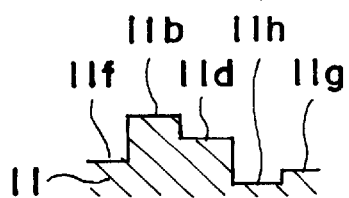
FIGS. 34A–34D are sectional views, respectively, of a substrate in a third process.
Figure 34B:
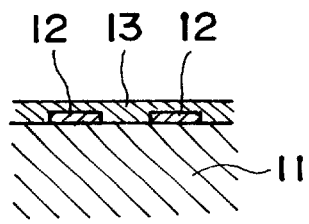
Figure 34C:
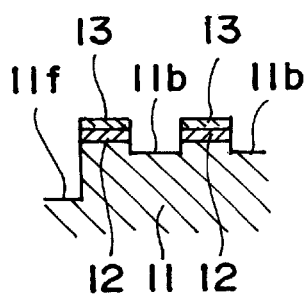
Figure 34D:
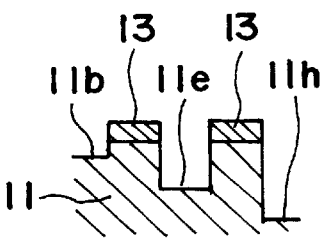
Figure 35:
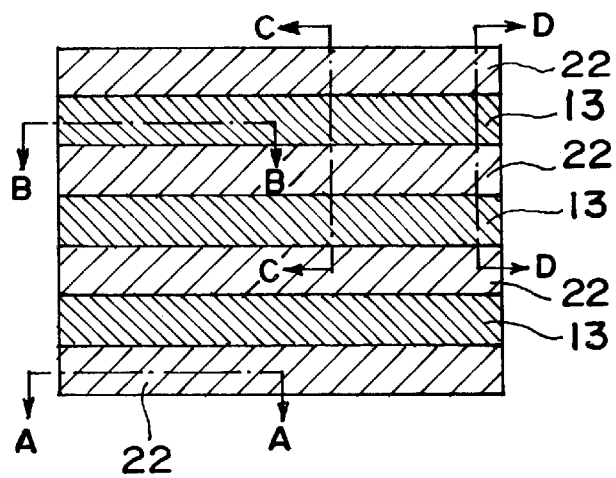
FIG. 35 is a plan view of a substrate in a third process.
Figure 36A:
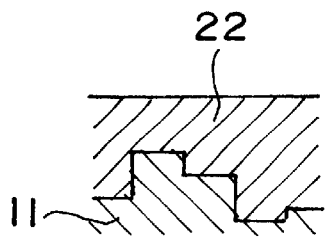
FIGS. 36A–36D are sectional views, respectively, of a substrate in a third process.
Figure 36B:
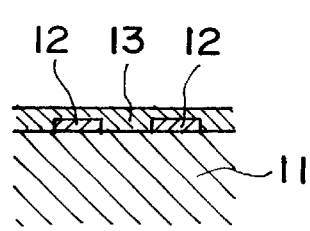
Figure 36C:
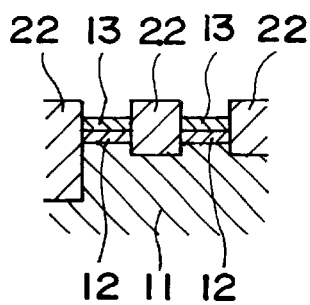
Figure 36D:
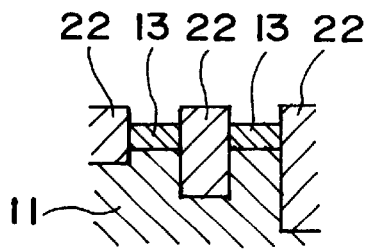
Figure 37:
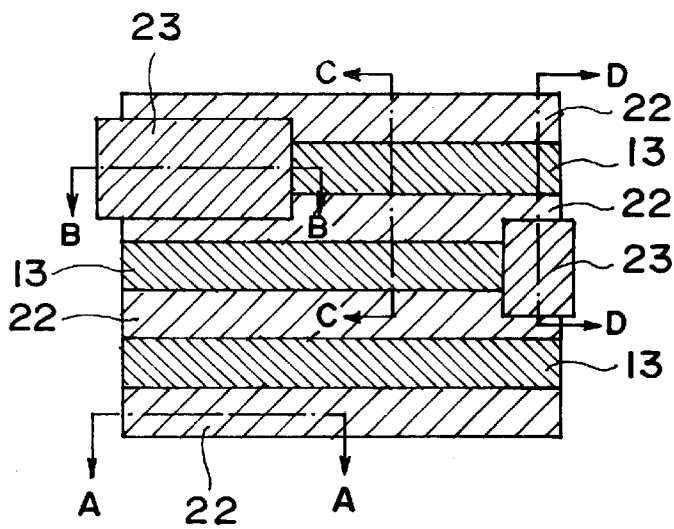
FIG. 37 is a plan view of a substrate in a third process.
Figure 38A:
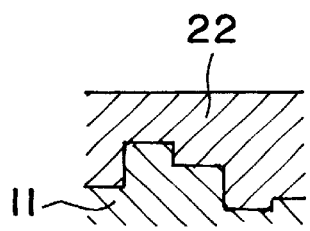
FIGS. 38A–38D are sectional views, respectively, of a substrate in a third process.
Figure 38B:
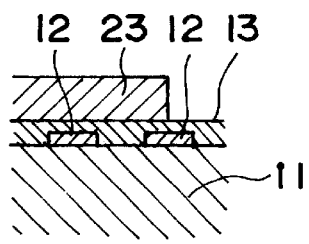
Figure 38C:
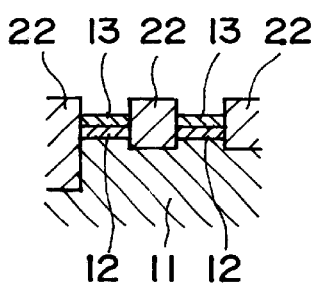
Figure 38D:
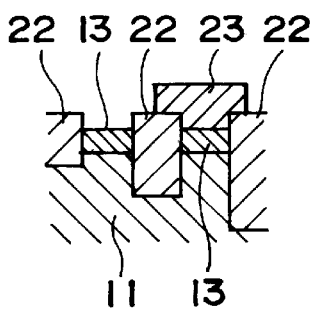
Figure 39:
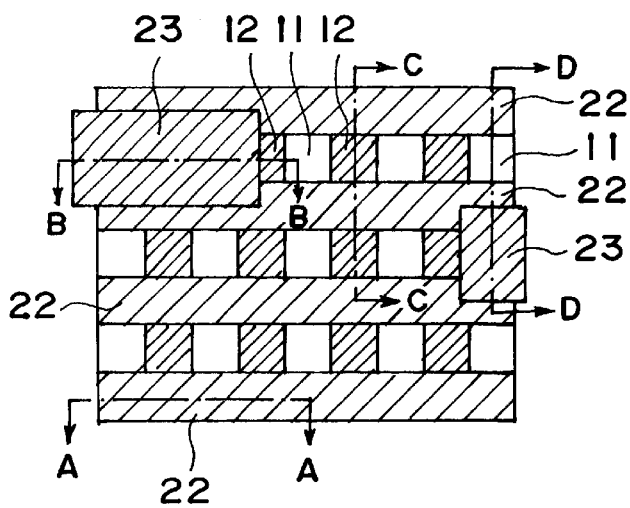
FIG. 39 is a plan view of a substrate in a third process.
Figure 40A:
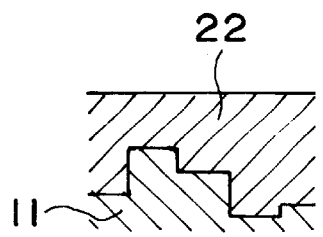
FIGS. 40A–40D are sectional views, respectively, of a substrate in a third process.
Figure 41A:
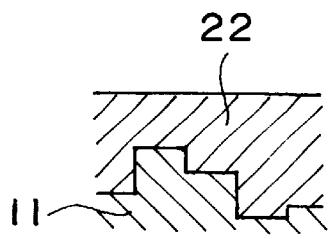
FIGS. 41A–41D are sectional views, respectively, of a substrate in a third process.
Figure 40B:
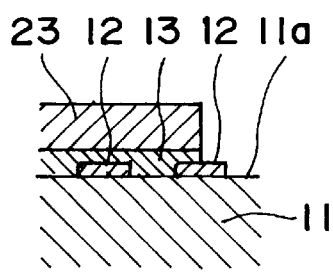
Figure 41B:
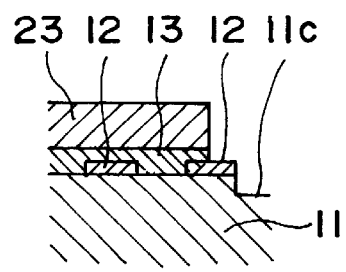
Figure 40C:
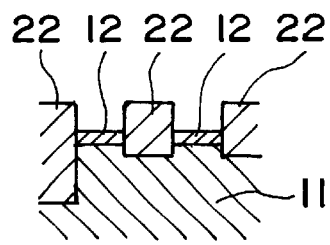
Figure 41C:
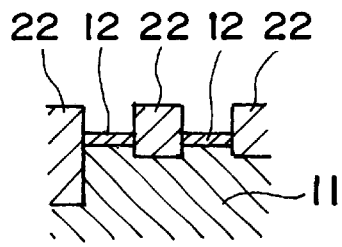
Figure 40D:
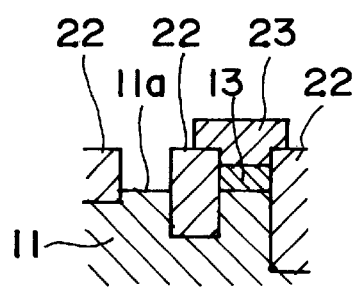
Figure 41D:
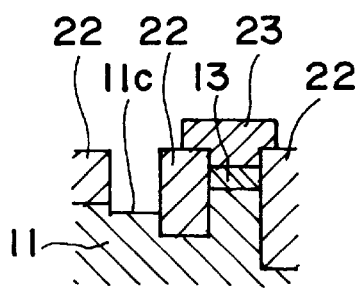
Figure 68A:
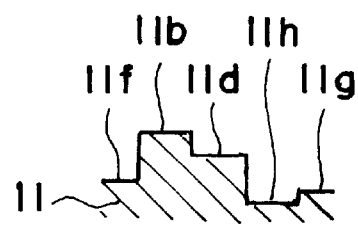
FIGS. 68A–68D are sectional views, respectively, of a substrate in a fourth process.
Figure 67:
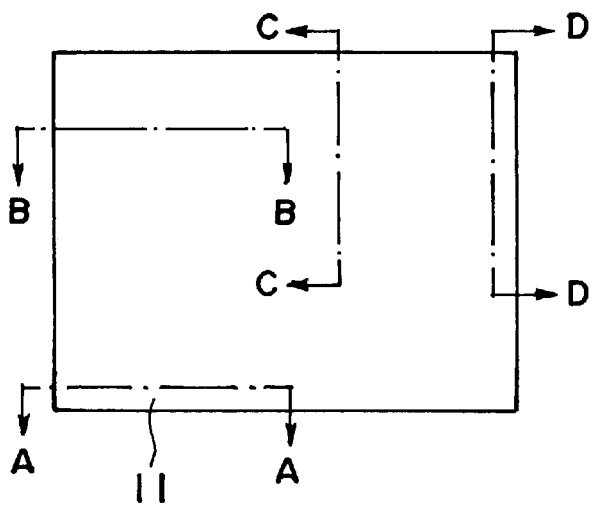
FIG. 67 is a plan view of a substrate in a fourth process.
Figure 68B:
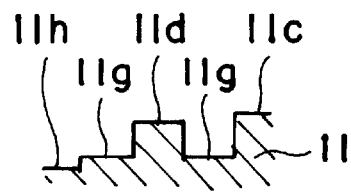
Figure 68C:
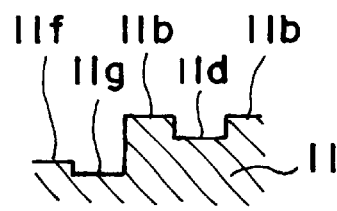
Figure 68D:
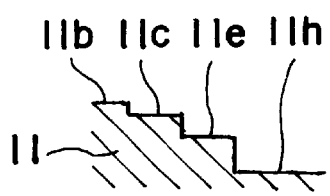
Figure 70A:
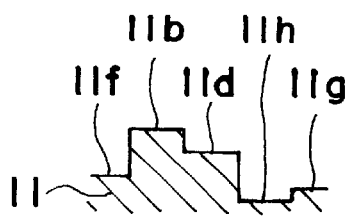
FIGS. 70A–70D are sectional views, respectively, of a substrate in a third process.
Figure 69:
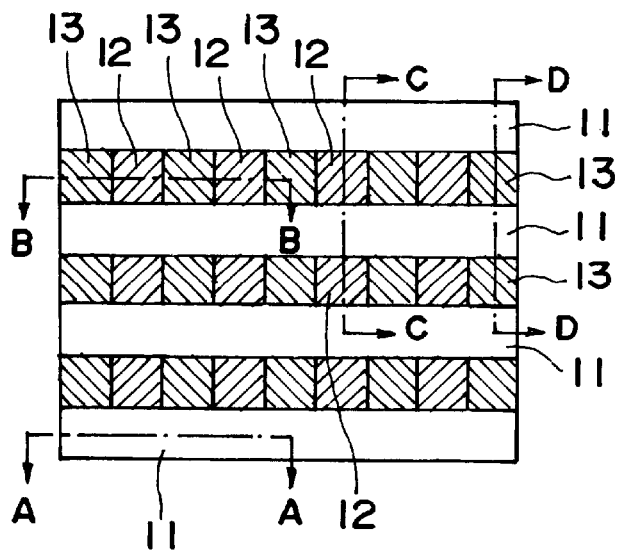
FIG. 69 is a plan view of a substrate in a third process, in a second embodiment of the present invention.
Figure 70B:
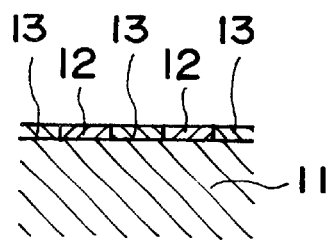
Figure 70C:
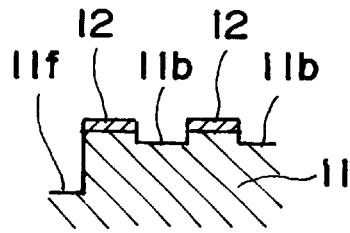
Figure 70D:
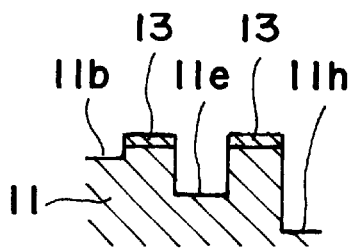
Figure 72A:
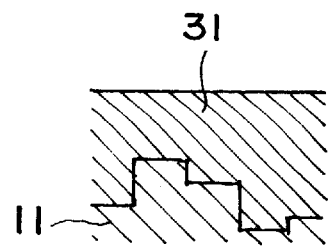
FIGS. 72A–72D are sectional views, respectively, of a substrate in a third process.
Figure 71:
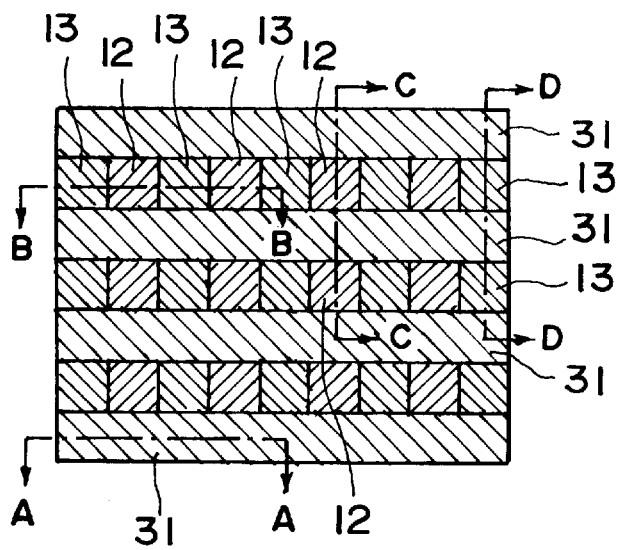
FIG. 71 is a plan view of a substrate in a third process.
Figure 72B:
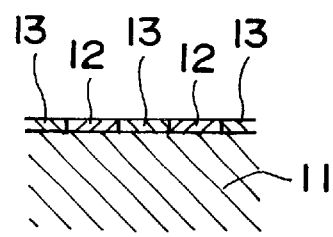
Figure 72C:
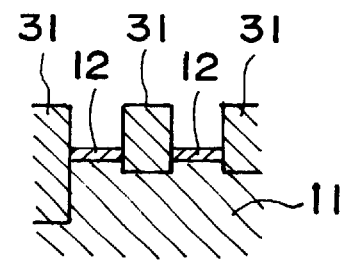
Figure 72D:
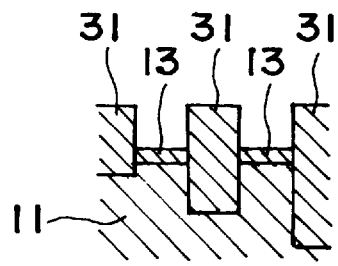
Figure 74A:
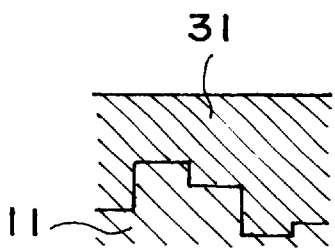
FIGS. 74A–74D are sectional views, respectively, of a substrate in a third process.
Figure 73:
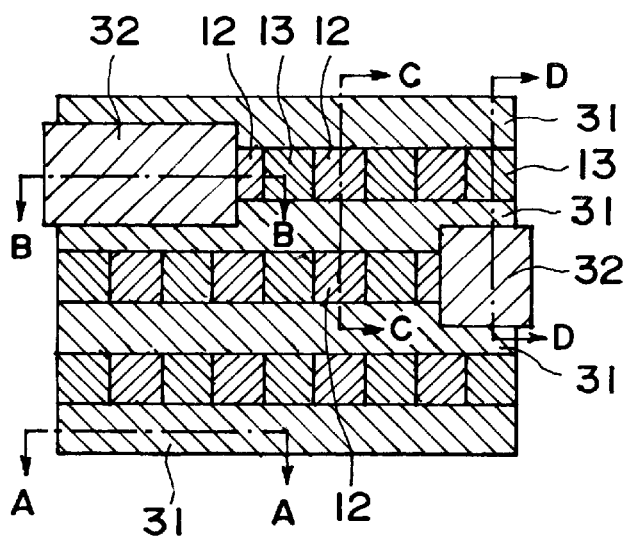
FIG. 73 is a plan view of a substrate in a third process.
Figure 74B:
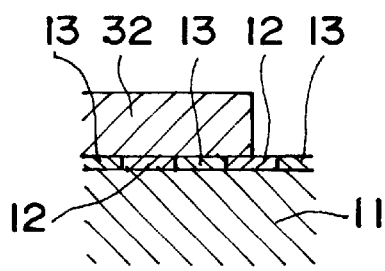
Figure 74C:
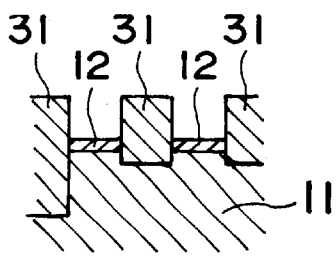
Figure 74D:
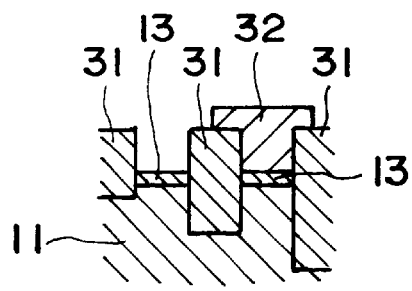
Figure 76A:
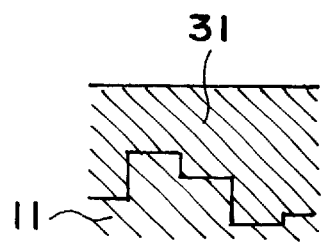
FIGS. 76A–76D are sectional views, respectively, of a substrate in a third process.
Figure 75:
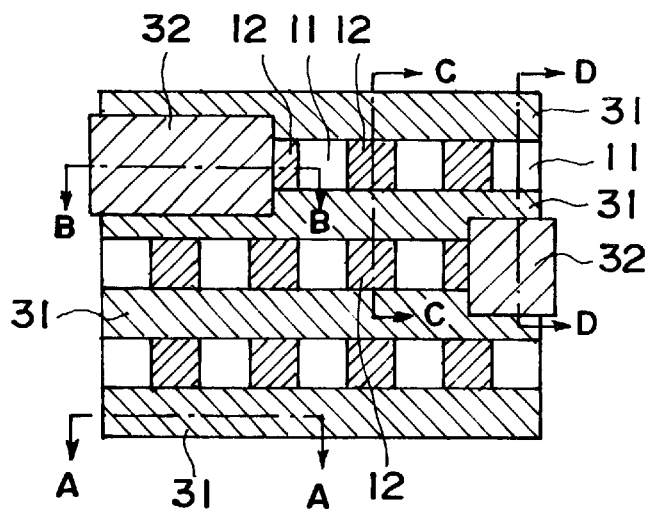
FIG. 75 is a plan view of a substrate in a third process.
Figure 76B:
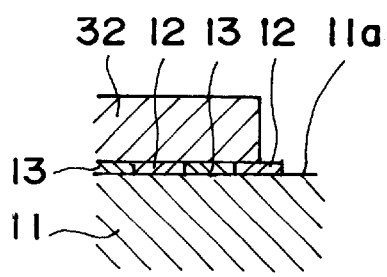
Figure 76C:
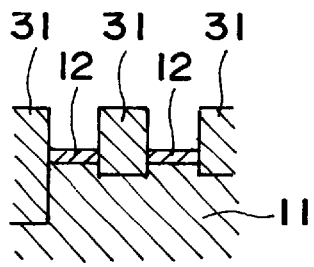
Figure 76D:
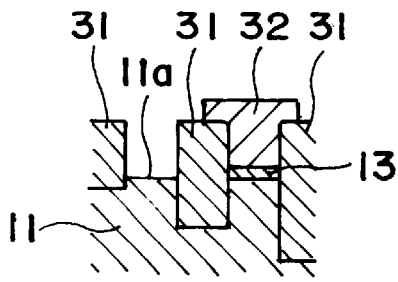
Figure 77A:
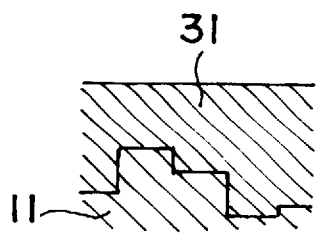
FIGS. 77A–77D are sectional views, respectively, of a substrate in a third process.
Figure 77B:
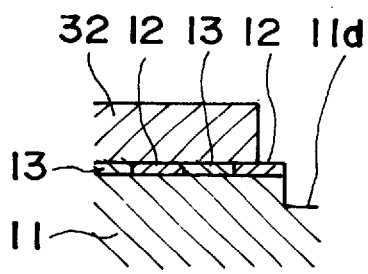
Figure 77C:
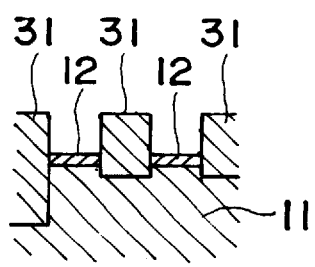
Figure 77D:
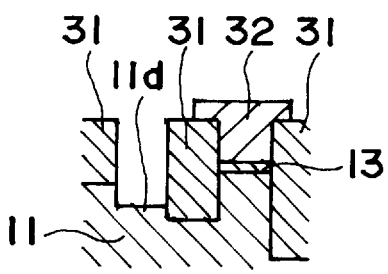
Figure 78:
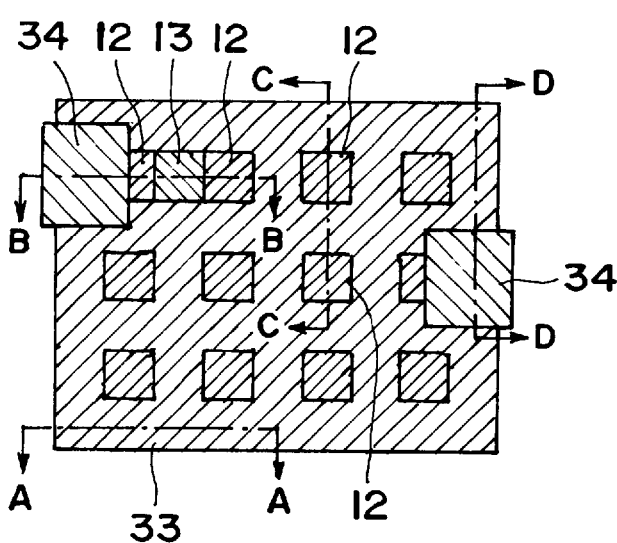
FIG. 78 is a plan view of a substrate in a third process.
Figure 79A:
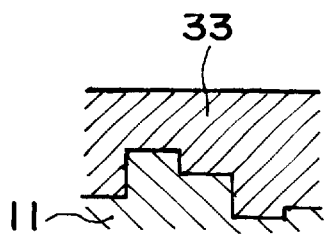
FIGS. 79A–79D are sectional views, respectively, of a substrate in a third process.
Figure 79B:
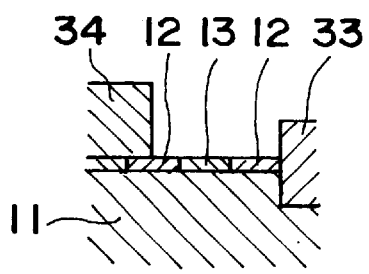
Figure 79C:
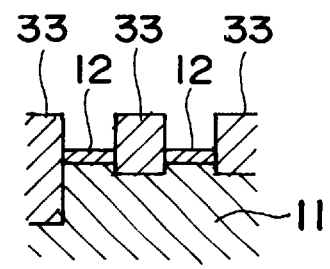
Figure 79D:
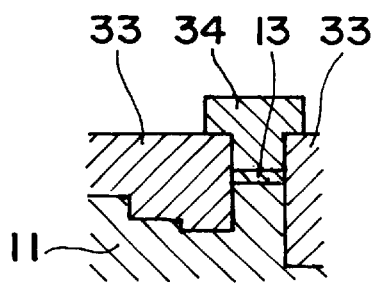
Figure 80:
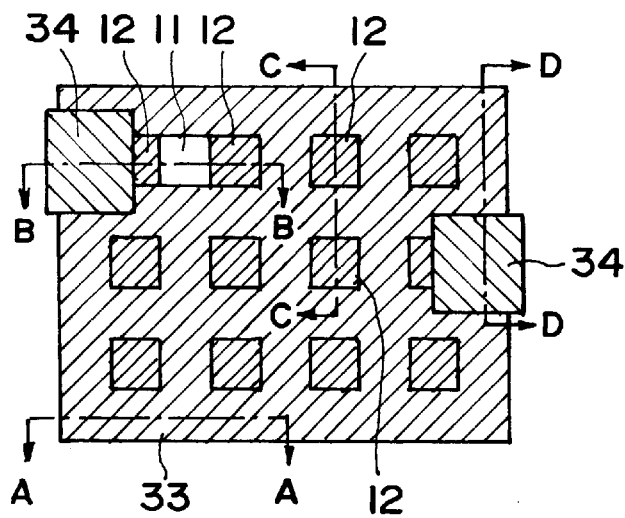
FIG. 80 is a plan view of a substrate in a third process.
Figure 81A:
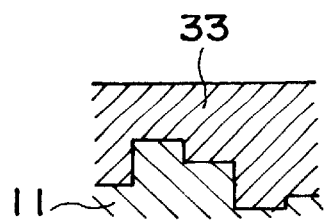
FIGS. 81A–81D are sectional views, respectively, of a substrate in a third process.
Figure 82A:
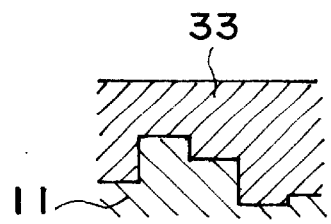
FIGS. 82A–82D are sectional views, respectively, of a substrate in a third process.
Figure 81B:
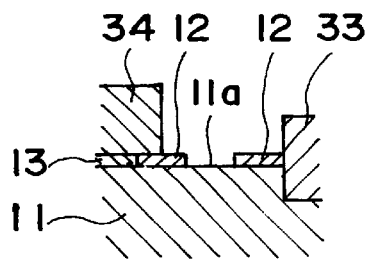
Figure 82B:
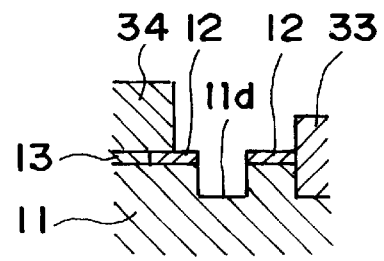
Figure 81C:
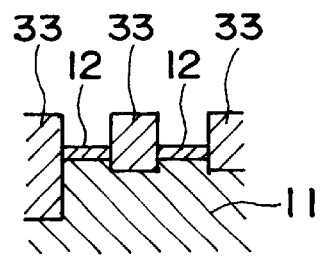
Figure 82C:
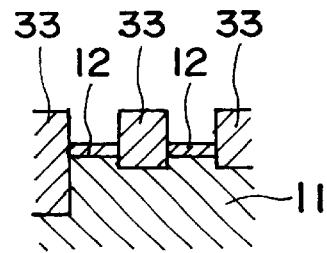
Figure 81D:
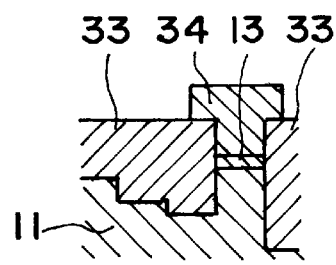
Figure 82D:
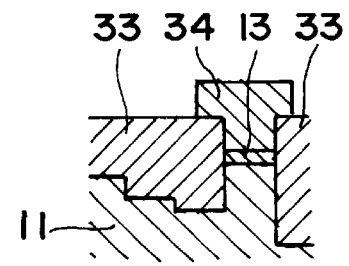
Figure 84A:
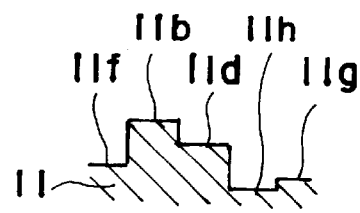
FIGS. 84A–84D are sectional views, respectively, of a substrate in a third process.
Figure 83:
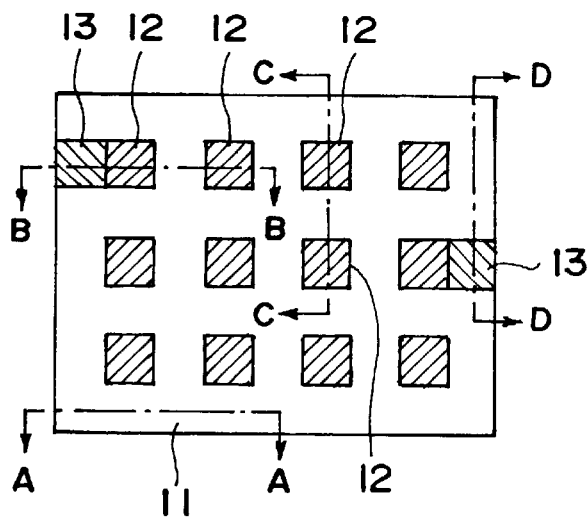
FIG. 83 is a plan view of a substrate in a third process.
Figure 84B:
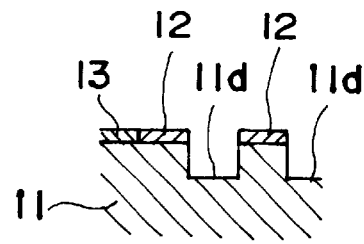
Figure 84C:
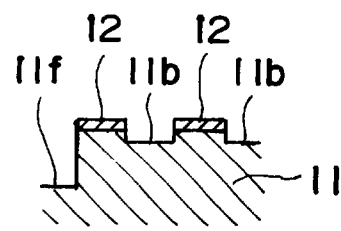
Figure 84D:
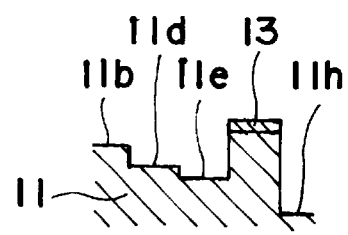
Figure 86A:
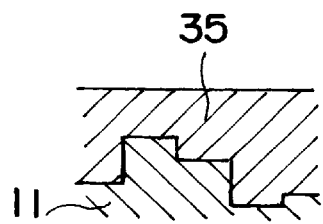
FIGS. 86A–86D are sectional views, respectively, of a substrate in a third process.
Figure 85:
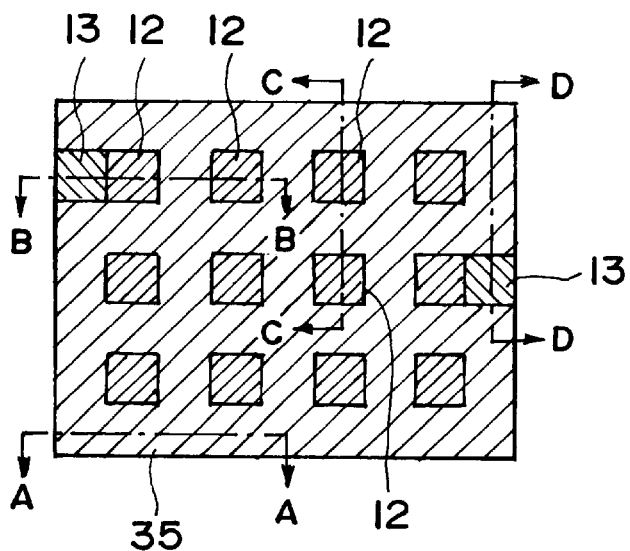
FIG. 85 is a plan view of a substrate in a third process.
Figure 86B:
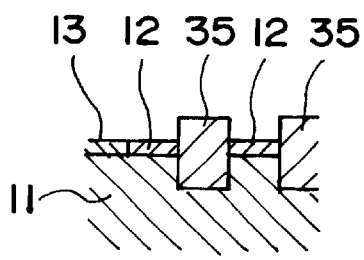
Figure 86C:
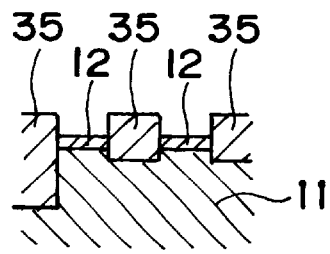
Figure 86D:
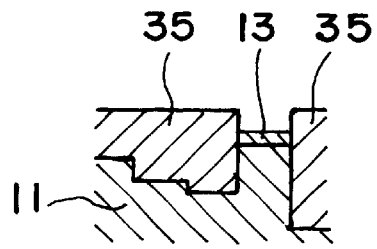
Figure 88A:
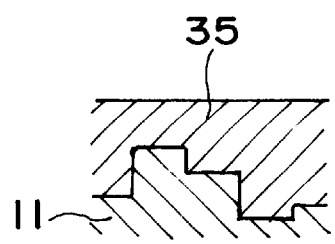
FIGS. 88A–88D are sectional views, respectively, of a substrate in a third process.
Figure 87:
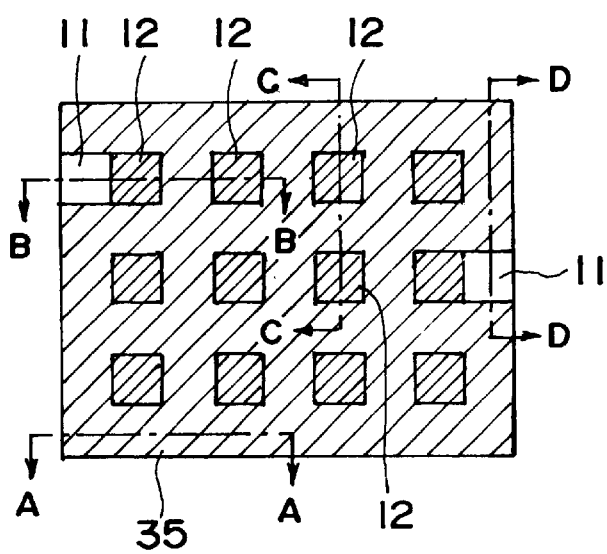
FIG. 87 is a plan view of a substrate in a third process.
Figure 88B:
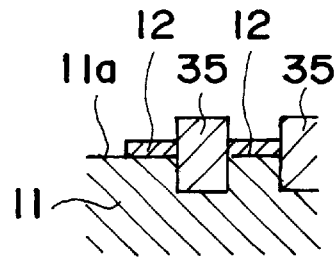
Figure 88C:
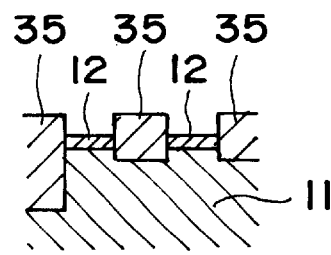
Figure 88D:
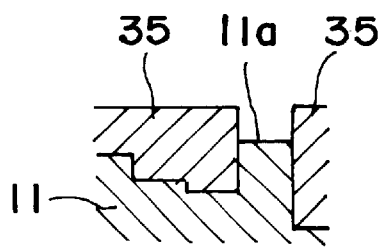
Figure 89A:
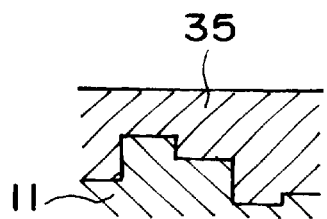
FIGS. 89A–89D are sectional views, respectively, of a substrate in a third process.
Figure 89B:
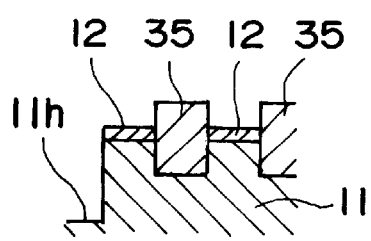
Figure 89C:
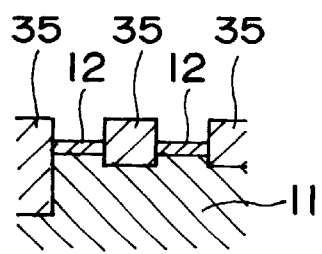
Figure 89D:
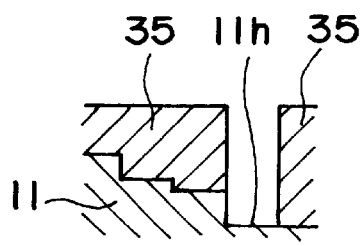
Figure 90:
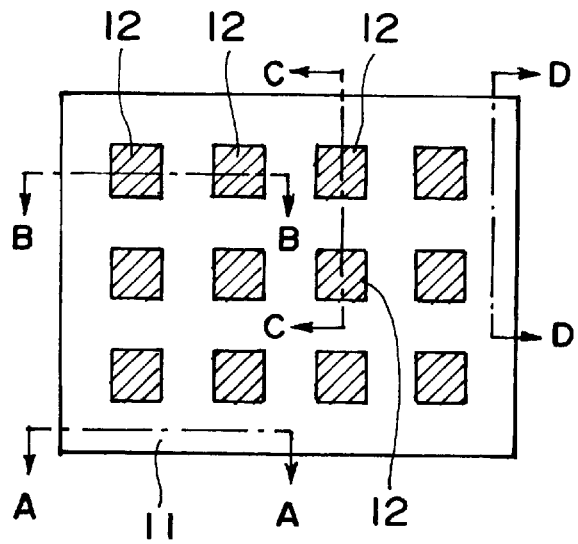
FIG. 90 is a plan view of a substrate in a third process.
Figure 91A:
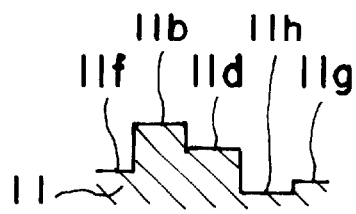
FIGS. 91A–91D are sectional views, respectively, of a substrate in a third process.
Figure 91B:
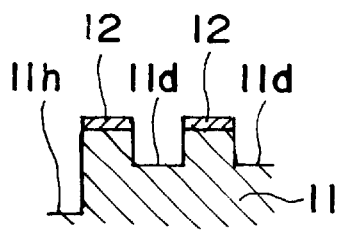
Figure 91C:
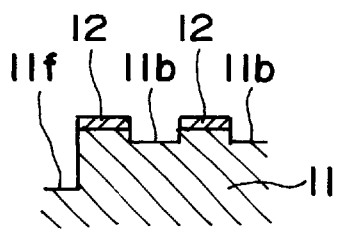

FIG. 1 to FIGS. 68A–68D are schematic views, respectively, for explaining a method of producing a phase type CGH (Computer Graphic Hologram) in a first embodiment of the present invention. FIG. 1 is a plan view of a substrate 11 having a non-transparent chromium pattern 12 and and a non-transparent aluminum pattern 13 formed thereon. FIGS. 2A, 2B, 2C and 2D are sectional views, respectively, taken on lines A—A, B—B, C—C and D—D in FIG. 1, respectively. The chromium pattern 12 is formed with a stripe-like shape, and the aluminum pattern 13 is formed on the chromium pattern while extending substantially orthogonally to the latter. Thus, the surface of the substrate is divided into a region E where neither the chromium pattern 12 nor the aluminum pattern 13 is present, a region F where only the chromium pattern 12 is present, a region G where only the aluminum pattern 13 is present, and a region H where both the chromium pattern 12 and the aluminum pattern 13 are present. These regions E–H are processed individually, by photolithography, whereby eight levels are defined.

As regards the material for the substrate 11, quartz or calcium fluoride may be used. Alternatively, fluoride such as magnesium fluoride, lithium fluoride or aluminum fluoride may be used. Particularly, when an exposure apparatus into which an optical element produced in accordance with the present invention is to be used with light of an ArF excimer laser, light of a KrF excimer laser or i-line light of an ultra-high pressure Hg lamp, for example, for reduction projection of a reticle pattern, use of quartz is effective. Where an exposure apparatus into which an optical element produced in accordance with the present invention is to be used with short-wavelength light of an ArF laser or a fluorine laser, for example, for reduction projection of a reticle pattern, use of fluoride is effective.

In place of using chromium and alumina for the patterns 12 and 13, a metal material such as molybdenum or tungsten, or an inorganic material such as alumina film or a silicon nitride film may be used. Also, provision of an anti-reflection coating on the surfaces of the patterns 12 and 13 will be effective. As regards a machine for forming these patterns 12 and 13, a stepper (exposure apparatus), an electron beam patterning apparatus or an ion beam patterning apparatus, for example, may be used.

As regards the etching process, a reactive ion etching (RIE) process, a sputter etching process or an ion milling process may be used. Also, a ultra-high frequency (harmonics) (UHF) plasma process or an induction coupling plasma (ICP) process based on low-pressure and high-density plasma, may be used. Particularly, use of the ion milling process is most effective when a fluoride is used for the substrate 11. In a wet etching process, a buffering solution of pH of about 8, as $KH_2PO_4$, KOH, or red prussiate of potash, may be used. In a dry etching process, a gas of $CF_4$ or a mixture gas of $CF_4$ and oxygen may be used. In that occasion, the substrate 11 can be etched under the same condition as of the patterns 12 and 13.

A reflective phase-type CGH can be provided when a reflective material is used for the substrate 11, or where a reflective material is formed as a film upon the substrate 11 in accordance with deposition, plating, sputtering or chemical vapor deposition (CVD), for example. A reflection enhancement film may be provided on the surface of it.

A phase-type CGH according to the present invention may be produced through first to fourth processes. In the first process, while using a chromium pattern 12 and an aluminum pattern 13 as a mask, a patterning step and an etching step are repeated three times to the regions E, whereby eight levels are defined. In the second process, a negative type resist is applied to the whole surface of the substrate and, through back-side exposure (exposure of the resist from the substrate side) and development, the regions E are covered. Subsequently, uncovered portions of the chromium pattern 12 in the regions F are removed and the substrate 11 is etched. This procedure is repeated seven times, whereby eight levels are defined. In the third process, a negative type resist is applied to the whole surface of the substrate and, through back-side exposure and development, the regions E and F are covered. Thereafter, uncovered portions of the aluminum pattern 13 in the regions G are removed and the substrate 11 is etched. This procedure is repeated seven times, whereby eight levels are defined. In the fourth process, a negative type resist is applied to the whole surface of the substrate and, through back-side exposure and development, the regions E, F and G are covered. Thereafter, uncovered portions of the chromium pattern in the regions G are removed and the substrate 11 is etched. This procedure is repeated seven times, whereby eight levels are defined.

The first to fourth processes will be described in greater detail. In the first process, as shown in FIGS. 2A–2D, first, a chromium pattern 12 is formed upon the surface of the substrate 11, into a stripe-like shape. The chromium may be etched in accordance with the RIE process, by using a mixture of a chlorine gas and an oxygen gas. Then, as shown in FIGS. 3A–3D, an aluminum pattern 13 is formed upon the chromium pattern 12, into a stripe-like shape being elongated in a direction orthogonal to the chromium pattern 12. The aluminum may be etched in accordance with the RIE process, using a mixture of $BCl_3$, a chlorine gas and an oxygen gas, for example. With this procedure, a level 11a (which is the surface of the substrate 11) is defined between the patterns 12 and 13. Since, during the etching step, the chromium pattern 12 may be etched to some extent, the etching end point should be controlled carefully. Also, the aluminum pattern 13 may be formed with an orientation not orthogonal to the chromium pattern 12, if to do so is desirable.

Subsequently, as shown in FIGS. 4 and 5A–5D, a resist pattern 14 is produced on an appropriate portion of the substrate 11. Then, as shown in FIGS. 6A–6D, the substrate 11 is etched by 61 nm, while using the patterns 12, 13 and 14 as a mask. The etching step may be performed in accordance with the RIE process, for example, by using a mixture gas of $CF_4$ and hydrogen, and at a pressure of 4 Pa, whereby two levels 11a and 11b are accomplished.

Thereafter, the resist pattern 14 is removed. Subsequently, as shown in FIGS. 7 and 8A–8D, a resist pattern 15 is produced on an appropriate portion of the substrate. Then, as shown in FIGS. 9A–9D, the substrate 11 is etched by 122 nm, while using the patterns 12, 13 and 15 as a mask, whereby four levels 11a–11d are accomplished. The etching condition may be the same as that in the process of FIGS. 6A–6D.

Then, the resist pattern 15 is removed. Subsequently, as shown in FIGS. 10 and 11A–11D, a resist pattern 16 is produced on an appropriate portion of the substrate. Then, as shown in FIGS. 12A–12D, the substrate 11 is etched by 244 nm, while using the patterns 12, 13 and 16 as a mask, under the same condition as of FIGS. 6A–6D, whereby eight levels 11a–11h are accomplished.

In the second process, after the resist pattern 16 is removed, a negative type resist is applied to the whole surface of the substrate. Then, through back-side exposure and development, a negative resist pattern 17 (FIGS. 13 and 14A–14D) is produced only in the regions E, while using the patterns 12 and 13 as a contact mask. Then, as shown in FIGS. 15 and 16A–16D, a resist pattern 18 is produced on an appropriate portion of the substrate. Then, the chromium pattern 12 is removed by etching, as shown in FIGS. 17 and 18A–18D, while using the patterns 13, 17 and 18 as a mask, whereby a level 11a is uncovered. The etching process may use a mixture solution of cerium ammonium nitrate, perchloric acid and water, for example. Since excessive over-etching produces a large undercut, the over-etching should be kept to a minimum, e.g., about 5%. Also, in a case of dry etching, a condition that the selection ratio to aluminum is not less than 3, for example, may be used.

Subsequently, as shown in FIGS. 19A–19D, the substrate is etched by 61 nm, while using the patterns 13, 17 and 18 as a mask, whereby two levels 11a and 11b are defined. Here, the level 11b is no more etched after this step. Basically, the above procedure is repeated seven times, such that eight levels 11a–11h are defined in the regions F. Here, further two processes will be explained.

As shown in FIGS. 20 and 21A–21D, the resist patterns 17 and 18 are removed. Thereafter, a negative type resist is applied to the whole surface of the substrate as shown in FIGS. 22 and 23A–23D and, through back-side exposure and development, a resist pattern 19 is produced. Subsequently, as shown in FIGS. 24 and 25A–25D, a resist pattern 20 is produced on an appropriate portion of the substrate. Then, uncovered portions of the chromium pattern 12 are removed by etching, as shown in FIGS. 26 and 27A–27D, whereby a level 11a is uncovered. Here, the etching condition may be the same as the process of FIGS. 17 and 18A–18D.

Thereafter, the substrate 11 is etched by 305 nm, as shown in FIGS. 28A–28D, whereby a level 11f is accomplished. Then, the resist patterns 19 and 20 are removed and, thereafter, a negative type resist is applied to the whole surface. Through back-side exposure and development, a resist pattern 21 is produced, such as shown in FIGS. 29 and 30A–30D. Further, uncovered portions of the chromium pattern 12 are removed by etching, as shown in FIGS. 31A–31D, whereby a level 11a is uncovered. Here, the etching condition may be the same as of FIGS. 17 and 18A–18D. Then, as shown in FIGS. 32A–32D, the substrate 11 is etched by 427 nm, while using the patterns 13 and 21 as a mask, whereby a level 11h is accomplished.

In the third process, the resist pattern 21 is removed as shown in FIGS. 33 and 34A–34D. Thereafter, a negative type resist is applied to the whole surface and, through back-side exposure and development, a resist pattern 22 is produced, as shown in FIGS. 35 and 36A–36D. Subsequently, as shown in FIGS. 37 and 38A–38D, a resist pattern 23 is produced on an appropriate portion, and uncovered portions of the aluminum pattern 13 are removed by etching, as shown in FIGS. 39 and 40A–40D, whereby a level 11a is uncovered. Here, the etching process may use a mixture solution of nitric acid, phosphoric acid, acetic acid and water, for example. Then, as shown in FIGS. 41A–41D, the substrate 11 is etched by 122 nm, while using the patterns 12, 22 and 23 as a mask, whereby a level 11c is defined.

Figure 42:
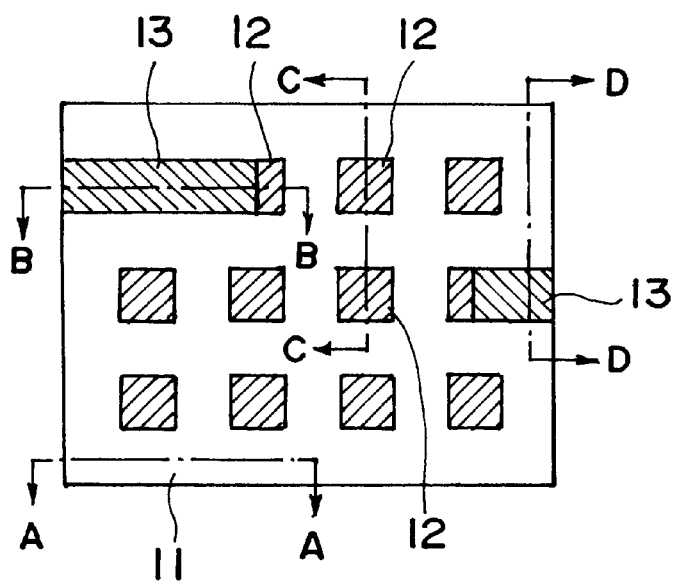
FIG. 42 is a plan view of a substrate in a third process.
Figure 43:
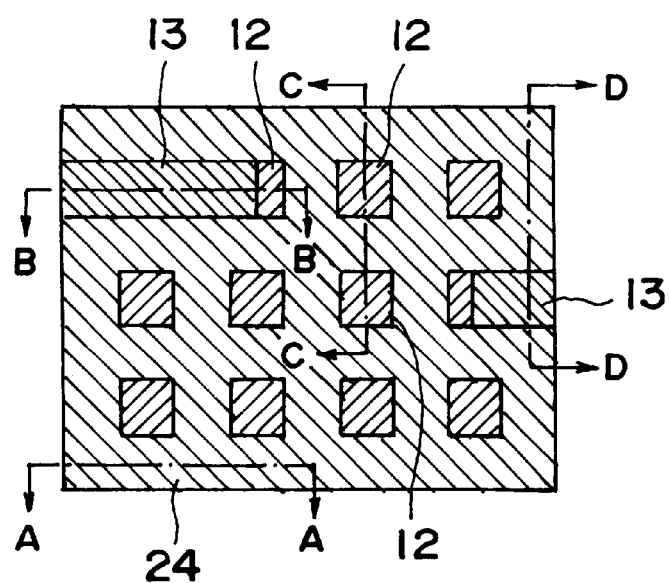
FIG. 43 is a plan view of a substrate in a third process.
Figure 45A:
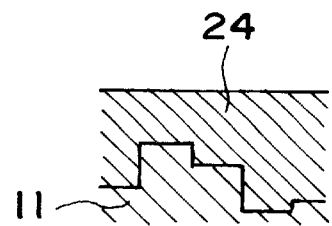
FIGS. 45A–45D are sectional views, respectively, of a substrate in a third process.
Figure 44:
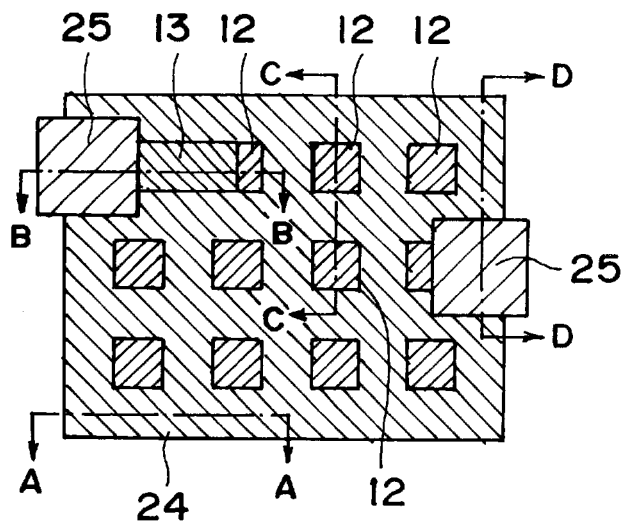
FIG. 44 is a plan view of a substrate in a third process.
Figure 45B:
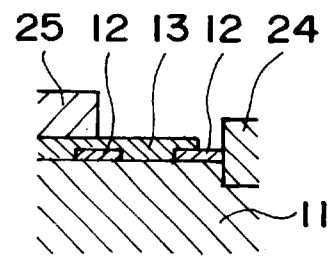
Figure 45C:
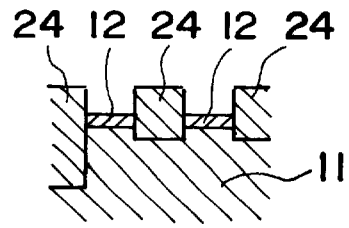
Figure 45D:
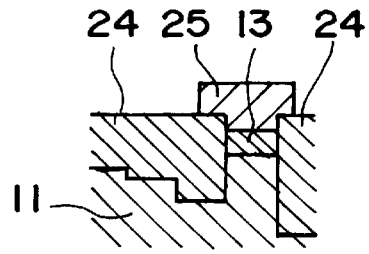
Figure 47A:
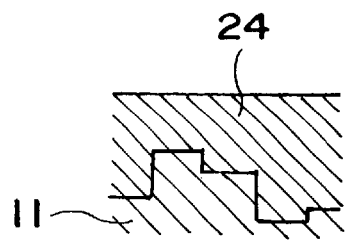
FIGS. 47A–47D are sectional views, respectively, of a substrate in a third process.
Figure 46:
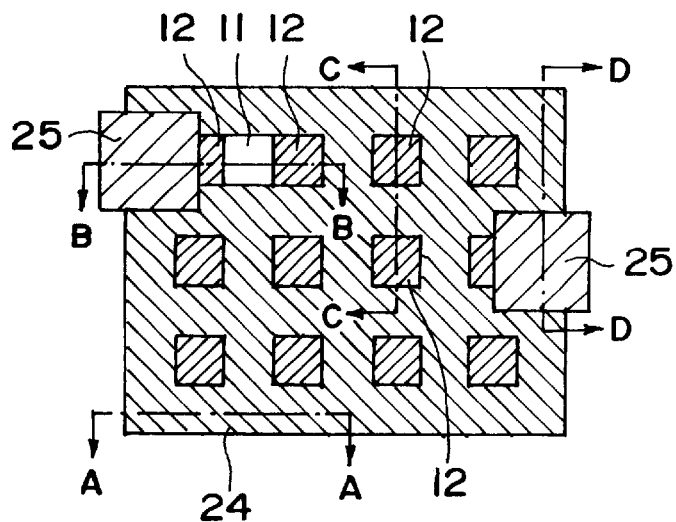
FIG. 46 is a plan view of a substrate in a third process.
Figure 47B:
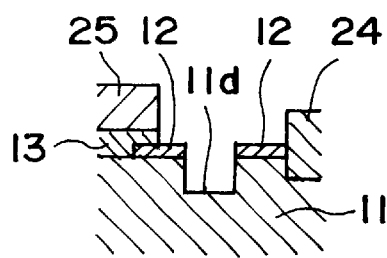
Figure 47C:
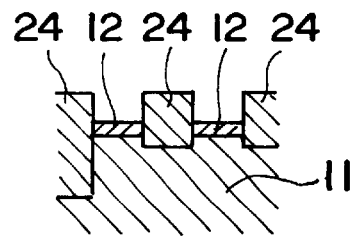
Figure 47D:
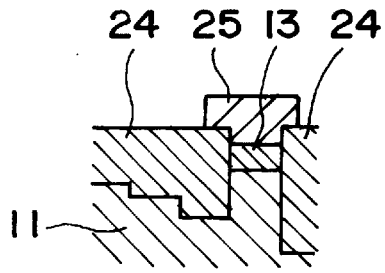
Figure 52A:
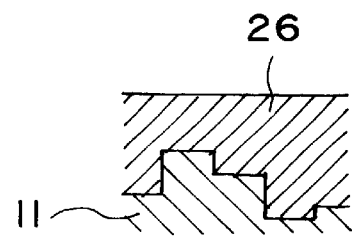
FIGS. 52A–52D are sectional views, respectively, of a substrate in a third process.

Further, after the resist patterns 22 and 23 are removed as shown in FIG. 42, a negative type resist is applied to the whole surface of the substrate and, through back-side exposure and development, a resist pattern 42 is produced as shown in FIG. 43. Subsequently, as shown in FIGS. 44 and 45A–45D, a resist pattern 25 is produced on an appropriate portion of the substrate. Uncovered portions of the aluminum pattern 13 are removed by etching, whereby a level 11a is uncovered, as shown in FIG. 46. The etching condition may be the same as of the procedure of FIGS. 39 and 40A–40D.

Then, as shown in FIGS. 47A–47D, the substrate 11 is etched by 183 nm while using the patterns 12, 24 and 25 as a mask, whereby a level 11d is accomplished. Although a similar procedure should be repeated four times to produce eight levels, description thereof will be omitted here.

Figure 51:
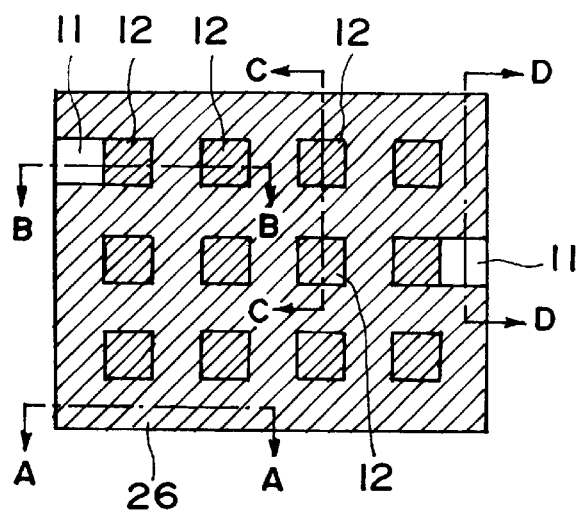
FIG. 51 is a plan view of a substrate in a third process.
Figure 52B:
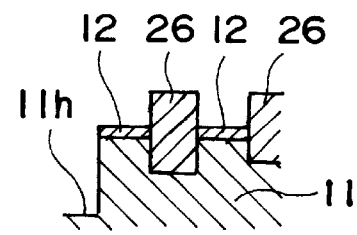
Figure 52C:
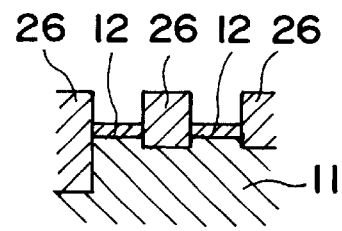
Figure 52D:
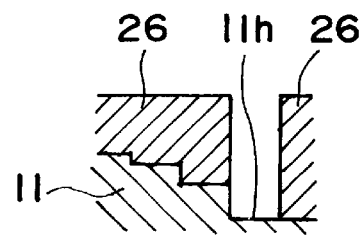
Figure 54A:
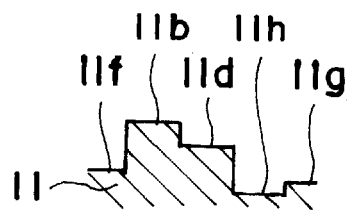
FIGS. 54A–54D are sectional views, respectively, of a substrate in a fourth process.
Figure 53:
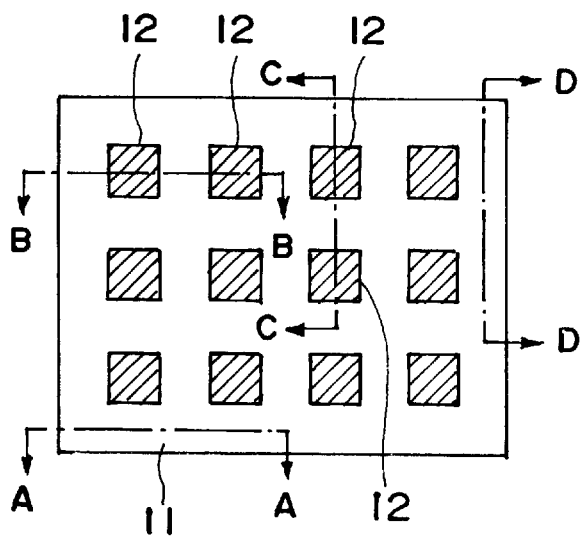
FIG. 53 is a plan view of a substrate in a fourth process.
Figure 54B:
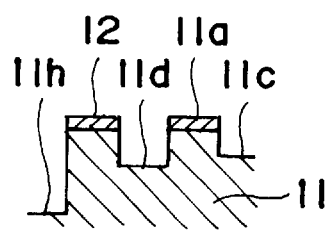
Figure 54C:
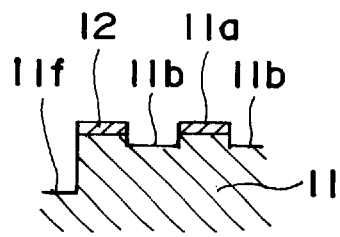
Figure 54D:
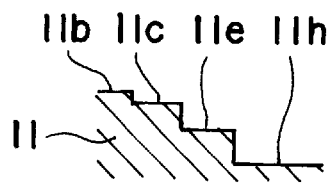
Figure 55A:
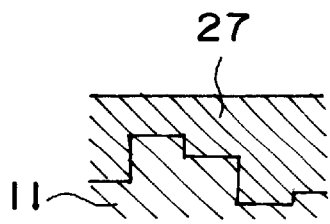
FIGS. 55A–55D are sectional views, respectively, of a substrate in a fourth process.
Figure 55B:
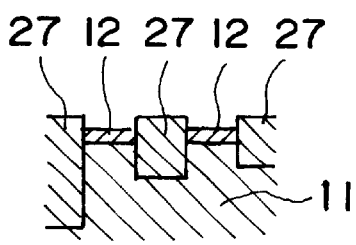
Figure 55C:
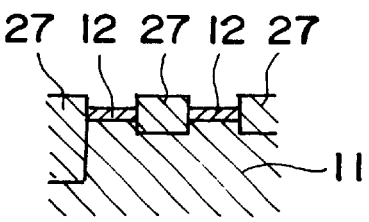
Figure 56:
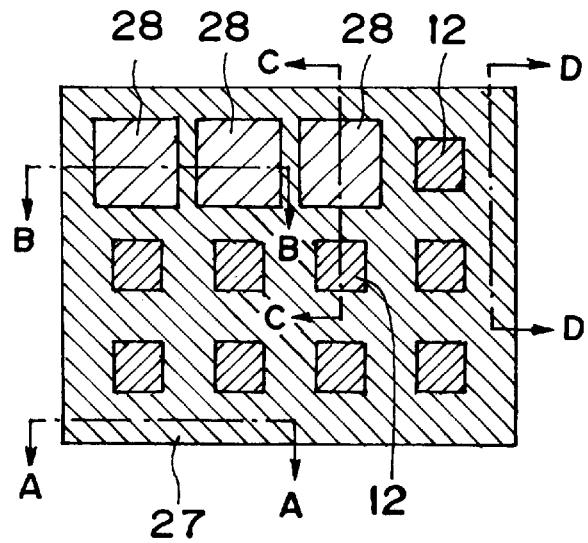
FIG. 56 is a plan view of a substrate in a fourth process.
Figure 55D:
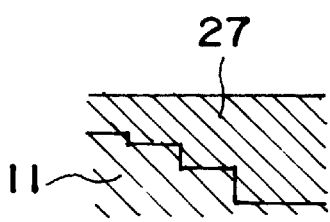
Figure 57A:
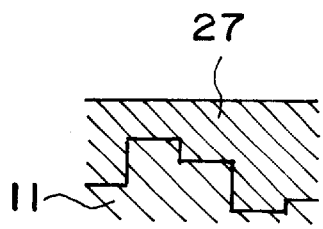
FIGS. 57A–57D are sectional views, respectively, of a substrate in a fourth process.
Figure 57B:
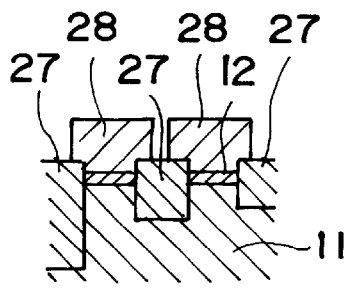
Figure 57C:
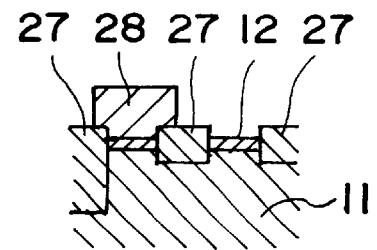
Figure 57D:
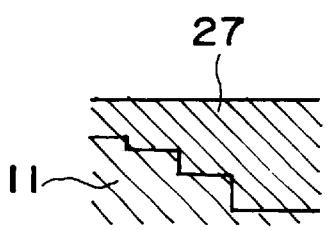

Then, the resist patterns 24 and 25 are removed as shown in FIG. 48. Thereafter, a negative type resist is applied to the whole surface of the substrate and, through back-side exposure and development, a resist pattern 26 is produced as shown in FIGS. 49 and 50A–50D. Subsequently, uncovered portions of the aluminum pattern 13 are removed by etching, as shown in FIG. 51, whereby a level 11a is uncovered. The etching condition may be the same as of FIGS. 39 and 40A–40D. Then, as shown in FIGS. 52A–52D, the substrate 11 is etched by 427 nm while using the patterns 12 and 26 as a mask, whereby a level 11h is accomplished.

Figure 58:
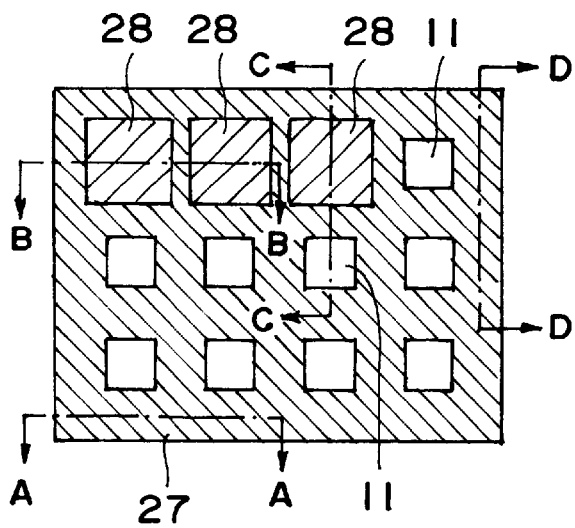
FIG. 58 is a plan view of a substrate in a fourth process.
Figure 59A:
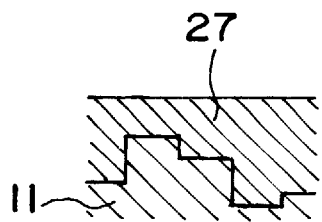
FIGS. 59A–59D are sectional views, respectively, of a substrate in a fourth process.
Figure 59B:
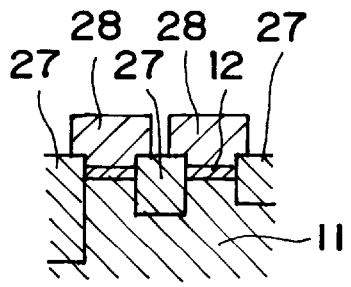
Figure 59C:
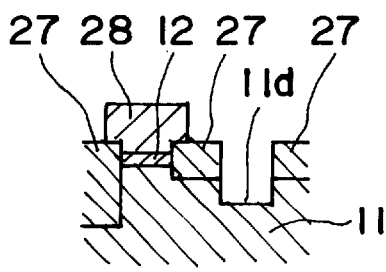
Figure 60:
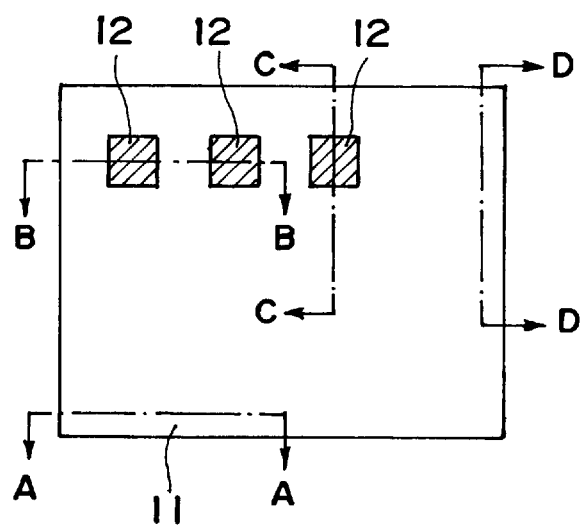
FIG. 60 is a plan view of a substrate in a fourth process.
Figure 59D:
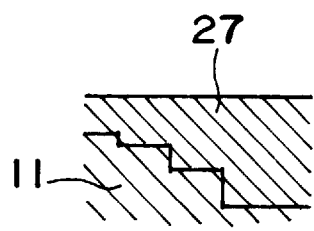
Figure 61A:
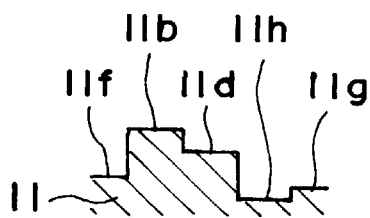
FIGS. 61A–61D are sectional views, respectively, of a substrate in a fourth process.
Figure 61B:
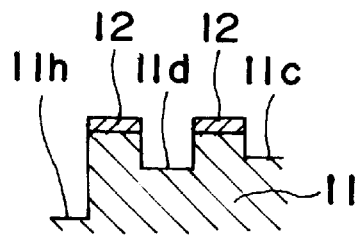
Figure 61C:
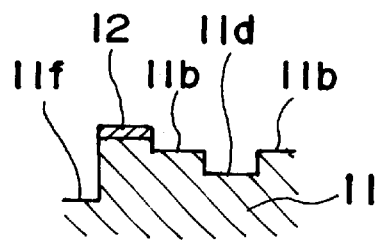
Figure 62:
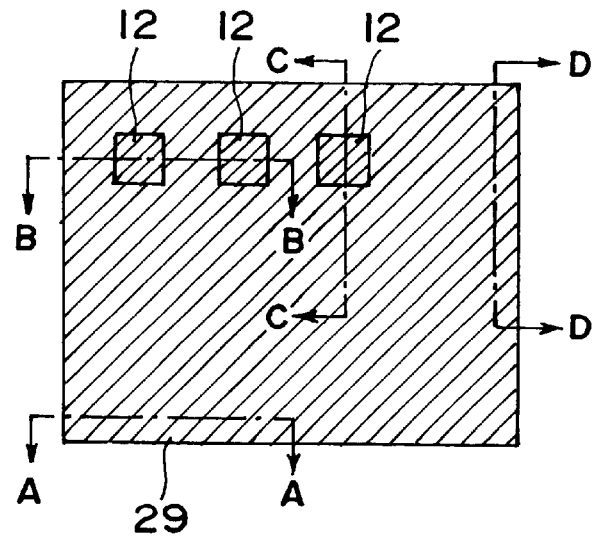
FIG. 62 is a plan view of a substrate in a fourth process.
Figure 61D:
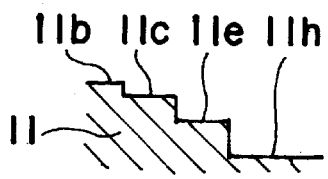
Figure 63A:
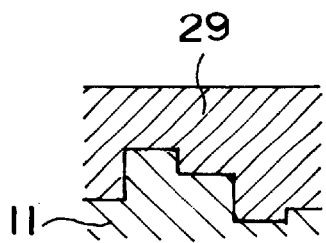
FIGS. 63A–63D are sectional views, respectively, of a substrate in a fourth process.
Figure 63B:
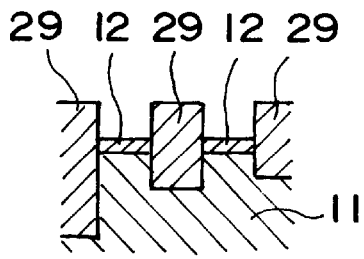
Figure 63C:
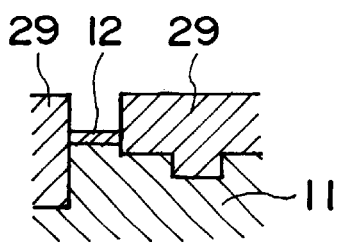
Figure 63D:
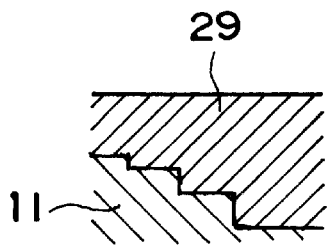
Figure 64:
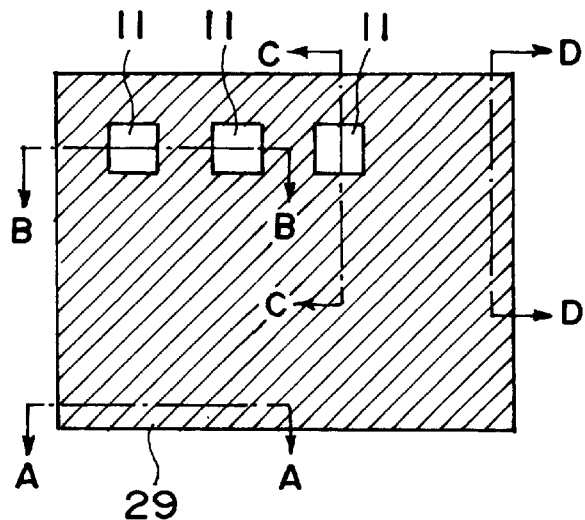
FIG. 64 is a plan view of a substrate in a fourth process.
Figure 65A:
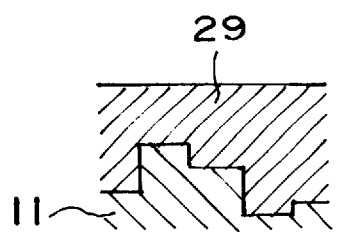
FIGS. 65A–65D are sectional views, respectively, of a substrate in a fourth process.
Figure 66A:
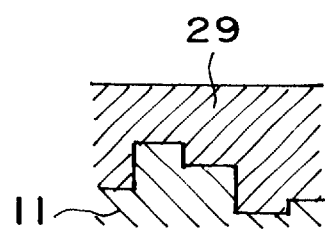
FIGS. 66A–66D are sectional views, respectively, of a substrate in a fourth process.
Figure 65B:
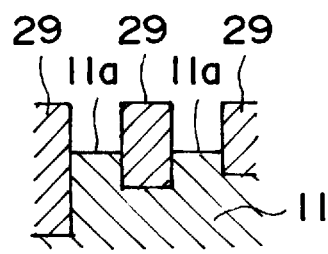
Figure 66B:
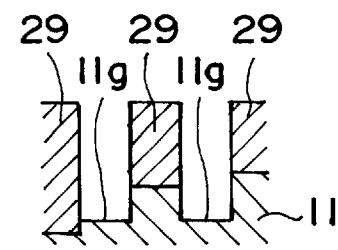
Figure 65C:
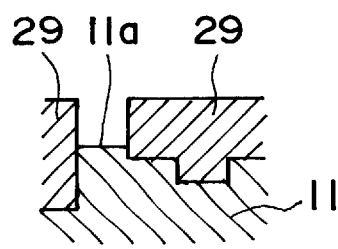
Figure 66C:
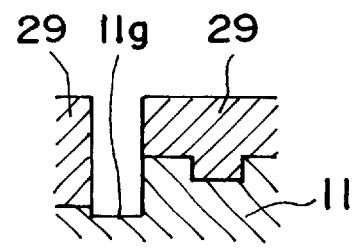
Figure 65D:
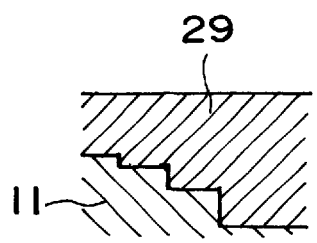
Figure 66D:
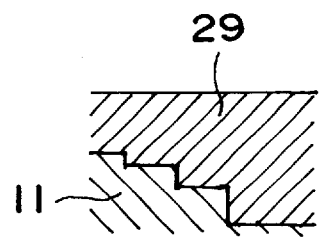

In the fourth process, the resist pattern 26 is removed as shown in FIGS. 53 and 54A–54D. Thereafter, a negative type resist is applied to the whole surface and, through back-side exposure and development, a resist pattern 27 is produced, as shown in FIGS. 55A–55D. Subsequently, as shown in FIGS. 56 and 57A–57D, an appropriate portion of the chromium pattern 12 is covered by a resist pattern 28. Thereafter, uncovered portions of the chromium pattern 12 are removed by etching, as shown in FIG. 58, whereby a level 11a is uncovered. Here, the etching condition may be the same as the procedure of FIGS. 17 and 18A–18D. Then, as shown in FIGS. 59A–59D, the substrate 11 is etched by 183 nm, while using the patterns 27 and 28 as a mask, whereby a level 11d is defined. Although a similar procedure should be repeated five times to produce eight levels 11a–11h, description thereof will be omitted here.

Subsequently, after the patterns 27 and 28 are removed as shown in FIGS. 60 and 61A–61D, a negative type resist is applied to the whole surface of the substrate as shown in FIGS. 62 and 63A–63D and, through back-side exposure and development, a resist pattern 29 is produced. Thereafter, as shown in FIGS. 64 and 65A–65D, uncovered portions of the chromium pattern 12 are removed by etching, whereby a level 11a is uncovered. The etching condition may be the same as of the procedure of FIG. 58. Then, as shown in FIGS. 66A–66D, the substrate 11 is etched by 366 nm while using the resist pattern 29 as a mask, whereby a level 11g is accomplished. Finally, the resist pattern 29 is removed as shown in FIGS. 67 and 68A–68D, by which a phase type CGH having desired eight levels 11a–11h (levels 11a and 11c are not illustrated) is accomplished.

In the first embodiment, as described above, all the levels 11a–11h can be defined in accordance with the chromium pattern 12, the aluminum pattern 13 and the resist patterns 14–19 formed on the substrate 11. Therefore, no alignment error occurs and, thus, the levels can be formed very exactly. Further, there is no necessity of forming a resist pattern by use of a reticle of an exposure apparatus, as in conventional methods. As a result, even if a segment of the reticle has a rectangular shape, there is no possibility that a segment corner of a resist pattern is rounded. Thus, accurate levels can be accomplished.

FIG. 69 to FIGS. 91A–91D are schematic views, respectively, for explaining a method of producing a phase type CGH in accordance with a second embodiment of the present invention. In this embodiment, the first and second processes are similar to those of the first embodiment.

In the third process, an aluminum pattern 13 which is in the state shown in FIGS. 33 and 34A–34D of the first embodiment, is polished, by which the surface of a chromium pattern 12 is uncovered as shown in FIGS. 69 and 70A–70D. The polishing step may use a lap machine. An abrasive may be cerium oxide of a particle diameter $5/100$ micron, and an abrasive cloth may be an urethane sheet. The polishing condition may be 30 rpm and 50 g/cm$^2$.

Subsequently, a negative type resist is applied to the whole surface and, through back-side exposure and development, a resist pattern 31 is produced, as shown in FIGS. 71 and 72A–72D. Thereafter, as shown in FIGS. 73 and 74A–74D, a resist pattern 32 is produced on an appropriate portion, and uncovered portions of the aluminum pattern 13 are removed by etching, as shown in FIGS. 75 and 76A–76D, whereby a level 11a is uncovered. Here, the etching condition may be the same as the procedure of FIGS. 39 and 40A–40D of the first embodiment. Then, as shown in FIGS. 77A–77D, the substrate 11 is etched by 183 nm, while using the patterns 12, 31 and 32 as a mask, whereby a level 11d is defined.

Further, after the resist patterns 31 and 32 are removed, a negative type resist is applied to the whole surface of the substrate and, through back-side exposure and development, a resist pattern 33 is produced as shown in FIGS. 78 and 79A–79D. Subsequently, a resist pattern 34 is produced on an appropriate portion of the substrate. Uncovered portions of the aluminum pattern 13 are removed by etching, as shown in FIGS. 80 and 81A–81D, whereby a level 11a is uncovered. The etching condition may be the same as of the procedure of FIGS. 75 and 76A–76D.

Then, as shown in FIGS. 82A–82D, the substrate 11 is etched by 183 nm while using the patterns 12, 33 and 34 as a mask, whereby a level 11d is accomplished. Although a similar procedure should be repeated four times to produce eight levels, description thereof will be omitted here.

Then, the resist patterns 33 and 34 are removed as shown in FIGS. 83 and 84A–84D. Thereafter, a negative type resist is applied to the whole surface of the substrate and, through back-side exposure and development, a resist pattern 35 is produced as shown in FIGS. 85 and 86A–86D. Subsequently, uncovered portions of the aluminum pattern 13 are removed by etching, as shown in FIGS. 87 and 88A–88D, whereby a level 11a is uncovered. The etching condition may be the same as of the procedure of FIGS. 75 and 76A–76D. Then, as shown in FIGS. 89A–89D, the substrate 11 is etched by 427 nm while using the patterns 12 and 35 as a mask, whereby a level 11h is accomplished. Finally, as shown in FIGS. 90 and 91A–91D, the pattern 35 is removed, and thus the third process is completed.

The fourth process is completely the same as the fourth process of the first embodiment. Substantially the same advantageous results as of the first embodiment can be provided with the second embodiment.

Figure 92:
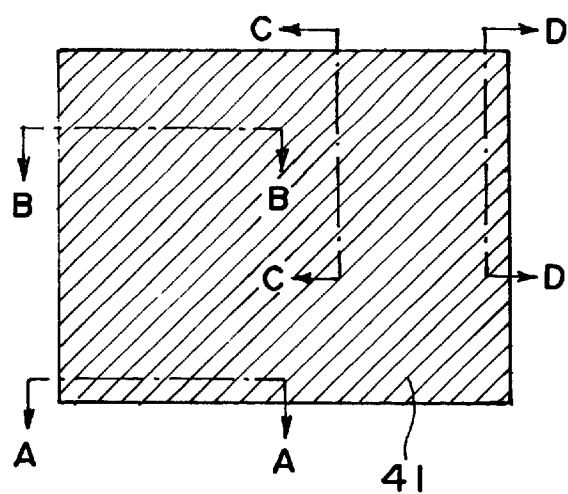
FIG. 92 is a plan view of a substrate in a second process, in a third embodiment of the present invention.
Figure 91D:
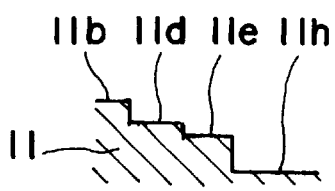
Figure 93A:
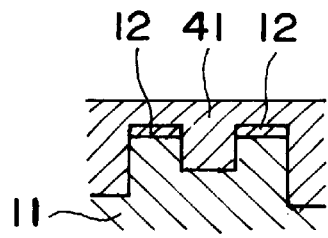
FIGS. 93A–93D are sectional views, respectively, of a substrate in a second process.
Figure 93B:
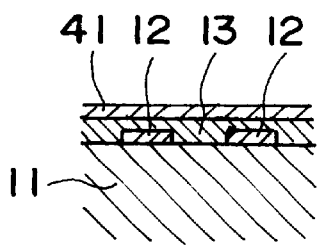
Figure 93C:
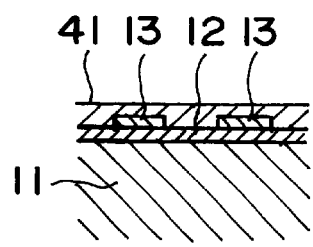
Figure 94:
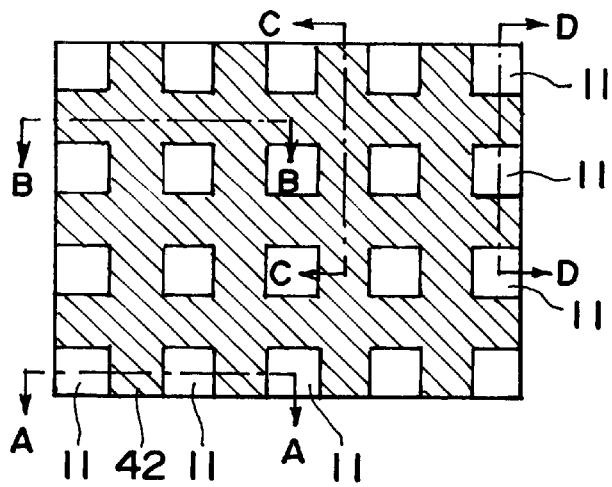
FIG. 94 is a plan view of a substrate in a second process.
Figure 93D:
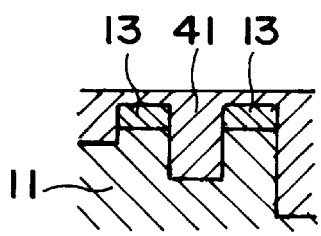
Figure 95A:
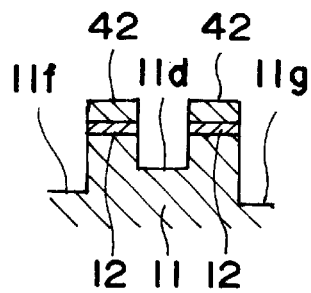
FIGS. 95A–95D are sectional views, respectively, of a substrate in a second process.
Figure 95B:
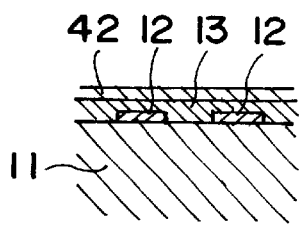
Figure 95C:
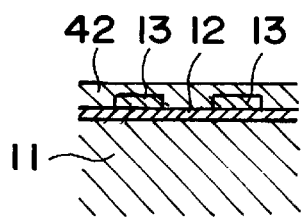
Figure 96:
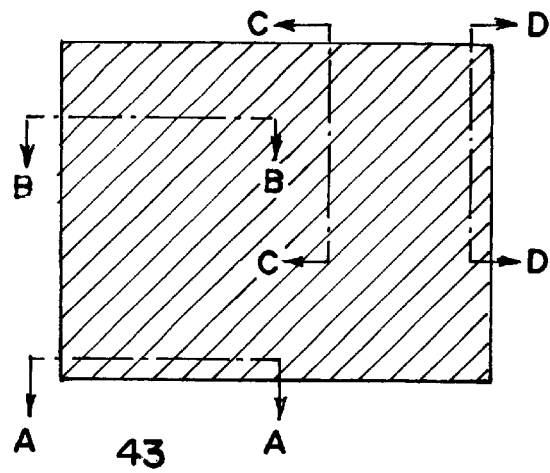
FIG. 96 is a plan view of a substrate in a second process.
Figure 95D:
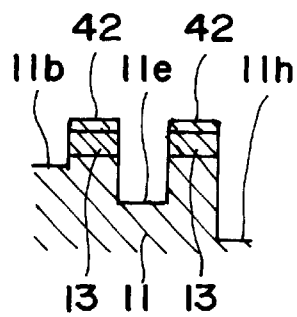
Figure 97A:
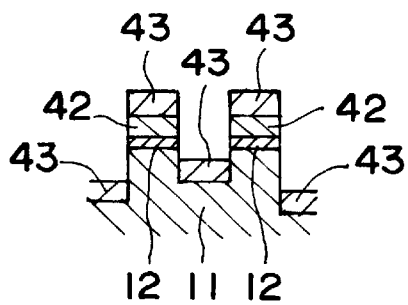
FIGS. 97A–97D are sectional views, respectively, of a substrate in a second process.
Figure 97B:
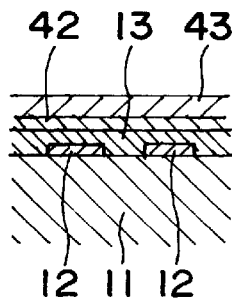
Figure 97C:
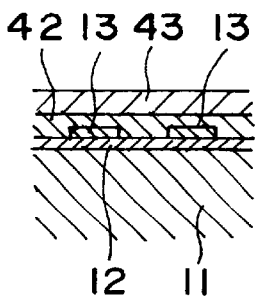
Figure 98:
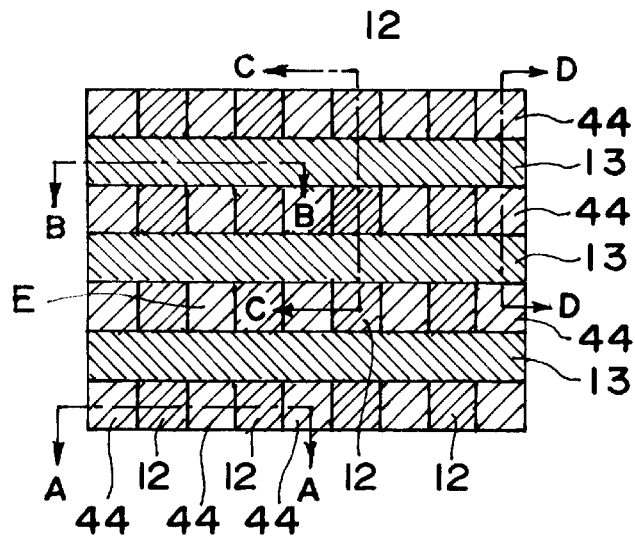
FIG. 98 is a plan view of a substrate in a second process.
Figure 97D:
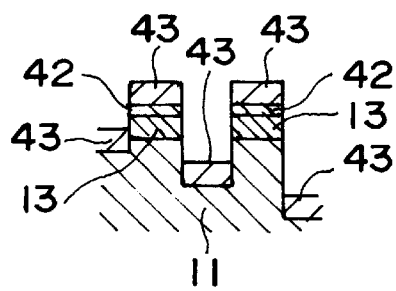
Figure 99A:
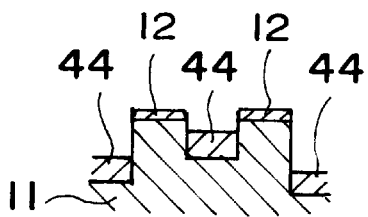
FIGS. 99A–99D are sectional views, respectively, of a substrate in a second process.
Figure 99B:
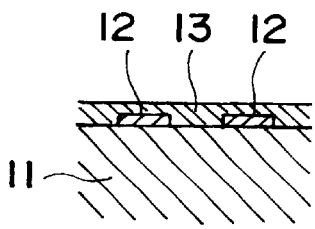
Figure 99C:
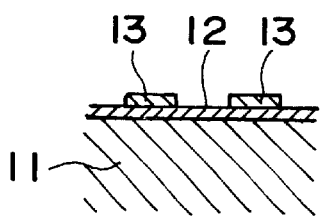
Figure 99D:
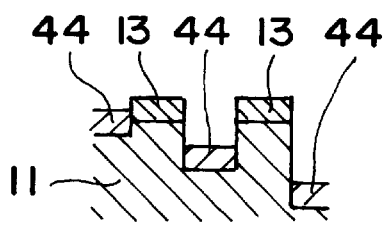
Figure 100:
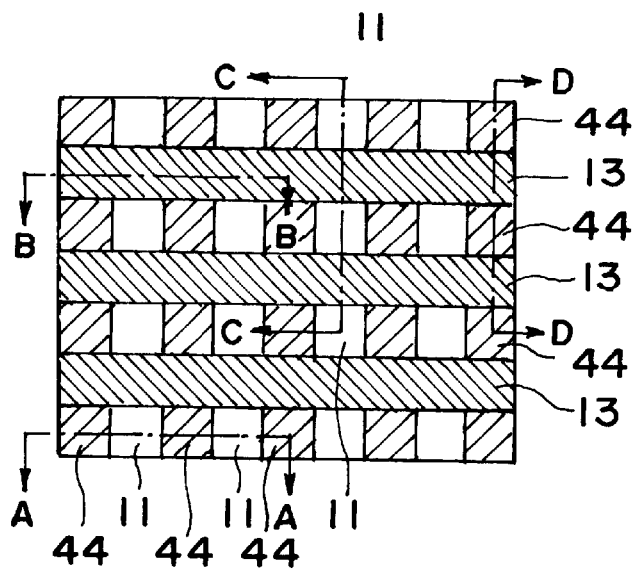
FIG. 100 is a plan view of a substrate in a second process.
Figure 101A:
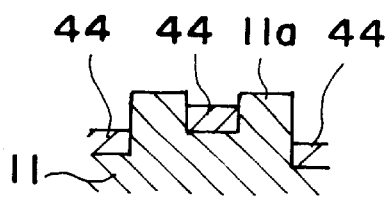
FIGS. 101A–101D are sectional views, respectively, of a substrate in a second process.
Figure 101B:
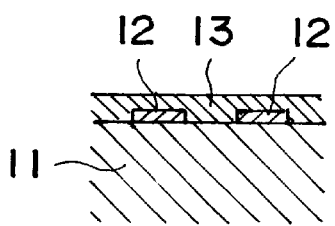
Figure 101C:
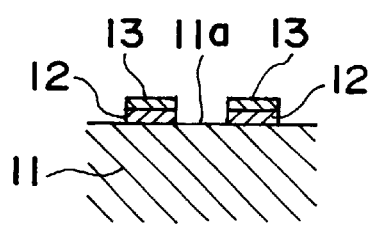
Figure 101D:
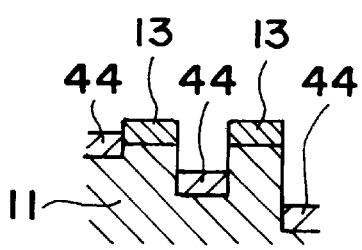
Figure 102:
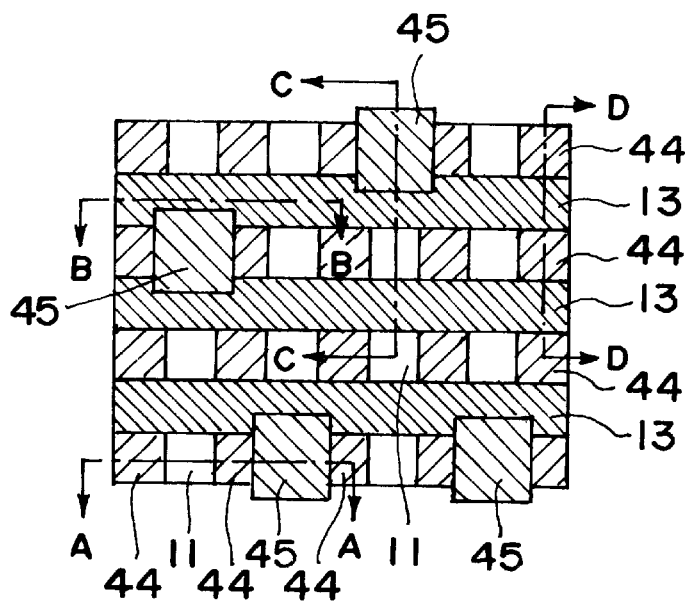
FIG. 102 is a plan view of a substrate in a second process.
Figure 103A:
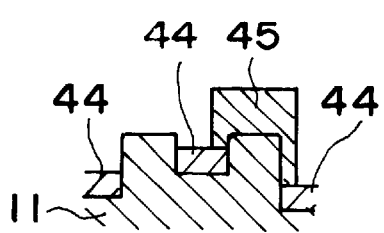
FIGS. 103A–103D are sectional views, respectively, of a substrate in a second process.
Figure 104A:
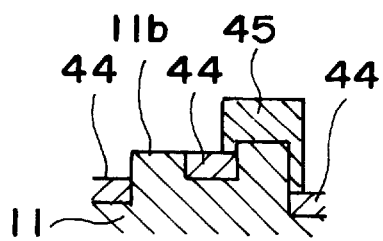
FIGS. 104A–104D are sectional views, respectively, of a substrate in a second process.
Figure 103B:
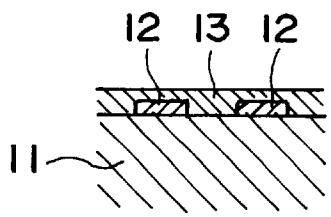
Figure 104B:
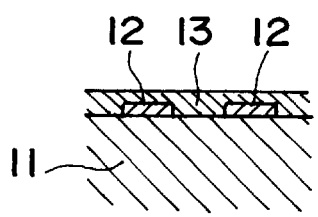
Figure 103C:
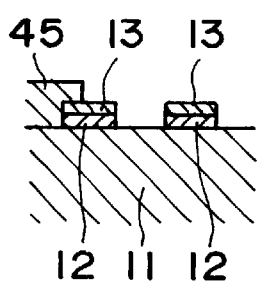
Figure 104C:
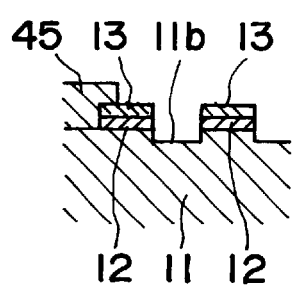
Figure 103D:
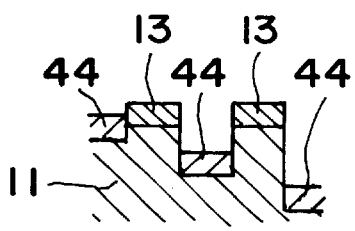
Figure 104D:
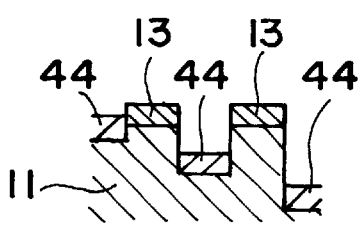
Figure 106A:
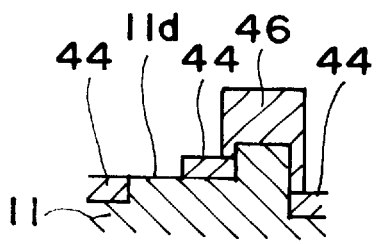
FIGS. 106A–106D are sectional views, respectively, of a substrate in a second process.
Figure 105:
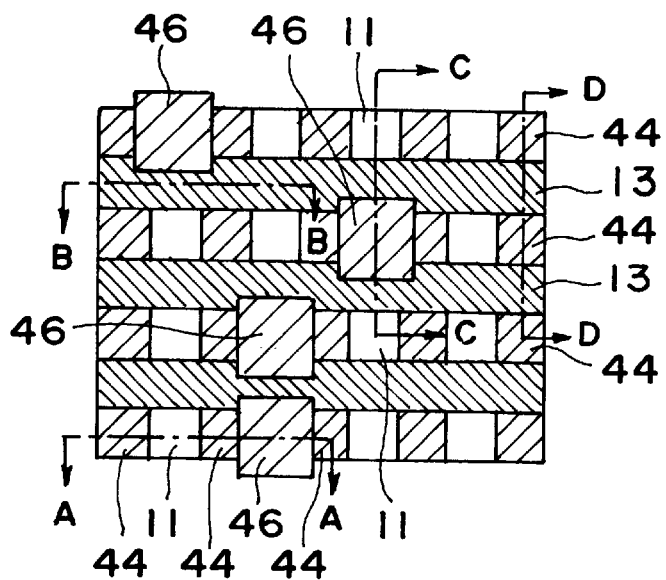
FIG. 105 is a plan view of a substrate in a second process.
Figure 106B:
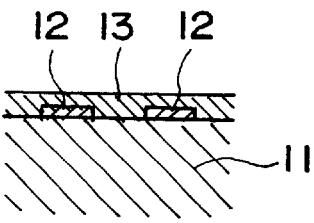
Figure 106C:
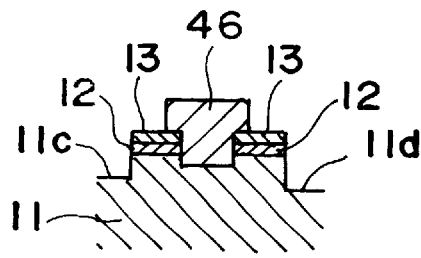
Figure 106D:
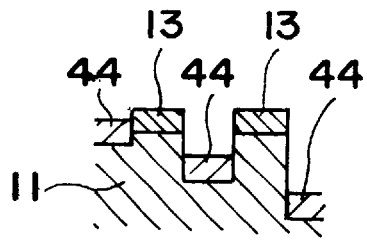
Figure 108A:
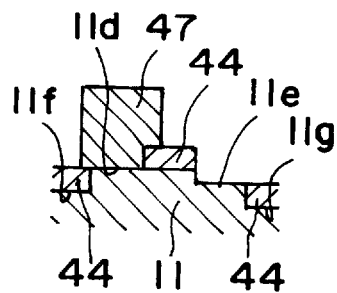
FIGS. 108A–108D are sectional views, respectively, of a substrate in a second process.
Figure 107:
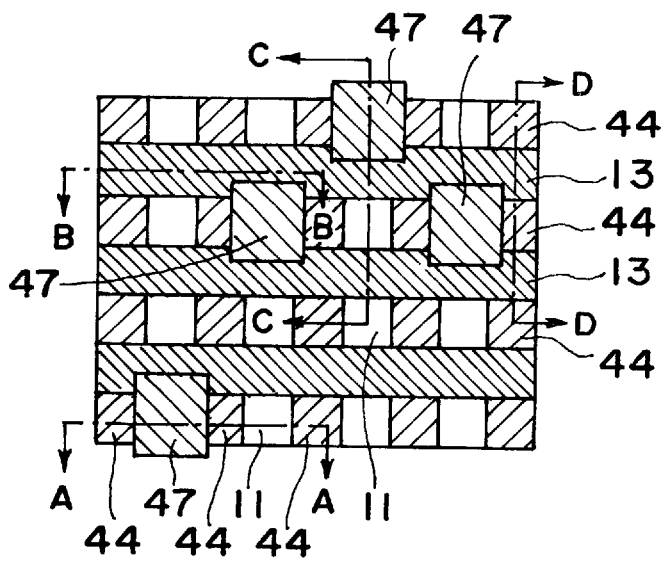
FIG. 107 is a plan view of a substrate in a second process.
Figure 108B:
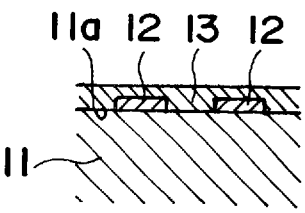
Figure 108C:
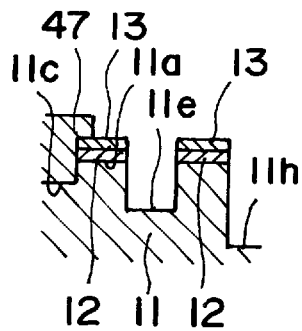
Figure 108D:
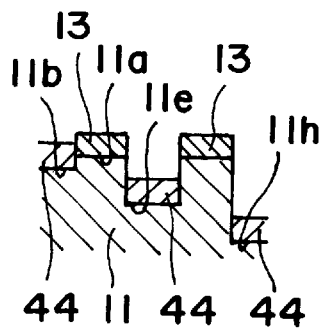
Figure 110A:
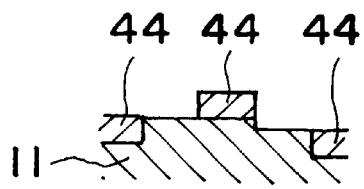
FIGS. 110A–110D are sectional views, respectively, of a substrate in a third process.
Figure 109:
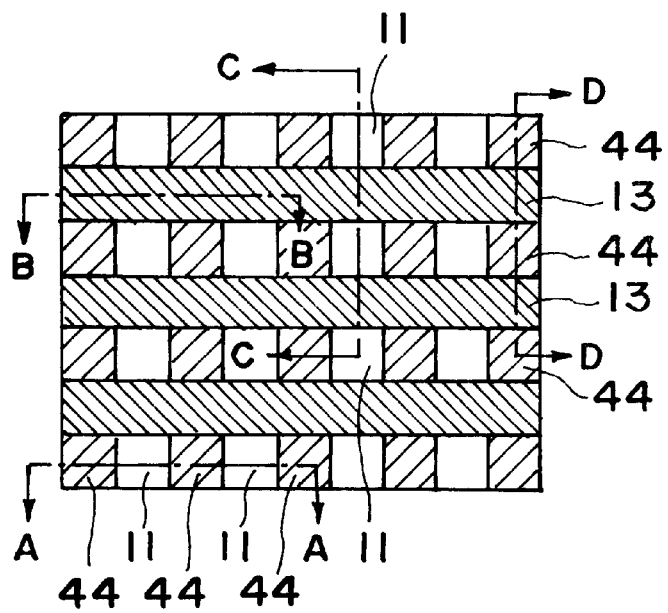
FIG. 109 is a plan view of a substrate in a third process.
Figure 110B:
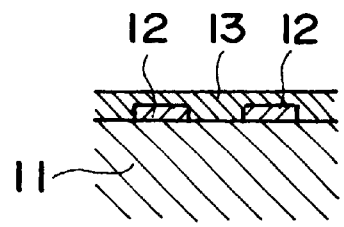
Figure 110C:
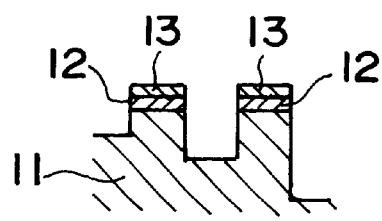
Figure 110D:
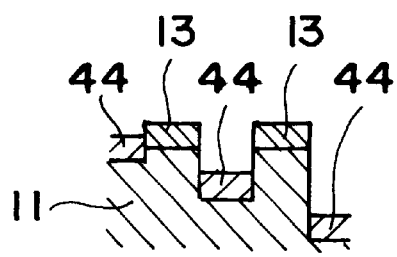
Figure 112A:
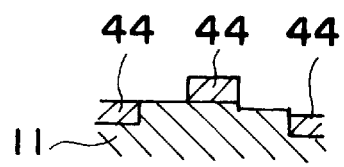
FIGS. 112A–112D are sectional views, respectively, of a substrate in a third process.
Figure 111:
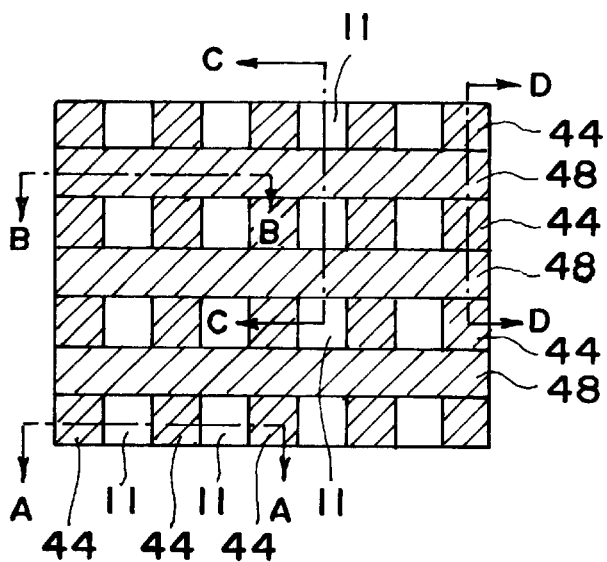
FIG. 111 is a plan view of a substrate in a third process.
Figure 112B:
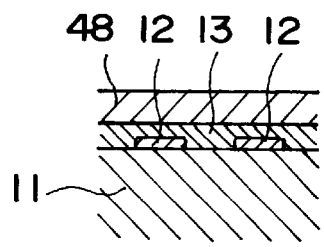
Figure 112C:
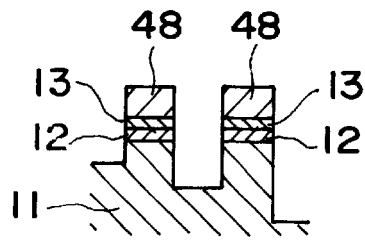
Figure 112D:
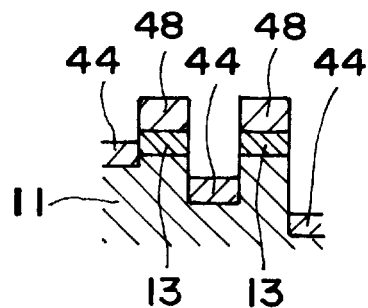
Figure 114A:
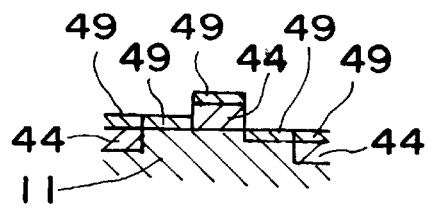
FIGS. 114A–114D are sectional views, respectively, of a substrate in a third process.
Figure 113:
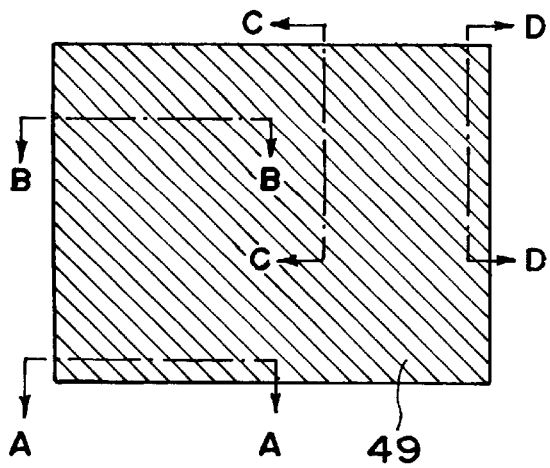
FIG. 113 is a plan view of a substrate in a third process.
Figure 114B:
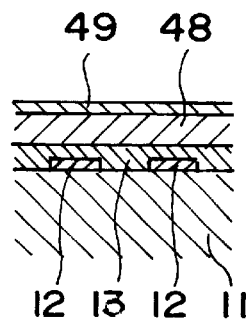
Figure 114C:
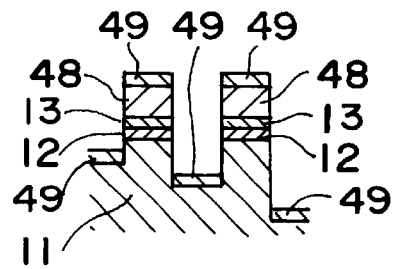
Figure 114D:
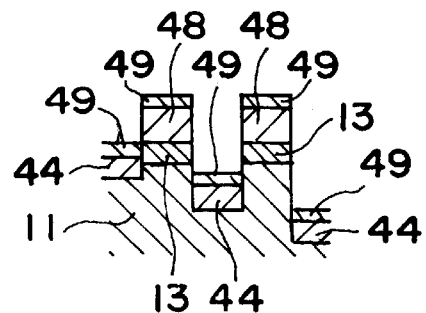
Figure 116A:
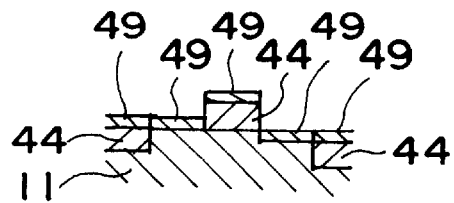
FIGS. 116A–116D are sectional views, respectively, of a substrate in a third process.
Figure 115:
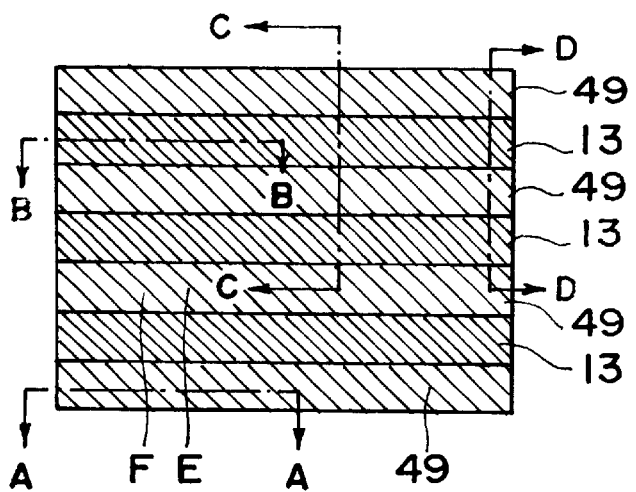
FIG. 115 is a plan view of a substrate in a third process.
Figure 116B:
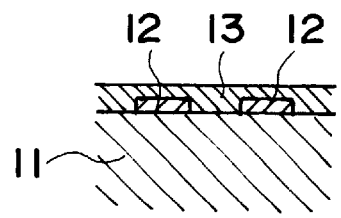
Figure 116C:
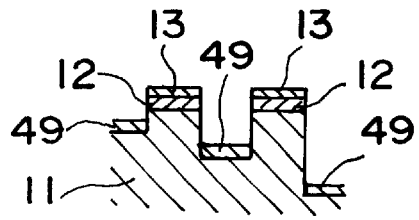
Figure 116D:
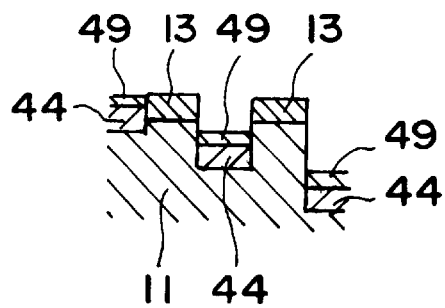
Figure 118A:
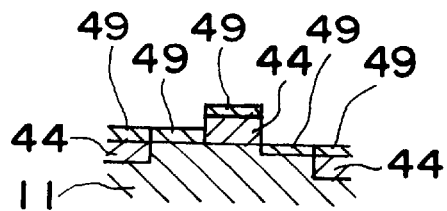
FIGS. 118A–118D are sectional views, respectively, of a substrate in a third process.
Figure 117:
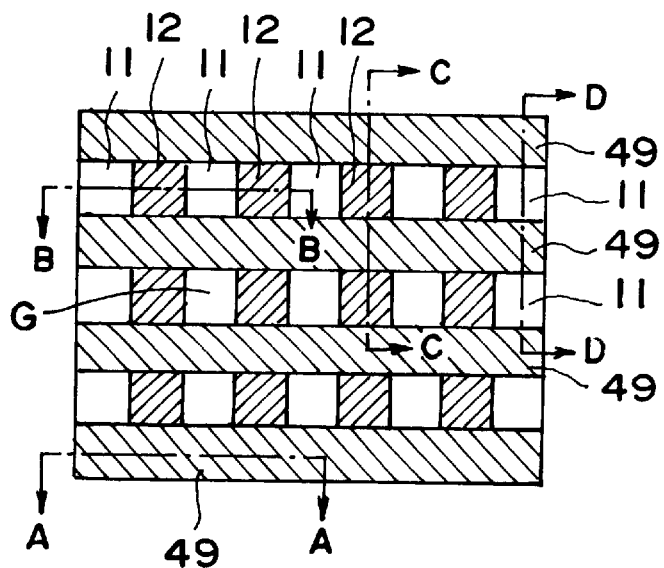
FIG. 117 is a plan view of a substrate in a third process.
Figure 118B:
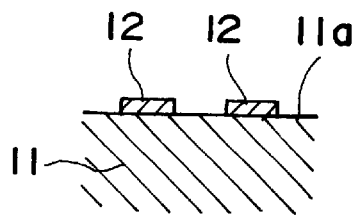
Figure 118C:
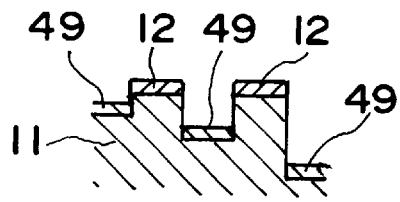
Figure 118D:
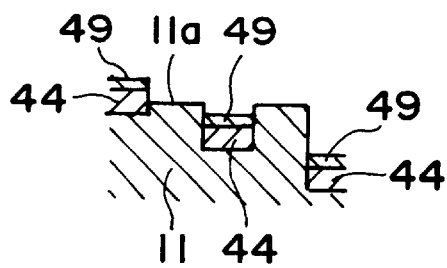
Figure 120A:
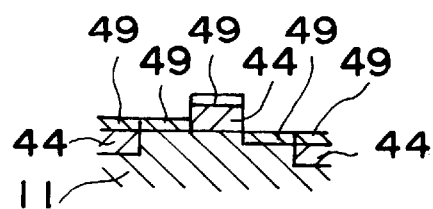
Figure 119:
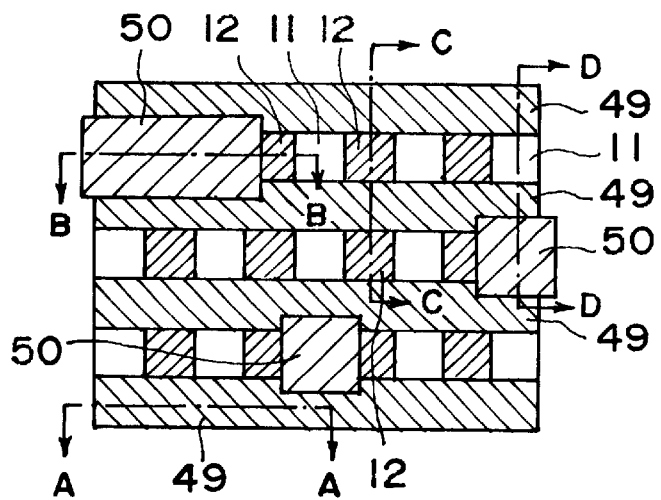
FIG. 119 is a plan view of a substrate in a third process.
Figure 120B:
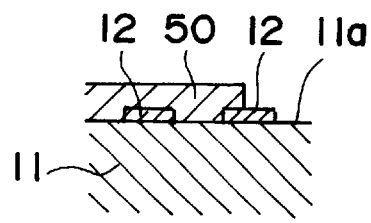
Figure 120C:
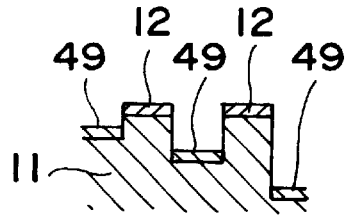
Figure 120D:
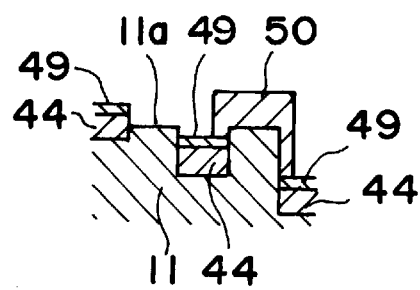
Figure 121A:
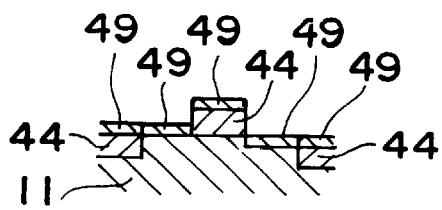
Figure 121B:
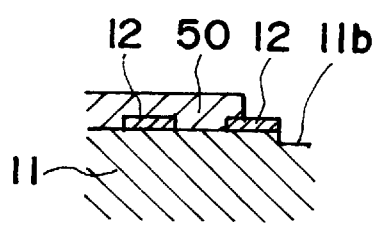
Figure 121C:
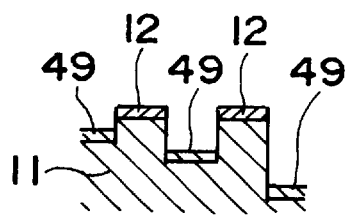
Figure 122:
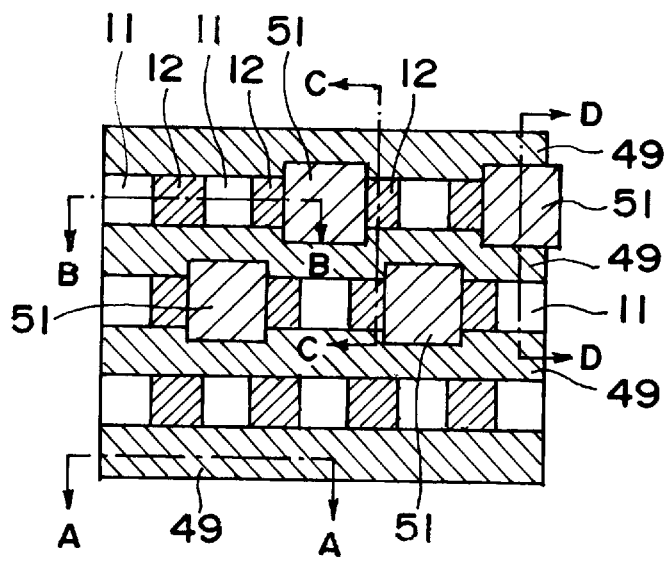
Figure 121D:
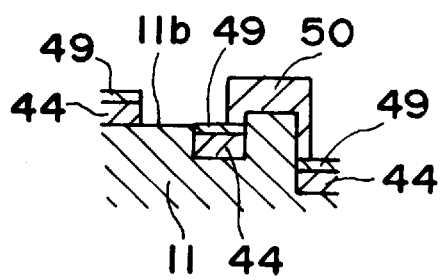
Figure 123A:
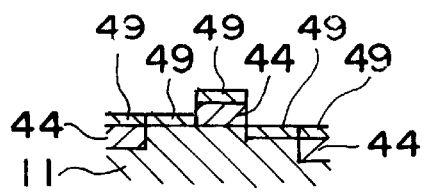
Figure 124A:
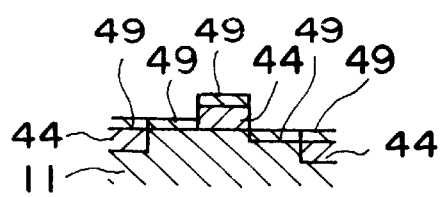
Figure 123B:
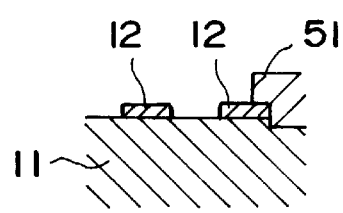
Figure 124B:
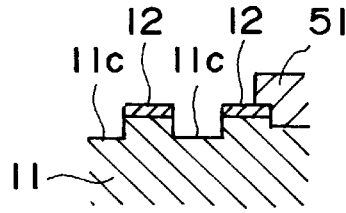
Figure 123C:
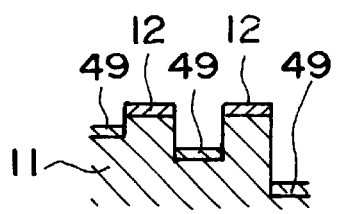
Figure 124C:
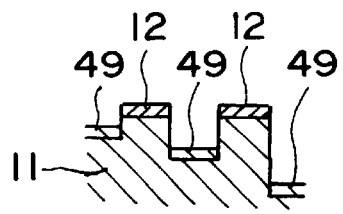
Figure 123D:
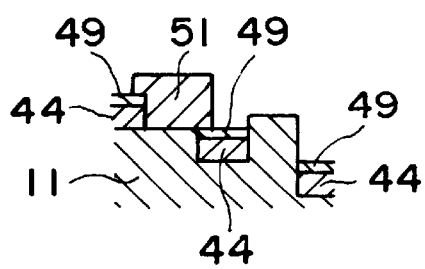
Figure 124D:
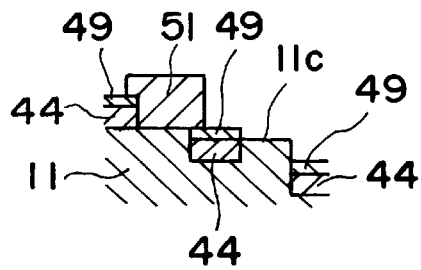
Figure 126A:
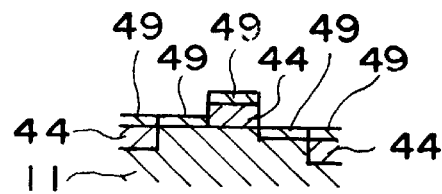
Figure 125:
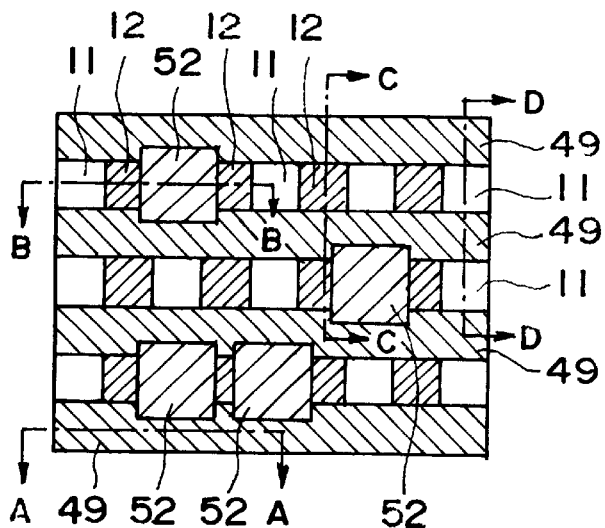
Figure 126B:
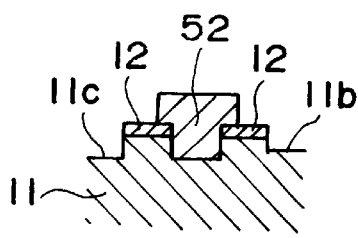
Figure 126C:
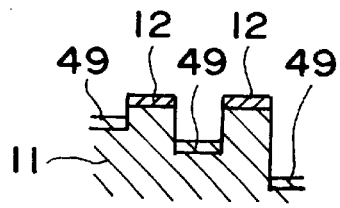
Figure 126D:
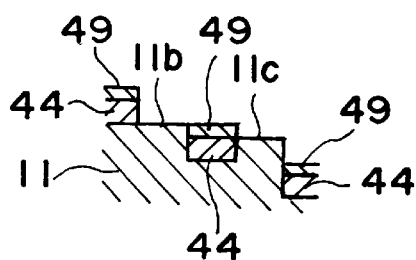
Figure 127A:
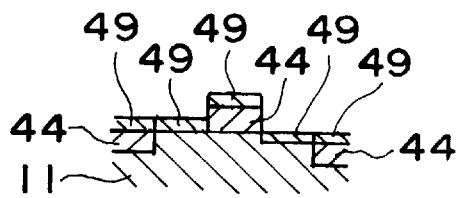
Figure 127B:
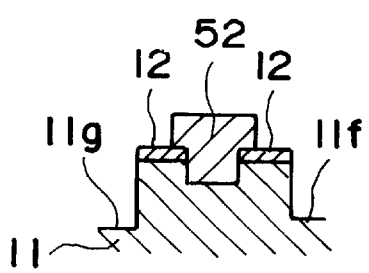
Figure 128:
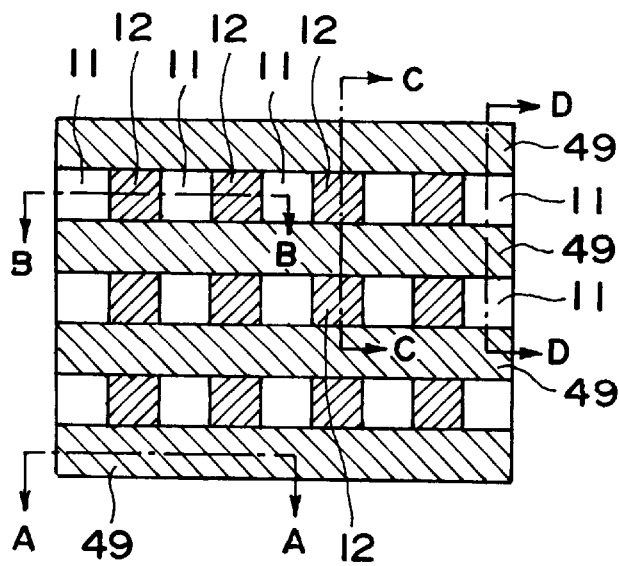
Figure 127C:
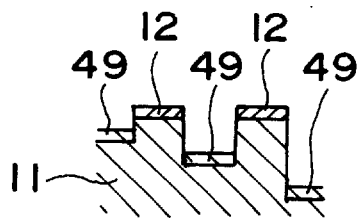
Figure 127D:
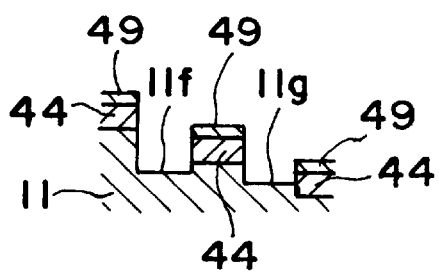
Figure 129A:
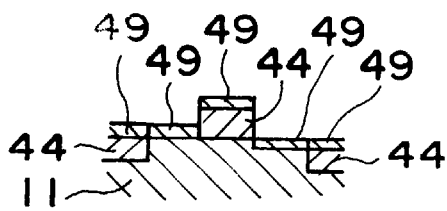
Figure 129B:
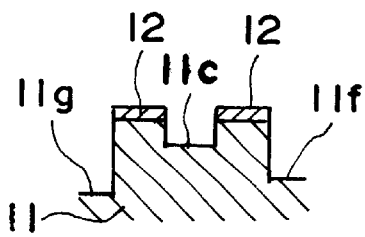
Figure 129C:
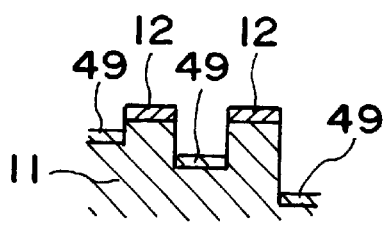
Figure 130:
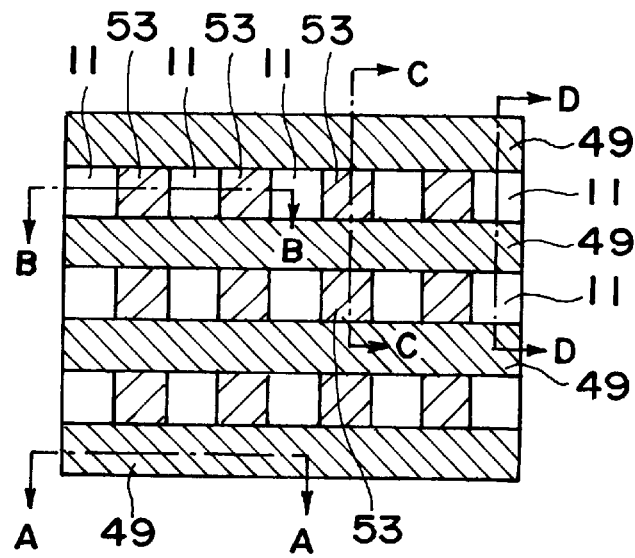
Figure 129D:
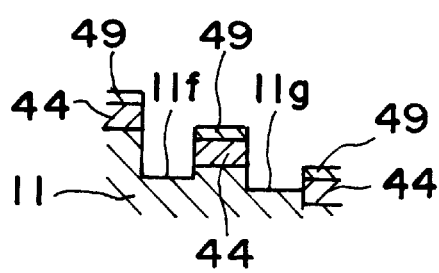
Figure 131A:
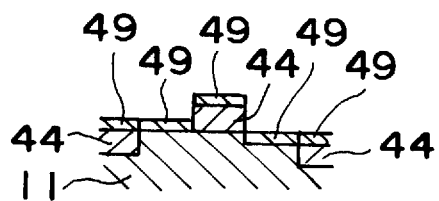
Figure 131B:
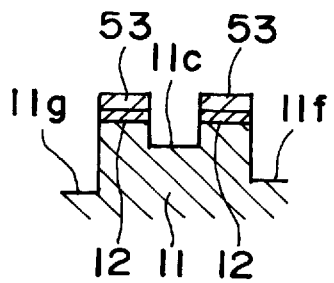

FIGS. 92–147 are schematic views, respectively, for explaining a method of producing a phase type CGH in accordance with a third embodiment of the present invention. The first process is similar to that of the first embodiment.

In the second process, a resist pattern 16 which is in the state as shown in FIGS. 10 and 12A–12D of the first embodiment, is removed. Then, as shown in FIGS. 92 and 93A–93D, a positive type resist 41 is applied to the whole surface of the substrate and, through back-side exposure and development, a positive resist pattern 42 (FIGS. 94 and 95A–95D) is produced only in the portions where the chromium pattern 12 and the aluminum pattern 13 are present, since the chromium pattern 12 and the aluminum pattern 13 function as a contact mask. Then, as shown in FIGS. 96 and 97A–97D, an alumina film 43 is formed on the whole surface of the substrate, in accordance with a deposition process or a sputtering process. Then, the positive resist pattern 42 as well as the alumina film 43 provided on the positive resist pattern 42 are removed by a lift-off process, whereby an alumina film pattern 44 is produced only on the substrate 11, as shown in FIGS. 98 and 99A–99D. Thus, the alumina film pattern 44 can be formed only in the regions E.

Then, uncovered portions of the chromium pattern 12 are removed by a wet etching process or a RIE process, as shown in FIGS. 100 and 101A–101D. The etching process may use a mixture solution of cerium ammonium nitrate, perchloric acid and water, for example. Since excessive over-etching produces a large undercut, the over-etching should be kept to a minimum, e.g., about 5%. Also, where the RIE process is used, a condition that the selection ratio of aluminum to alumina is not less than 3, for example, may preferably be used.

Thereafter, as shown in FIGS. 102 and 103A–103D, a photoresist pattern 45 is produced on an appropriate portion. Subsequently, the substrate is etched by 61 nm, while using the photoresist pattern 45, the alumina film 43 and the aluminum pattern 13 as a mask. The etching step may be performed in accordance with the RIE process, for example, by using a mixture gas of $CF_4$ and hydrogen, for example, and at a pressure of 4 Pa.

Then, as shown in FIGS. 105 and 106A–106D, the photoresist pattern 45 is removed and, subsequently, a photoresist pattern 46 is produced on an appropriate portion. Subsequently, the substrate 11 is etched by 122 nm, while using the photoresist pattern 46, the alumina film 43 and the aluminum pattern 13 as a mask. The etching condition may be the same as of the procedure of FIGS. 102 and 103A–103D.

Subsequently, the photoresist pattern 46 is removed as shown in FIGS. 107 and 108A–108D, and then a photoresist pattern 47 is produced on an appropriate portion of the substrate. Then, the substrate 11 is etched by 244 nm, while using the photoresist pattern 47, the alumina film 43 and the aluminum pattern 13 as a mask. Here, the etching condition may be the same as the process of FIGS. 102 and 103A–103D. By the procedure described above, eight levels 11a–11h are defined.

In the third process, the photoresist pattern 47 is removed as shown in FIGS. 109 and 110A–110D. Thereafter, a positive type resist is applied to the whole surface, as shown in FIGS. 111 and 112A–112D, and an exposure step from the back side and a development step are performed. Here, if exposure light of i-line is used in this step, for example, since the aluminum pattern 13 does not pass the exposure light, a resist pattern 48 is formed only upon the aluminum pattern 13.

Subsequently, as shown in FIGS. 113 and 114A–114D, an alumina film 49 is produced in accordance with a deposition process or a sputtering process. Then, the resist pattern 48 as well as the alumina film 49 provided on the resist pattern 48 are removed by a deposition process or a lift-off process, as shown in FIGS. 115 and 116A–116D. With this procedure, the alumina film 49 can be provided only in the regions E and F.

Then, the aluminum pattern 13 is removed by wet etching, as shown in FIGS. 117 and 118A–118D. Here, the etching process may use a mixture solution of phosphoric acid, nitric acid, acetic acid and water, for example. With the above procedure, only the regions G of the substrate 11 are uncovered.

Thereafter, as shown in FIGS. 119 and 120A–120D, a resist pattern 50 is produced on an appropriate portion.

Subsequently, as shown in FIGS. 121A–121D, the substrate 11 is etched by 61 nm, while using the resist pattern 50, the chromium pattern 12 and the aluminum pattern 13 as a mask.

Then, as shown in FIGS. 122 and 123A–123D, the resist pattern 50 is removed and, subsequently, a resist pattern 51 is produced on an appropriate portion. Subsequently, as shown in FIGS. 124A–124D, the substrate 11 is etched by 122 nm, while using the resist pattern 51, the chromium pattern 12 and the aluminum pattern 13 as a mask.

Subsequently, the resist pattern 51 is removed as shown in FIGS. 125 and 126A–126D, and then a resist pattern 52 is produced on an appropriate portion of the substrate. Then, as shown in FIGS. 127A–127D, the substrate 11 is etched by 244 nm, while using the resist pattern 52, the chromium pattern 12 and the aluminum pattern 13 as a mask, whereby eight levels 11a–11h are accomplished.

In the fourth process, the resist pattern 52 is removed as shown in FIGS. 128 and 129A–129D. Thereafter, a positive type resist is applied to the whole surface, and a back-side exposure step and a development step are carried out. By this procedure, a resist pattern 53 can be produced only on the chromium pattern 12, as shown in FIGS. 130 and 131A–131D. Subsequently, as shown in FIGS. 132 and 133A–133D, an alumina film 54 is produced in accordance with a deposition process or a sputtering process. Also, the resist pattern 53 as well as the alumina film 54 provided on the resist pattern 53 are removed by a lift-off process, as shown in FIGS. 134 and 135A–135D.

Thereafter, the chromium pattern 12 is removed by wet etching, as shown in FIGS. 136 and 137A–137D, such that only the regions F are uncovered upon the substrate 11. The etching process may use a mixture solution of perchloric acid, cerium ammonium nitrate and water, for example. Subsequently, as shown in FIGS. 138 and 139A–139D, a resist pattern 55 is produced on an appropriate portion of the substrate. Then, as shown in FIGS. 140A–140D, the substrate 11 is etched by 61 nm, while using the resist pattern 55 and the alumina film 54 as a mask. Subsequently, the resist pattern 55 is removed as shown in FIGS. 141 and 142A–142D. After that, a resist pattern 56 is produced on an appropriate portion. Further, as shown in FIGS. 143A–143D, the substrate 11 is etched by 122 nm while using the resist pattern 56 and the alumina film 54 as a mask. Thereafter, the resist pattern 56 is removed as shown in FIGS. 144 and 145A–145D. Then, a resist pattern 57 is produced on an appropriate portion, and the substrate 11 is etched by 244 nm while using this resist pattern 57 and the alumina film 54 as a mask.

Finally, the resist pattern 57 is removed as shown in FIG. 147, and the alumina film 54 is removed by using phosphoric acid of 180° C., whereby a desired multiple-level CGH (with eight levels) such as shown in FIGS. 148 and 149A–149D, is accomplished.

FIGS. 150A–150D are schematic views, respectively, for explaining a molding process for producing a diffractive optical element, in accordance with a fourth embodiment of the present invention. In this embodiment, a diffractive optical element of synthetic resin, having a step-like shape, can be produced by a molding process, while using, as a mold, a CGH substrate which can be produced in a similar manner as one of the first, second and third embodiments of the present invention.

Figure 150A:
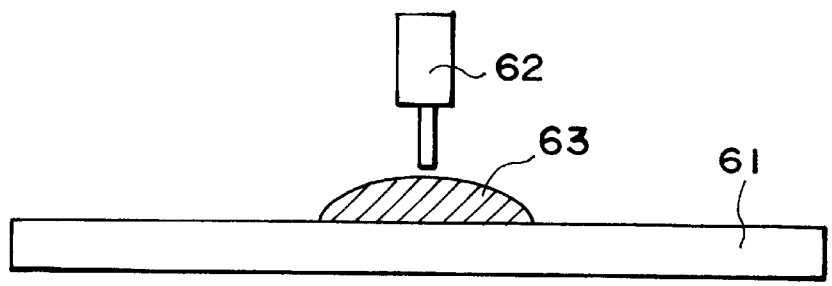
Figure 150B:
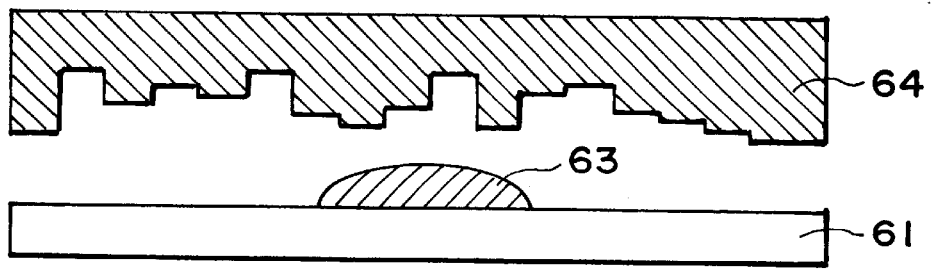
Figure 150C:
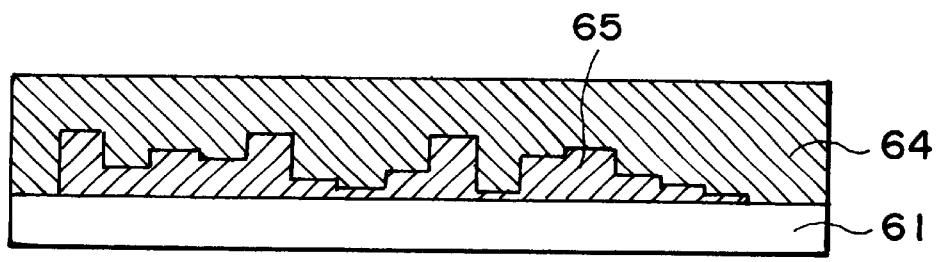
Figure 150D:
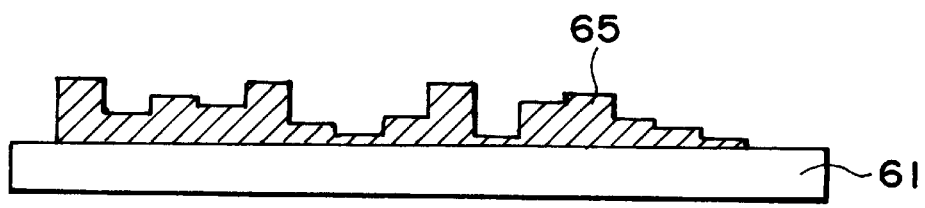

First, as shown in FIG. 150A, a synthetic resin 63 is dropped onto a glass substrate 61, from a cylinder 62. The synthetic resin 63 may be a reaction setting type resin, that is, an ultraviolet-ray setting type resin such as an acrylic series resin or epoxy series resin, for example, or it may be a thermo-setting type resin. Subsequently, as shown in FIG. 150B, a CGH substrate 64 having been produced in accordance with a procedure similar to that of the first, second or third embodiment, is pressed from the above, against the synthetic resin 63, as shown in FIG. 150C, by which a replica 65 of synthetic resin 63 is produced. Then, after the replica 65 is set, the CGH substrate 64 is removed from the replica 65 as shown in FIG. 150D. With this procedure, a diffractive optical element having a step-like shape is accomplished.

Prior to pressing the CGH substrate 64 against the synthetic resin 63, a mold releasing agent may be applied to the surface of the CGH substrate 64, if desired. Also, where an ultraviolet-ray setting resin is used, the replica 65 may be set by projecting ultraviolet rays thereto from the CGH substrate 64 side. Where a thermo-setting resin is used, the replica 65 may preferably be set by heating.

In the fourth embodiment described above, since the CGH substrate 64 is formed with precise levels in accordance with the procedure similar to the first, second or third embodiment, a diffractive optical element having precise levels can be produced by molding.

In the embodiments of the present invention described hereinbefore, there is no possibility of rounded segment corner of a resist pattern. The levels can be defined very precisely.

FIG. 151 is a schematic view of an illumination system of a semiconductor device manufacturing exposure apparatus (stepper), according to a fifth embodiment of the present invention. This stepper uses a phase type CGH produced in accordance with a procedure similar to that of the first, second, third or fourth embodiment of the present invention.

The stepper of this embodiment includes a light source 71 as well as a light beam shaping optical system 72, a phase type CGH 73, a relay lens system 74, a stop 75, a zooming optical system 76, a multiple-beam producing optical system 77 and a projecting means 78, which are disposed in this order along the advancement direction of the light emitted from the light source 71. With this structure, a reticle 79 (surface to be illuminated) can be illuminated.

The light source 71 is arranged to produce i-line rays or ultraviolet rays such as krypton fluoride laser, argon fluoride laser, fluorine laser, or argon dimer laser, for example. The phase type CGH 73 can be formed with a ring-like shape or quadrupole shape. Since the illumination system of the fifth embodiment uses the phase type CGH having precisely formed levels, the optical performance and the light utilization efficiency during deformed illumination can be improved.

A device pattern of the reticle as illuminated is projected onto a wafer through a projection optical system, such that the wafer is exposed with this pattern. After the exposure, the wafer is developed and, through an etching process, a device pattern is produced thereon.

The element of the present invention is applicable also to an optical interconnector or an optical interconnection system.

In a two-dimensional phase type optical element producing method according to the embodiments of the present invention as described hereinbefore, a first mask and a second mask made of different materials and both having a stripe-like shape are superposedly formed on a substrate along different directions, and all the levels are determined on the basis of at least one of the first and second masks. As a result, there is no possibility of alignment error between the first and the second masks, and the levels can be defined very precisely.

While the invention has been described with reference to the structures disclosed herein, it is not confined to the details set forth and this application is intended to cover such modifications or changes as may come within the purposes of the improvements or the scope of the following claims.

What is claimed is:

1. A method of producing a two-dimensional phase-type optical element comprising:
   a first step of forming a first stripe-like mask on a substrate;
   a second step of forming a second stripe-like mask of a material different from the first mask, in a direction different from the first mask;
   a third step of covering, with a third mask, a portion of a region not covered by the first and second masks, etching the substrate by use of the first, second and third masks, and removing the third mask; and
   a fourth step of transferring a fourth mask onto the substrate by use of the first mask and/or the second mask, and etching the substrate by use of the fourth mask and a portion of the first and second masks, wherein the fourth mask is a photoresist that is coated and patterned using backside exposure and development.

2. A method according to claim 1, wherein the first and second masks are made of a metal material.

3. A method according to claim 1, wherein the first and second masks have stripe-like patterns orthogonal to each other.

4. A method according to claim 1, wherein one of the first and second masks is made of chromium while the other is made of aluminum.

5. A method according to claim 1, wherein the third mask is made of alumina.

6. A method according to claim 1, wherein the substrate is made of quartz or fluoride.

7. A method according to claim 6, wherein the substrate is made of calcium fluoride or magnesium fluoride.

8. A method according to claim 1, further comprising a fifth step of forming a mold by use of the substrate having been processed by said first through fourth steps, and a sixth step of producing a two-dimensional phase-type optical element by use of the mold.

* * * * *

UNITED STATES PATENT AND TRADEMARK OFFICE
CERTIFICATE OF CORRECTION

PATENT NO. : 6,664,032 B2
DATED : December 16, 2003
INVENTOR(S) : Ichiro Tanaka

It is certified that error appears in the above-identified patent and that said Letters Patent is hereby corrected as shown below:

Column 1,
Line 15, "pp95, 100(1996)," should read -- pp. 95-100 (1996), --.

Column 7,
Line 45, "as $KH_2PO_4$," should read -- such as $KH_2PO_4$, --.

Signed and Sealed this

Tenth Day of August, 2004

JON W. DUDAS
*Acting Director of the United States Patent and Trademark Office*